(12) United States Patent
Suwa et al.

(10) Patent No.: US 11,432,419 B2
(45) Date of Patent: Aug. 30, 2022

(54) POWER SEMICONDUCTOR DEVICE AND POWER CONVERSION DEVICE

(71) Applicant: Hitachi Automotive Systems, Ltd., Hitachinaka (JP)

(72) Inventors: Tokihito Suwa, Hitachinaka (JP); Yujiro Kaneko, Hitachinaka (JP); Yusuke Takagi, Hitachinaka (JP); Shinichi Fujino, Mito (JP); Takahiro Shimura, Mito (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 50 days.

(21) Appl. No.: 16/671,872

(22) Filed: Nov. 1, 2019

(65) Prior Publication Data

US 2020/0068735 A1 Feb. 27, 2020

Related U.S. Application Data

(63) Continuation of application No. 16/017,827, filed on Jun. 25, 2018, now Pat. No. 10,512,181, which is a (Continued)

(30) Foreign Application Priority Data

Jun. 21, 2010 (JP) ................................ 2010-140723

(51) Int. Cl.
*H05K 5/02* (2006.01)
*H05K 7/14* (2006.01)
(Continued)

(52) U.S. Cl.
CPC ......... *H05K 5/0247* (2013.01); *H01L 23/473* (2013.01); *H01L 23/49562* (2013.01);
(Continued)

(58) Field of Classification Search
CPC ............... H05K 5/0247; H05K 7/1432; H05K 7/20845; H05K 7/2089; H02M 7/537; H01L 23/49575; H01L 24/48
See application file for complete search history.

(56) References Cited

U.S. PATENT DOCUMENTS 5,202,578 A * 4/1993 Hideshima .............. H01L 25/11
257/678
5,521,437 A * 5/1996 Oshima ................... H01L 23/24
257/687
(Continued)

FOREIGN PATENT DOCUMENTS

EP 1 174 992 A2 1/2002
EP 1 986 234 A2 10/2008
(Continued)

OTHER PUBLICATIONS

Japanese Office Action dated Aug. 19, 2014, with English translation, (Seven (7) pages).
(Continued)

*Primary Examiner* — Anthony M Haughton
*Assistant Examiner* — Theron S Milliser
(74) *Attorney, Agent, or Firm* — Crowell & Moring LLP

(57) ABSTRACT

A semiconductor module includes a first power semiconductor element having a first surface and a second surface. The semiconductor module also includes a second power semiconductor element having a first surface and a second surface. The semiconductor module also includes first, second, third, and fourth conductor plates, and a connecting part. The connecting part is integrally formed with the second conductor plate, extends toward the third conductor plate, and is connected to the third conductor plate.

5 Claims, 41 Drawing Sheets

Related U.S. Application Data continuation of application No. 14/856,819, filed on Sep. 17, 2015, now Pat. No. 10,034,401, which is a continuation of application No. 13/163,950, filed on Jun. 20, 2011, now Pat. No. 9,179,581.

(51) Int. Cl.
*H05K 7/20* (2006.01)
*H01L 23/00* (2006.01)
*H01L 23/473* (2006.01)
*H01L 23/495* (2006.01)
*H02M 7/537* (2006.01)
*H01L 23/31* (2006.01)
*H01L 21/56* (2006.01)

(52) U.S. Cl.
CPC ........ *H01L 23/49575* (2013.01); *H01L 24/34* (2013.01); *H01L 24/36* (2013.01); *H01L 24/40* (2013.01); *H01L 24/73* (2013.01); *H02M 7/537* (2013.01); *H05K 7/1432* (2013.01); *H05K 7/2089* (2013.01); *H05K 7/20845* (2013.01); *H05K 7/20927* (2013.01); *H01L 21/565* (2013.01); *H01L 23/3107* (2013.01); *H01L 24/29* (2013.01); *H01L 24/32* (2013.01); *H01L 24/33* (2013.01); *H01L 24/48* (2013.01); *H01L 2224/291* (2013.01); *H01L 2224/29139* (2013.01); *H01L 2224/32245* (2013.01); *H01L 2224/33181* (2013.01); *H01L 2224/40137* (2013.01); *H01L 2224/45015* (2013.01); *H01L 2224/48247* (2013.01); *H01L 2224/73215* (2013.01); *H01L 2224/73221* (2013.01); *H01L 2224/73265* (2013.01); *H01L 2224/8384* (2013.01); *H01L 2224/83801* (2013.01); *H01L 2224/84* (2013.01); *H01L 2924/00014* (2013.01); *H01L 2924/1203* (2013.01); *H01L 2924/1305* (2013.01); *H01L 2924/1306* (2013.01); *H01L 2924/13055* (2013.01); *H01L 2924/13091* (2013.01); *H01L 2924/181* (2013.01); *H01L 2924/207* (2013.01); *H01L 2924/3025* (2013.01); *H01L 2924/30107* (2013.01); *H01L 2924/351* (2013.01)

(56) References Cited

U.S. PATENT DOCUMENTS

| | | | | |
|---|---|---|---|---|
| 5,956,231 | A * | 9/1999 | Yamada | H01L 23/049 361/728 |
| 6,434,008 | B1 * | 8/2002 | Yamada | H01L 23/049 361/728 |
| 6,903,457 | B2 * | 6/2005 | Nakajima | H01L 23/4334 257/717 |
| 7,301,755 | B2 * | 11/2007 | Rodriguez | H05K 7/1432 165/185 |
| 7,358,442 | B2 | 4/2008 | Radosevich et al. | |
| 7,589,400 | B2 | 9/2009 | Hozoji | |
| 7,768,118 | B2 * | 8/2010 | Yoshida | H01L 24/40 257/691 |
| 7,812,443 | B2 | 10/2010 | Tokuyama et al. | |
| 8,054,633 | B2 | 11/2011 | Suwa et al. | |
| 2003/0031038 | A1 | 2/2003 | Shirakawa et al. | |
| 2006/0086981 | A1 | 4/2006 | Yamaguchi et al. | |
| 2007/0018197 | A1 | 1/2007 | Mochida et al. | |
| 2007/0051974 | A1 | 3/2007 | Azuma et al. | |
| 2007/0096278 | A1 | 5/2007 | Nakatsu et al. | |
| 2008/0106160 | A1 | 5/2008 | Yoshinari | |
| 2008/0112201 | A1 | 5/2008 | Yahata et al. | |
| 2008/0224282 | A1 | 9/2008 | Ashida et al. | |
| 2008/0251909 | A1 | 10/2008 | Tokuyama et al. | |
| 2008/0316710 | A1 | 12/2008 | Seto | |
| 2009/0002956 | A1 | 1/2009 | Suwa et al. | |
| 2009/0231811 | A1 | 9/2009 | Tokuyama et al. | |
| 2009/0251858 | A1 | 10/2009 | Harada et al. | |
| 2009/0302444 | A1 | 12/2009 | Ueda et al. | |
| 2010/0148298 | A1 | 6/2010 | Takano et al. | |
| 2011/0051371 | A1 | 3/2011 | Azuma et al. | |
| 2011/0249421 | A1 | 10/2011 | Matsuo et al. | |
| 2011/0299265 | A1 | 12/2011 | Nakatsu et al. | |

FOREIGN PATENT DOCUMENTS

| | | |
|---|---|---|
| EP | 2 015 626 A2 | 1/2009 |
| EP | 2 023 473 A2 | 2/2009 |
| EP | 2 101 402 A2 | 9/2009 |
| JP | 6-291223 A | 10/1994 |
| JP | 2003-31765 A | 1/2003 |
| JP | 2004-208411 A | 7/2004 |
| JP | 2006-120970 A | 5/2006 |
| JP | 2007-35670 A | 2/2007 |
| JP | 2007-53295 A | 3/2007 |
| JP | 2007-59737 A | 3/2007 |
| JP | 2008-227131 A | 9/2008 |
| JP | 2008-259267 A | 10/2008 |
| JP | 2009-219270 A | 9/2009 |
| JP | 2010-41838 A | 2/2010 |
| JP | 2010-63355 A | 3/2010 |
| JP | 2010-103222 A | 5/2010 |
| JP | 2010-110065 A | 5/2010 |
| JP | 2010-110143 A | 5/2010 |
| JP | 2010-119300 A | 5/2010 |
| WO | WO 2010/050594 A1 | 5/2010 |

OTHER PUBLICATIONS

Extended European Search Report issued in counterpart European Application No. 11169980.7 dated May 30, 2017 (eight (8) pages).
Japanese Office Action issued in counterpart Japanese Application No. 2016-138115 dated May 2, 2017 with English-language translation (fifteen (15) pages).
Japanese-language Office Action issued in counterpart Japanese Application No. 2016-138115 dated Oct. 30, 2018 with English translation (six (6) pages).
Extended European Search Report issued in counterpart European Application No. 19175045.4 dated Sep. 23, 2019 (10 pages).

* cited by examiner

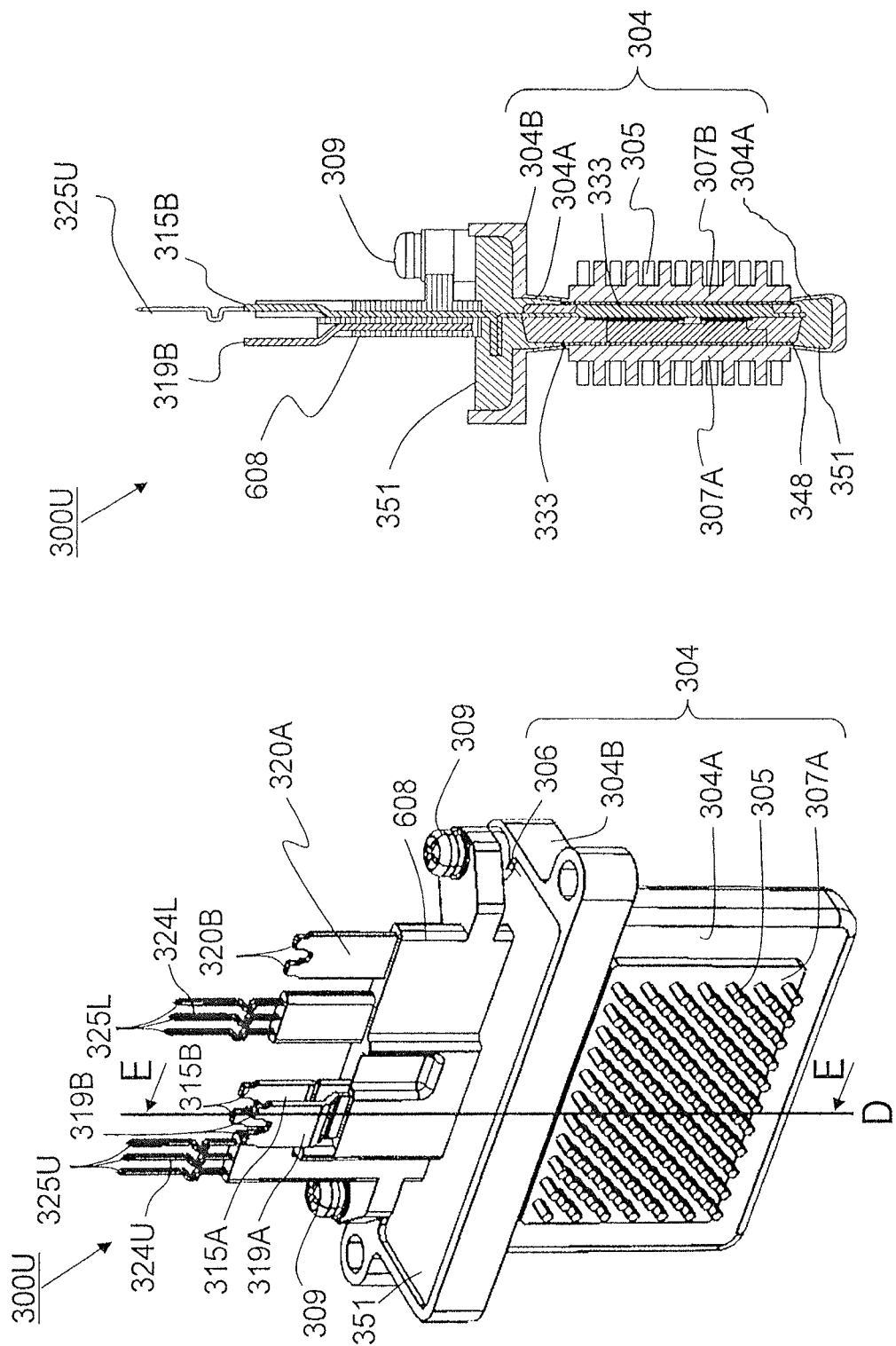

FIG.13A
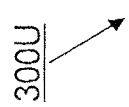
FIG.13B 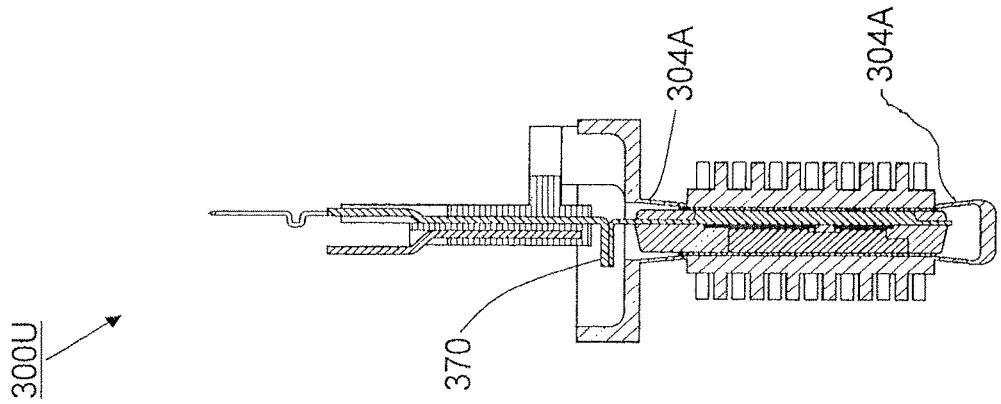 FIG.13C

POWER SEMICONDUCTOR DEVICE AND POWER CONVERSION DEVICE

CROSS-REFERENCE TO THE APPLICATION

This application is a continuation of U.S. application Ser. No. 16/017,827, filed on Jun. 25, 2018, which is a continuation of U.S. application Ser. No. 14/856,819, filed on Sep. 17, 2015, now U.S. Pat. No. 10,034,401, issued Jul. 24, 2018, which is a continuation of U.S. application Ser. No. 13/163,950, filed Jun. 20, 2011, now U.S. Pat. No. 9,179,581, issued Nov. 3, 2015, which claims priority to Japanese Patent Application No. 2010-140723, filed on Jun. 21, 2010.

BACKGROUND OF THE INVENTION

1. Field of the Invention

The present invention relates to a power semiconductor device including power semiconductor elements which perform switching operations to convert direct-current (DC) power to alternating-current (AC) power or AC power to DC power, and relates to a power conversion device using the power semiconductor device.

2. Description of Related Art

A power conversion unit includes a function to convert DC power supplied from a DC power supply into AC power to be supplied to AC electrical load such as a rotating electrical machine or a function to convert AC power generated by a rotating electrical machine into DC power to be supplied to a DC power supply. To serve such conversion function, the power conversion unit includes a power semiconductor device including power semiconductor elements which perform switching operations. The power semiconductor elements repeat conduction operations and interruption operations so that power is converted from DC power to AC power or from AC power to DC power.

Such power semiconductor device is provided with a positive electrode-side terminal and a negative electrode-side terminal via which DC power is supplied to the power semiconductor elements. Patent Literature 1 (Japanese Laid Open Patent Publication No. 2010-110143) states a power semiconductor device in which power semiconductor elements are sealed with resin material in a state where the positive electrode-side terminal and the negative electrode-side terminal are laminated and which is housed in a can-type case.

In a process of sealing power semiconductor elements, for example, it is necessary to hold and clamp the positive electrode-side terminal and the negative electrode-side terminal using upper and lower molds and to fill resin into the mold cavity. However, in the state where the positive electrode-side terminal and the negative electrode-side terminal are laminated as stated in Patent Literature 1 described above, the laminated area is different from other terminals in thickness, and thus over stress on the connection sections between the power semiconductor elements and the terminals and a gap between the molds may occur when clamping. The over stress on the connection section causes the power semiconductor elements to be damaged.

The present invention intends to reduce damage on power semiconductor elements in the manufacturing process.

SUMMARY OF THE INVENTION

A power semiconductor device according to a 1st aspect of the present invention includes: a plurality of power semiconductor elements constituting upper and lower arms of an inverter circuit; a first sealing member having a polyhedron shape and sealing the plurality of power semiconductor elements; a positive electrode-side terminal connected with any of the plurality of power semiconductor elements and protruding from the first sealing member; a negative electrode-side terminal connected with any of the plurality of power semiconductor elements and protruding from first sealing member; a second sealing member sealing at least a part of the positive electrode-side terminal and at least a part of the negative electrode-side terminal; and a case in which the power semiconductor elements sealed with the first sealing member are housed, wherein: the positive electrode-side terminal and the negative electrode-side terminal are aligned along one surface of the first sealing member at their portions protruding from the first sealing member; and the positive electrode-side terminal and the negative electrode-side terminal protrude in a layered state from the second sealing member and extend out of the case.

A power semiconductor device according to a 2nd aspect of the present invention includes: a series circuit of a first power semiconductor element for upper arm of an inverter and a second power semiconductor element for lower arm of the inverter; a first sealing member sealing the series circuit; an internal terminal protruding from the first sealing member, for supplying DC power to the series circuit; an external terminal with a layer structure connected to the internal terminal; a second sealing member sealing a connection section between the internal terminal and the external terminal; and a case in which the series circuit sealed with the first sealing member and the internal terminal are housed, wherein: the external terminal is configured to extend out of the case; and magnetic fluxes are generated in directions canceling each other out by current flowing through each layer of the external terminal.

According to a 3rd aspect of the present invention, in the power semiconductor device of the 2nd aspect, it is preferred that: the case is formed of an electrically conductive member; and an eddy current is induced in the case by current flowing through the series circuit connected to the internal terminal.

According to a 4th aspect of the present invention, in the power semiconductor device of the 2nd or 3rd aspect, it is preferred that: the case is provided with a heat dissipation surface including fins for heat dissipation outside thereof; and the power semiconductor elements, constituting the series circuit sealed with the first sealing member, are arranged opposite to the heat dissipation surface inside the case.

According to a 5th aspect of the present invention, the power semiconductor device of any one of the 2nd through 4th aspects may further include: a control terminal that transmits a drive signal of the first and second power semiconductor elements; and a bus bar for control terminal connected by metallic bonding to the control terminal. In this power semiconductor device, it is preferred that the second sealing member further seals a connection section between the control terminal and the bus bar for control terminal.

According to a 6th aspect of the present invention, in the power semiconductor device of the 5th aspect, it is preferred that: the control terminal and the internal terminal each protrude in a same direction from the first sealing member; the control terminal and the internal terminal are each bent in a same direction at each of their ends; and a bent end of the control terminal and that of the internal terminal are metallically bonded with the bus bar for control terminal and the external terminal, respectively.

According to a 7th aspect of the present invention, in the power semiconductor device of the 5th or 6th aspect, it is further preferred that the control terminal and the internal terminal are aligned at their portions protruding from the first sealing member.

According to an 8th aspect of the present invention, the power semiconductor device of any one of the 2nd through 7th aspects may further include: an output terminal protruding from the first sealing member, for outputting AC power having been converted from the DC power by the series circuit; and an output bus bar connected by metallic bonding to the output terminal. In this power semiconductor device, it is preferred that the second sealing member further seals a connection section between the output terminal and the output bus bar.

According to a 9th aspect of the present invention, in the power semiconductor device of any one of the 2nd through 8th aspects, it is preferred that: the case has one opening face; the connection section between the internal terminal and the external terminal is arranged inward of the case from the opening face; and the external terminal extends out of the case from the opening face.

According to a 10th aspect of the present invention, the power semiconductor device of any one of the 2nd through 9th aspects may further include a supporting member supporting the external terminal. In this power semiconductor device, it is preferred that the supporting member is fixed to the case.

According to an 11th aspect of the present invention, in the power semiconductor device of any one of the 2nd through 10th aspects, it is preferred that the second sealing member is filled in a space between inside of the case and the first sealing member.

A power semiconductor device according to a 12th aspect of the present invention includes: a first and second power semiconductor elements constituting an upper and lower arms, respectively, of an inverter circuit and each including a control electrode; a first and second control terminals each connected with the control electrodes included in the first and second power semiconductor elements, respectively; a positive terminal and a negative terminal which are connected with a positive electrode side and a negative electrode side, respectively, of a series circuit constituted with the first and second power semiconductor elements and which supply DC power to the series circuit; and an output terminal for outputting AC power having been converted from the DC power by the series circuit, wherein: the first control terminal, the second control terminal, the positive terminal, the negative terminal and the output terminal are each aligned; the control electrodes included in the first and second power semiconductor elements are each arranged in a position shifted to either one side relative to a central line which is perpendicular to an alignment direction of each of the terminals; the first and second control terminals are each arranged on one side where the control electrodes are arranged in the first and second power semiconductor elements; the positive terminal is arranged on an other side where the control electrode is not arranged in the first power semiconductor element; the output terminal is arranged on an other side where the control electrode is not arranged in the second power semiconductor element; and the negative terminal is arranged between the positive terminal and the second control terminal.

A power conversion device according to a 13th aspect of the present invention includes: a smoothing capacitor; a bridge circuit connected to the smoothing capacitor and constituted with a plurality of power semiconductor devices for converting from DC power to AC power or from AC power to DC power; and a cooling flow path former through which a cooling medium to cool the power semiconductor devices flows, wherein: the power semiconductor device includes: a power semiconductor element; a first sealing member sealing the power semiconductor element; an internal terminal protruding from the first sealing member; am external terminal connected to the internal terminal; a second sealing member sealing a connection section between the internal terminal and the external terminal; and a case in which the power semiconductor element sealed with the first sealing member and the internal terminal are housed, and the external terminal extends out.

According to a 14th aspect of the present invention, in the power conversion device of the 13th aspect, it is preferred that: the case is provided with a heat dissipation surface including fins for heat dissipation outside thereof; the power semiconductor element sealed with the first sealing member is arranged opposite to the heat dissipation surface inside the case; and the external terminal extends out.

A power conversion device according to a 15th aspect of the present invention includes: a smoothing capacitor; a bridge circuit connected to the smoothing capacitor and constituted with a plurality of power semiconductor devices for converting from DC power to AC power or from AC power to DC power; and a cooling flow path former through which a cooling medium to cool the power semiconductor devices flows, wherein: the power semiconductor device includes: a series circuit of a first and second power semiconductor elements for upper arm and lower arm of an inverter; a first sealing member sealing the series circuit of the first and second power semiconductor elements; an internal terminal for supplying DC power to the series circuit protruding from the first sealing member; an external terminal with a layer structure connected to the internal terminal; a second sealing member sealing a connection section between the internal terminal and the external terminal; and a metal case in which the power semiconductor elements sealed with the first sealing member and the internal terminal are housed, the external terminal is configured to extend out; an eddy current is induced in the metal case by current flowing through the series circuit connected to the internal terminal; and magnetic fluxes are generated in directions canceling each other out by current flowing through each external terminal of the layer structure.

According to a 16th aspect of the present invention, in the power semiconductor device of the 15th aspect, it is preferred that: the smoothing capacitor includes: a plurality of capacitor cells arranged in the smoothing capacitor and connected in parallel; a power supply terminal for connection to a DC power supply; and a plurality of terminals with a layer structure connected with the external terminal of the power semiconductor device; and the terminals with the layer structure of the smoothing capacitor are each connected to the external terminal of the power semiconductor device.

According to the present invention, the power semiconductor elements will be prevented from being damaged in the manufacturing process of power modules.

BRIEF DESCRIPTION OF THE DRAWINGS

FIGS. 12A and 12B are views showing the power module according to an embodiment of the present invention, of which FIG. 12A is a perspective view and FIG. 12B is a sectional view.

FIGS. 13A, 13B, and 13C are views showing the power module with screws and a second sealing resin not illustrated, of which FIG. 13A is a perspective view, FIG. 13B is a sectional view, and FIG. 13C is a sectional view before a curved portion of a case is deformed.

FIGS. 14A and 14B are views showing the power module with the case not illustrated, of which FIG. 14A is a perspective view and FIG. 14B is a sectional view.

FIGS. 16A and 16B are views showing an ancillary molded body, of which FIG. 16A is a perspective view and FIG. 16B is a sectional view.

FIGS. 22A and 22B are views for explaining a transfer molding process of the first sealing resin, of which FIG. 22A is a vertical sectional view before clamping and FIG. 22B is a vertical sectional view after clamping.

DESCRIPTION OF PREFERRED EMBODIMENTS

In the embodiments stated below, in addition to the problems and the advantageous effects stated as problems to be solved by the invention and advantageous effects of the invention respectively, problems are solved and advantageous effects are achieved so as to make a desired product. These will be explained in the following embodiments.

Figure 1:
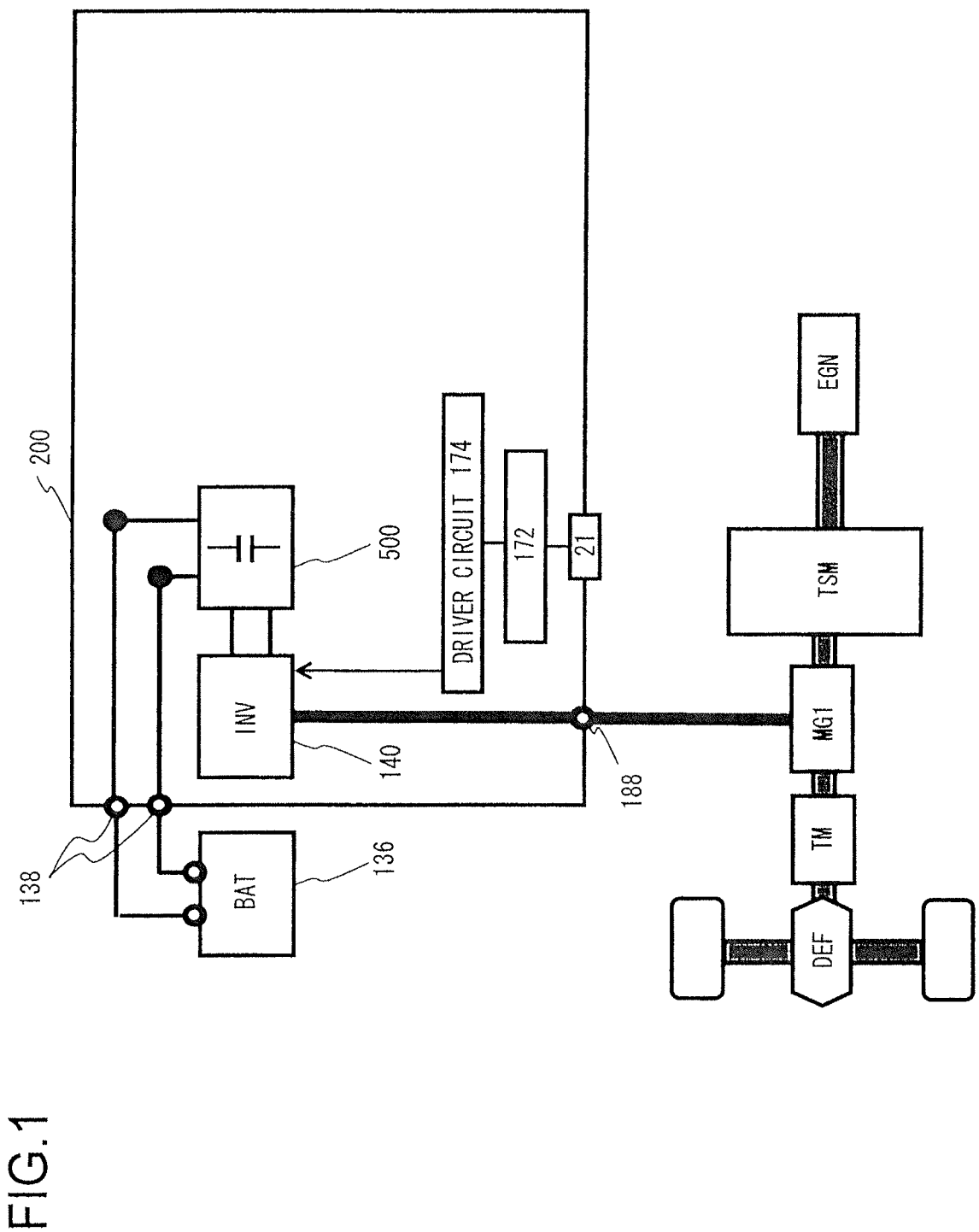
FIG. 1 is a diagram showing control blocks of a hybrid vehicle.

An embodiment of the present invention will now be explained with reference to the drawings. FIG. 1 is a diagram showing control blocks of a hybrid electric vehicle (hereinafter referred to as "HEV"). An engine EGN and a motor generator MG1 generate torque for driving a vehicle. In addition, the motor generator MG1 has a function not only to generate rotational torque but also to convert mechanical energy applied from outside to the motor generator MG1 into electric power.

The motor generator MG1 is, for example, a synchronous machine or an induction machine, and, as described above, works as a motor or an electric generator depending upon the operational method. When mounted on a vehicle, the motor generator MG1 is preferred to be small in size and high in power, and thus a permanent magnet type synchronous electric machine which uses a magnet such as neodymium is appropriate. In addition, a permanent magnet type synchronous electric machine is excellent for a vehicle also because its rotor generates less heat than that of an induction electric machine.

Output torque on the output side of the engine EGN is transmitted to the motor generator MG1 through a power distribution mechanism TSM. Rotational torque from the power distribution mechanism TSM or rotational torque generated by the motor generator MG1 is transmitted to wheels through a transmission TM and a differential gear DEF. In a regenerative braking operation, on the other hand, rotational torque is transmitted from the wheels to the motor generator MG1. The motor generator MG1 generates AC power based upon the rotational torque supplied from the wheels. The generated AC power is, as described later, converted into DC power by the power conversion device 200 and charges a high-voltage battery 136. The electric power charged at the battery 136 is used again as travel energy.

Next, the power conversion device 200 will be explained. The inverter circuit 140 is electrically connected with the battery 136 through a DC connector 138. Electric power is transferred between the battery 136 and the inverter circuit 140. When the motor generator MG1 operates as a motor, the inverter circuit 140 generates AC power based upon DC power supplied from the battery 136 through the DC connector 138 and supplies it to the motor generator MG1 through an AC terminal 188. The structure constituted with the motor generator MG1 and the inverter circuit 140 operates as a first electric motor generator unit.

It is to be noted that, in the present embodiment, the first electric motor generator unit operates on electric power of the battery 136 as an electric motor unit so as to drive the vehicle only on power of the motor generator MG1. In addition, in the present embodiment, the first electric motor generator unit operates as a power generation unit on power of an engine 120 or power from the wheels so as to generate electric power, thereby charging the battery 136.

Moreover, although not shown in FIG. 1, the battery 136 is also used as a power source for driving a motor for auxiliaries. The motor for auxiliaries is, for example, a motor to drive the compressor of the air conditioner or a motor to drive a hydraulic pump for control. DC power is supplied from the battery 136 to a power module for auxiliaries and the power module for auxiliaries generates AC power and supplies it to the motor for auxiliaries. The power module for auxiliaries, having basically the same circuit configuration and functions as those the inverter circuit 140 has, controls the phase, frequency, and electric power of AC to be supplies to the motor for auxiliaries. It is to be noted that the power conversion device 200 includes the capacitor module 500 for smoothing DC power to be supplied to the inverter circuit 140.

The power conversion device 200 includes a communication connector 21 for receiving an instruction from a higher-order control device or transmitting data indicating a status to the higher-order control device. In the power conversion device 200, a control circuit 172 calculates a control amount of the motor generator MG1 based upon an instruction to be input from the connector 21 and in addition calculates whether to operate as a motor or to operate as an electric generator. Based upon those calculation results, the control circuit 172 generates control pulses and supplies the control pulses to a driver circuit 174. Based upon the supplied control pulses, the driver circuit 174 generates drive pulses for controlling the inverter circuit 140.

Figure 2:
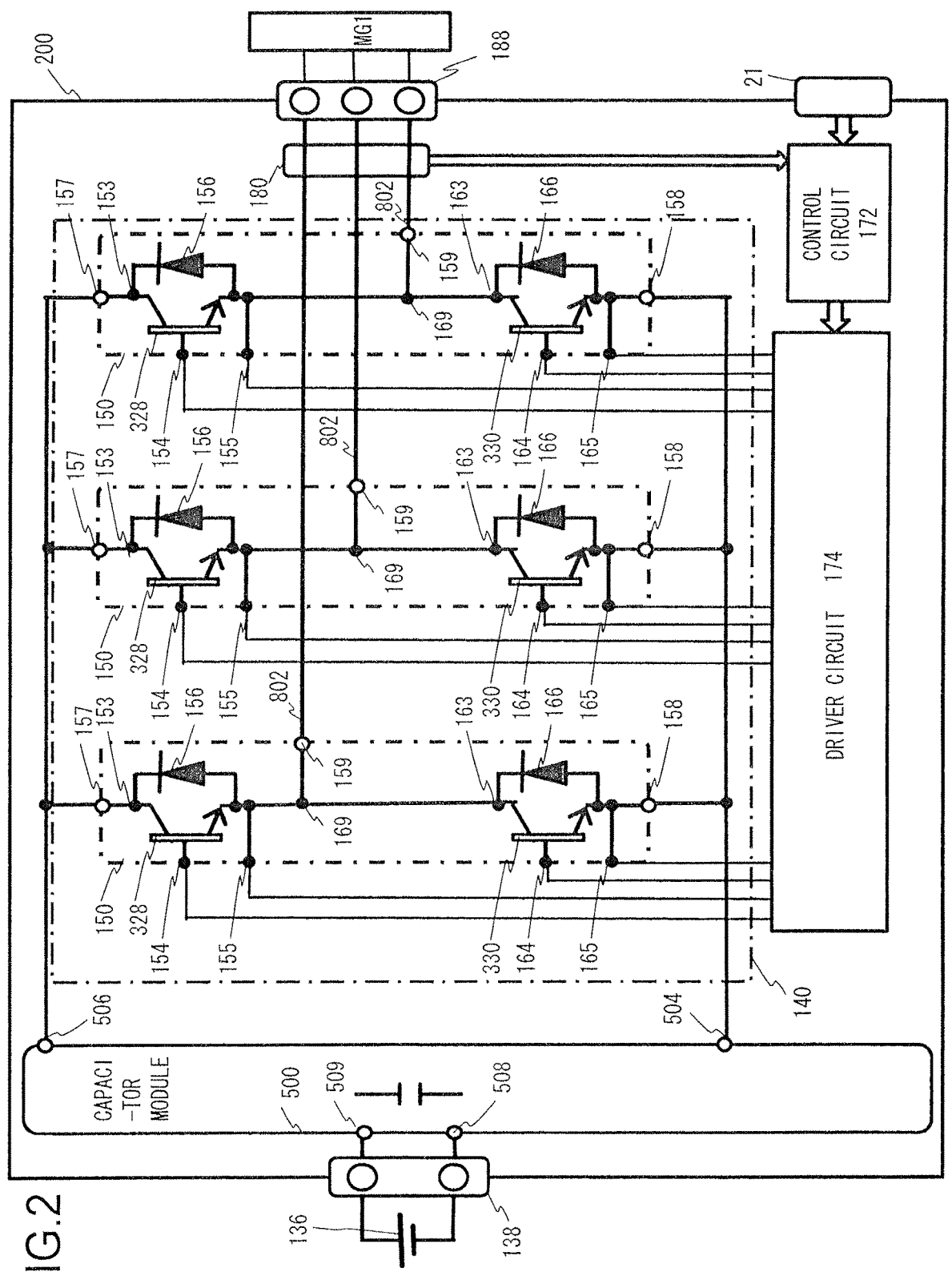
FIG. 2 is a diagram explaining the electrical circuit structure of an inverter circuit 140.

Next, the structure of the electrical circuit of the inverter circuit 140 will be explained with reference to FIG. 2. It is to be noted that in the following example an insulated gate bipolar transistor is used as a semiconductor element, which is abbreviated to an IGBT hereinafter. A series circuit 150 of upper and lower arms is constituted with an IGBT 328 and a diode 156, which operate as the upper arm, and an IGBT 330 and a diode 166, which operate as the lower arm. The inverter circuit 140 includes this series circuit 150 corresponding to each of three phases, i.e., a U phase, a V phase, and a W phase, of the AC power to be output.

In this embodiment, these three phases correspond to each phase winding of the three phases of an armature winding of the motor generator MG1. The series circuit 150 of upper and lower arms of each of the three phases outputs AC current from an intermediate electrode 169, which is the midpoint of the series circuit. This intermediate electrode 169 is connected through an AC terminal 159 and an AC terminal 188 with AC bus bars 802 and 804 to be described below, which are AC power lines to the motor generator MG1.

A collector electrode 153 of the IGBT 328 of the upper arm is electrically connected through a positive terminal 157 to a capacitor terminal 506 on the positive electrode side of the capacitor module 500. In addition, an emitter electrode of the IGBT 330 of the lower arm is electrically connected through a negative terminal 158 to a capacitor terminal 504 on the negative electrode side of the capacitor module 500.

As described above, the control circuit 172 receives a control instruction from the higher-order control device through the connector 21. Then, based upon this, the control circuit 172 generates the control pulses, which are control signals for controlling the IGBT 328 and the IGBT 330 constituting the upper arm or the lower arm of the series circuit 150 of each of the phases constituting the inverter circuit 140, and supplies the control pulses to the driver circuit 174.

The driver circuit 174, based upon the above control pulses, supplies the drive pulses for controlling the IGBT 328 and the IGBT 330 constituting the upper arm or the lower arm of the series circuit 150 of each of the phases to the IGBT 328 and the IGBT 330 of each of the phases. The IGBT 328 and the IGBT 330, based upon the drive pulses from the driver circuit 174, carry out a conduction or interruption operation to convert the DC power supplied from the battery 136 into three-phase AC power. This converted electric power is supplied to the motor generator MG1.

The IGBT 328 includes the collector electrode 153, an emitter electrode 155 for signals, and a gate electrode 154. The IGBT 330 includes the collector electrode 163, an emitter electrode 165 for signals, and a gate electrode 164. The diode 156 is electrically connected between the collector electrode 153 and the emitter electrode 155. The diode 166 is electrically connected between the collector electrode 163 and the emitter electrode 165.

A metal-oxide semiconductor field-effect transistor (hereinafter abbreviated to MOSFET) may be used as a power semiconductor element for switching. In this case, the diode 156 and the diode 166 become unnecessary. As a power semiconductor element for switching, an IGBT is suitable for relatively high DC voltage and a MOSFET is suitable for relatively low DC voltage.

The capacitor module 500 includes the positive electrode-side capacitor terminal 506, the negative electrode-side capacitor terminal 504, a positive electrode-side power supply terminal 509, and a negative electrode-side power supply terminal 508. High-voltage DC power is supplied from the battery 136 through the DC connector 138 to the positive electrode-side power supply terminal 509 and the negative electrode-side power supply terminal 508, and then supplied from the positive electrode-side capacitor terminal 506 and the negative electrode-side capacitor terminal 504 of the capacitor module 500 to the inverter circuit 140.

On the other hand, the DC power having been converted from AC power by the inverter circuit 140 is supplied from the positive electrode-side capacitor terminal 506 and the negative electrode-side capacitor terminal 504 to the capacitor module 500, supplied from the positive electrode-side power supply terminal 509 and the negative electrode-side power supply terminal 508 through the DC connector 138 to the battery 136, and then stored in the battery 136.

The control circuit 172 includes a microcomputer for performing calculation processing of switching timing of the IGBT 328 and the IGBT 330. Input information to the microcomputer includes a target torque value required to the motor generator MG1, a current value supplied from the series circuit 150 to the motor generator MG1, and a magnetic pole position of the rotor of the motor generator MG1.

The target torque value is based upon an instruction signal having been output from a higher-order control device not shown in the figures. The current value is detected based upon a detection signal by a current sensor 180. The magnetic pole position is detected based upon a detection signal having been output from a rotating magnetic pole sensor (not shown in the figures) such as a resolver provided to the motor generator MG1. While in the present embodiment, the explanation is made on an example in which the current sensor 180 detects current values for three phases, the current sensor 180 may be arranged to detect current values for two phases and obtains currents for three phases on calculation.

The microcomputer in the control circuit 172 calculates current instruction values of a d axis and a q axis of the motor generator MG1 based upon the target torque value, calculates voltage instruction values of the d axis and the q axis based upon differences between the calculated current instruction values of the d axis and the q axis and the detected current values of the d axis and the q axis, and then converts the calculated voltage instruction values of the d axis and the q axis into voltage instruction values of the U phase, the V phase, and the W phase based upon the detected magnetic pole position. Then, the microcomputer generates a pulse-like modulated wave based upon comparison between a fundamental wave (sine wave), which is based upon the voltage instruction values of the U phase, the V phase, and the W phase, and a carrier wave (triangle wave), and then outputs this generated modulated wave to the driver circuit 174 as a PWM (pulse-width modulation) signal.

When driving the lower arm, the driver circuit 174 outputs a drive signal, which is an amplified PWM signal, to the gate electrode of the IGBT 330 of the corresponding lower arm. When driving the upper arm, the driver circuit 174 shifts the reference potential level of the PWM signal to the reference potential level of the upper arm, amplifies the PWM signal, and then outputs it as a drive signal to the gate electrode of the IGBT 328 of the corresponding upper arm.

In addition, the microcomputer in the control circuit 172 performs abnormality detection (over current, over voltage, over temperature, and the like) so as to protect the series circuit 150. For this purpose, sensing information has been input to the control circuit 172. For example, information of current flowing through the emitter electrode of each of the IGBT 328 and the IGBT 330 is input from the emitter electrode 155 for signals and the emitter electrode 165 for signals of each of the arms to a corresponding drive unit (IC). This causes each of the drive units (IC) to perform over current detection and, if over current is detected, to stop switching operations of the corresponding IGBT 328 and IGBT 330 and protect the corresponding IGBT 328 and IGBT 330 from the over current.

Information of temperature of the series circuit 150 is input from a temperature sensor (not shown in the figures) provided to the series circuit 150 to the microcomputer. In addition, information of DC positive electrode-side voltage at the series circuit 150 is input to the microcomputer. Based upon those pieces of information, the microcomputer performs over temperature detection and over voltage detection and, if over temperature or over voltage is detected, stops all the switching operations of the IGBT 328 and the IGBT 330.

Figure 3:
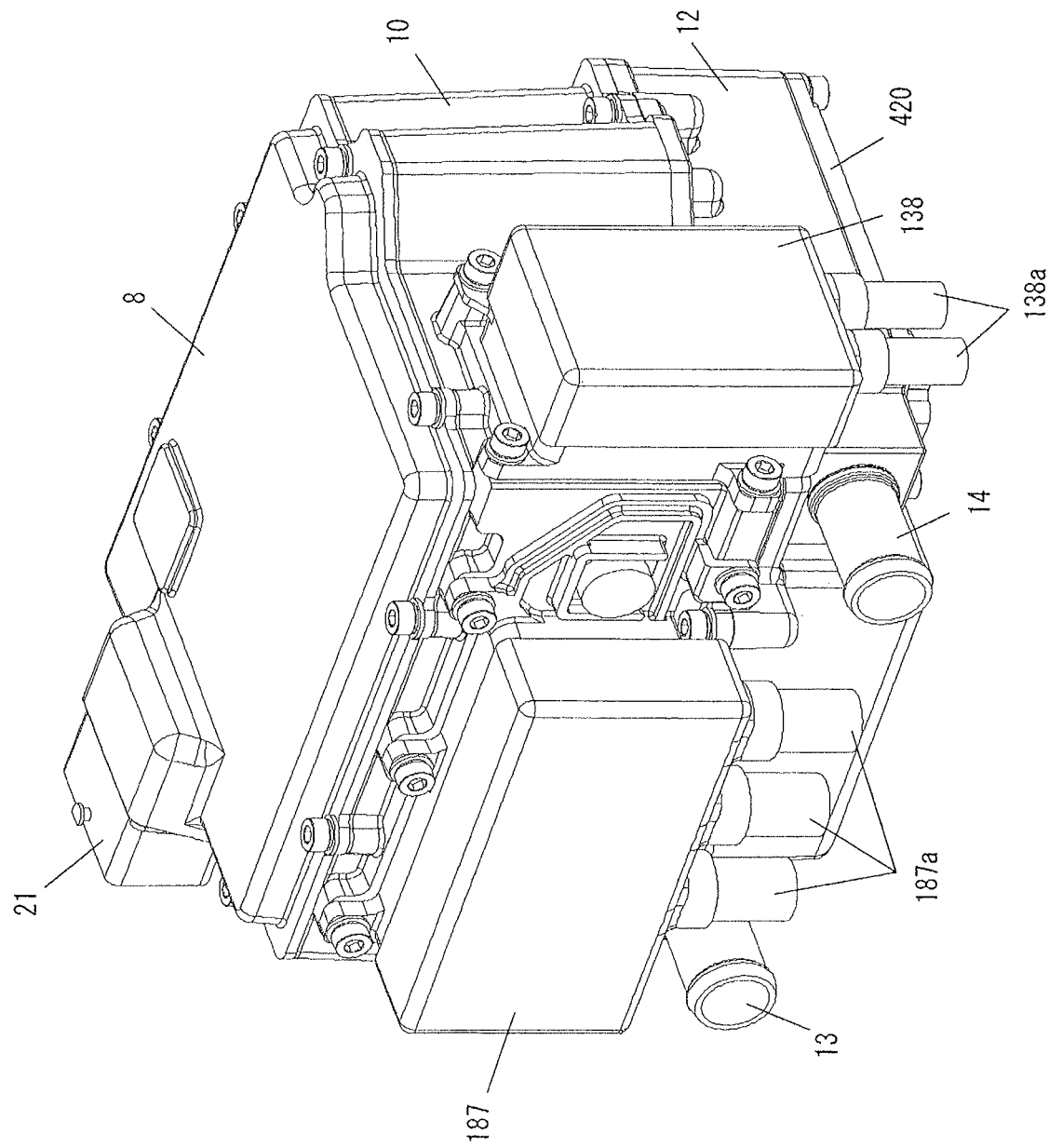
FIG. 3 is an external perspective view of a power conversion device 200.
Figure 4:
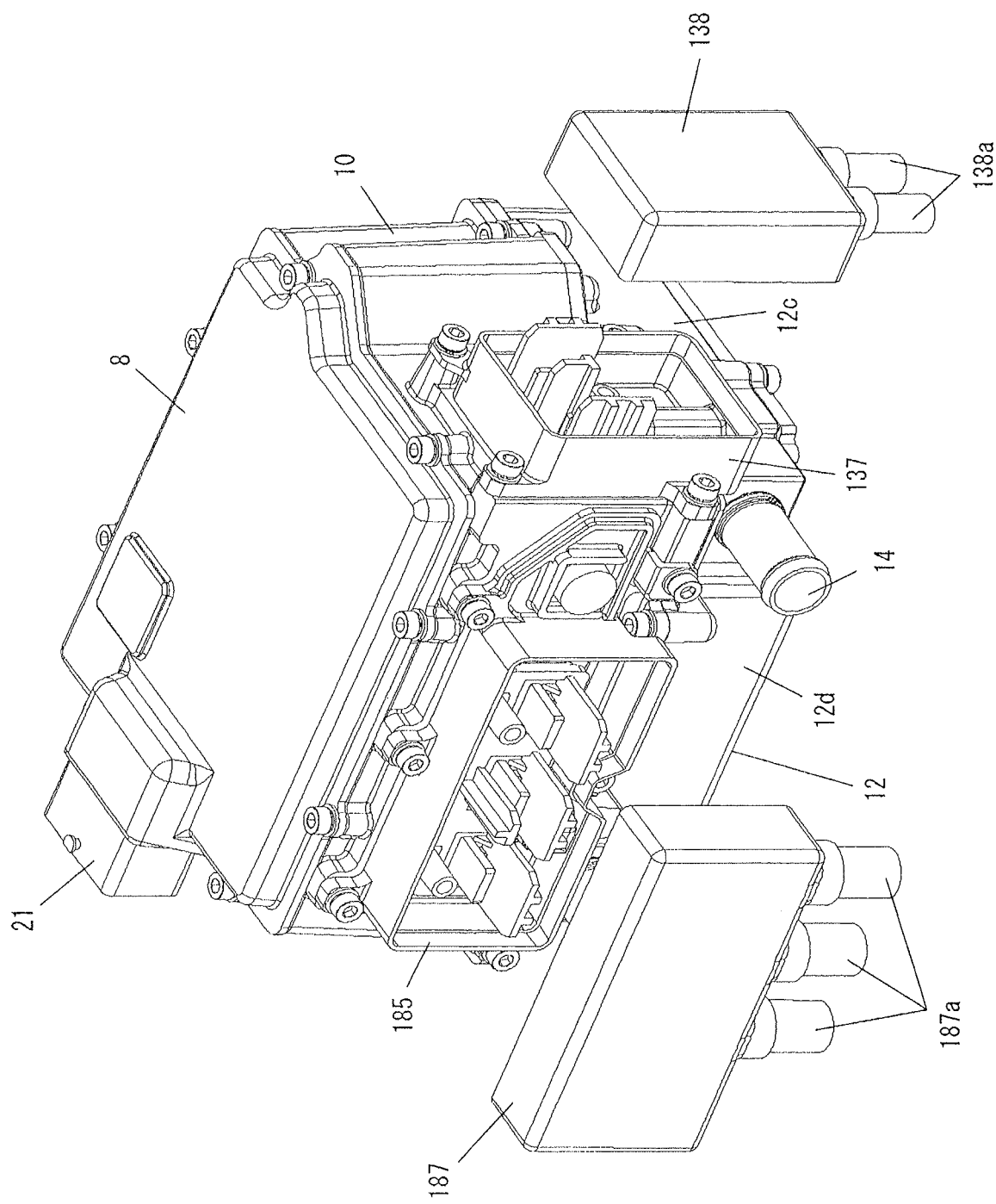
FIG. 4 is an external perspective view of the power conversion device 200.

FIGS. 3 and 4 are external perspective views of the power conversion device 200 as an embodiment according to the present invention. FIG. 4 shows a state in which an AC connector 187 and the DC connector 138 are removed. The power conversion device 200 of the present embodiment is provided in a rectangular planar shape which is substantially square so as to be small in size and has an effect of facilitating mounting to the vehicle. A reference numeral 8 denotes a lid, 10 a housing, 12 a flow path former, 13 a cooling medium inlet pipe, 14 an outlet pipe, and 420 a lower cover. The connector 21 is a connector for signals provided for external connection.

The lid 8 is fixed to an upper opening of the housing 10 in which circuit components constituting the power conversion device 200 are housed. The flow path former 12, which is fixed to a lower part of the housing 10, holds the power modules 300 and the capacitor module 500, which are described later, and cools them by a cooling medium. Since water, for instance, is most commonly used as a cooling medium, the explanation will hereinafter be made with cooling water as an example. An inlet pipe 13 and an outlet pipe 14 are provided on one lateral surface of the flow path former 12, and cooling water supplied from the inlet pipe 13 flows into a flow path 19, described later, in the flow path former 12 and is released from the outlet pipe 14.

An AC interface 185 on which the AC connector 187 is mounted and a DC interface 137 on which the DC connector 138 is mounted are provided on a lateral surface of the housing 10. The AC interface 185 is provided on the lateral surface on which the pipes 13 and 14 are provided, and an AC wiring 187a of the AC connector 187 mounted on the AC interface 185 extends downward through between the pipes 13 and 14. The DC interface 137 is provided on the lateral surface adjacent to the lateral surface on which the AC interface 185 is provided, and a DC wiring 138a of the DC connector 138 mounted on the DC interface 137 also extends downward the power conversion device 200.

Since the AC interface 185 and the pipes 13 and 14 are thus arranged on the side of a same lateral surface 12d and the AC wiring 187a is drawn downward as it passes through between the pipes 13 and 14, the space occupied by the pipes 13 and 14, the AC connector 187, and the AC wiring 187a is reduced in size, thereby preventing the whole device from becoming large in size. In addition, since the AC wiring 187a is drawn downward with respect to the pipes 13 and 14, the AC wiring 187a is easily wired, thereby improving productivity.

Figure 5:
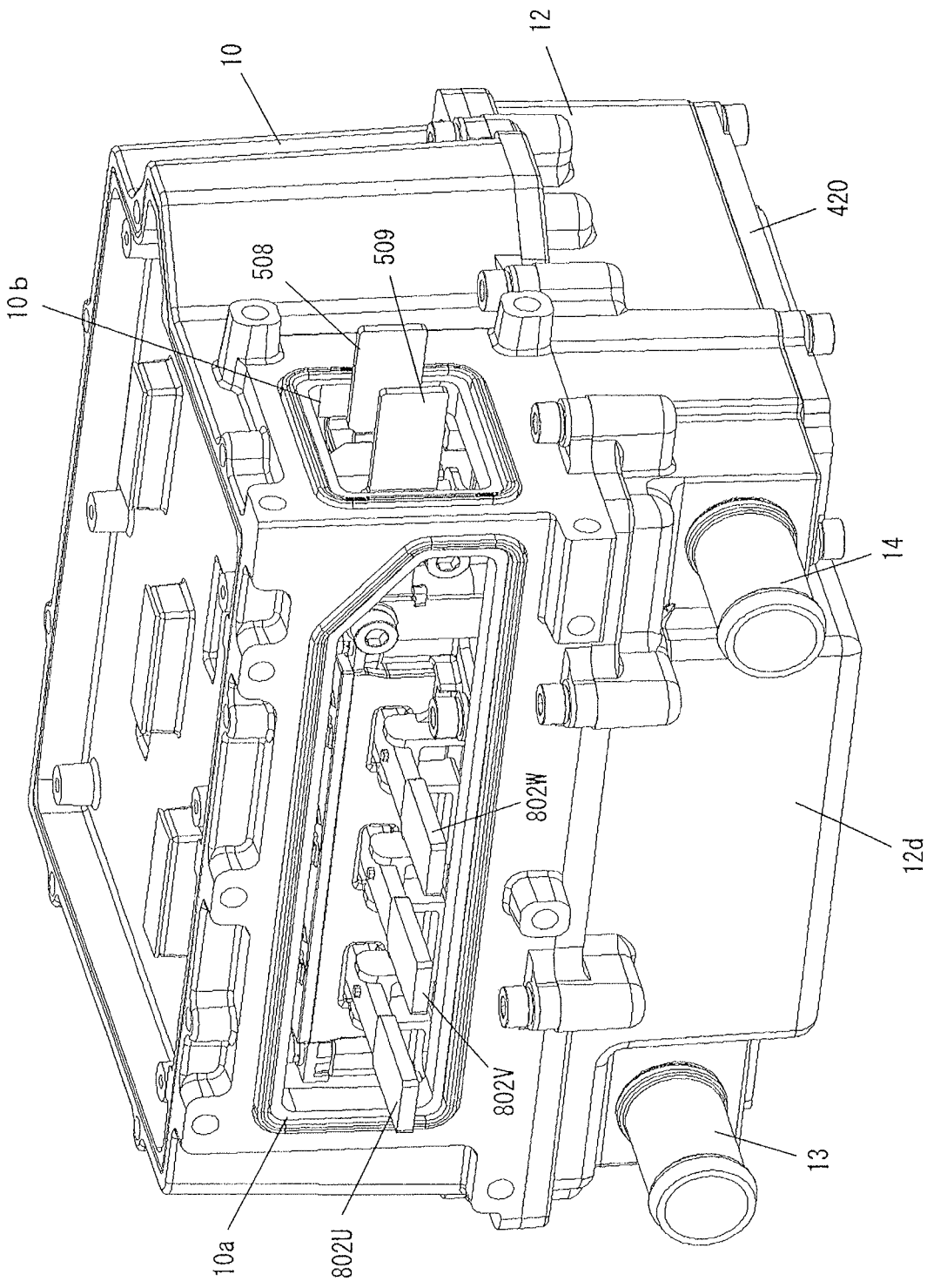
FIG. 5 is an exploded perspective view of the power conversion device 200.

FIG. 5 is a view showing a state in which the lid 8, the DC interface 137, and the AC interface 185 are removed from the power conversion device 200 shown in FIG. 4. One lateral surface of the housing 10 is provided with an opening 10a through which the AC interface 185 is fixed and another lateral surface adjacent thereto is provided with an opening 10b through which the DC interface 137 is fixed. From the opening 10a, three AC bus bars 802, i.e., a U phase AC bus bar 802U, a V phase AC bus bar 802V, and a W phase AC bus bar 802W, protrude, and from the opening 10b the DC power supply terminals 508 and 509 protrude.

Figure 6:
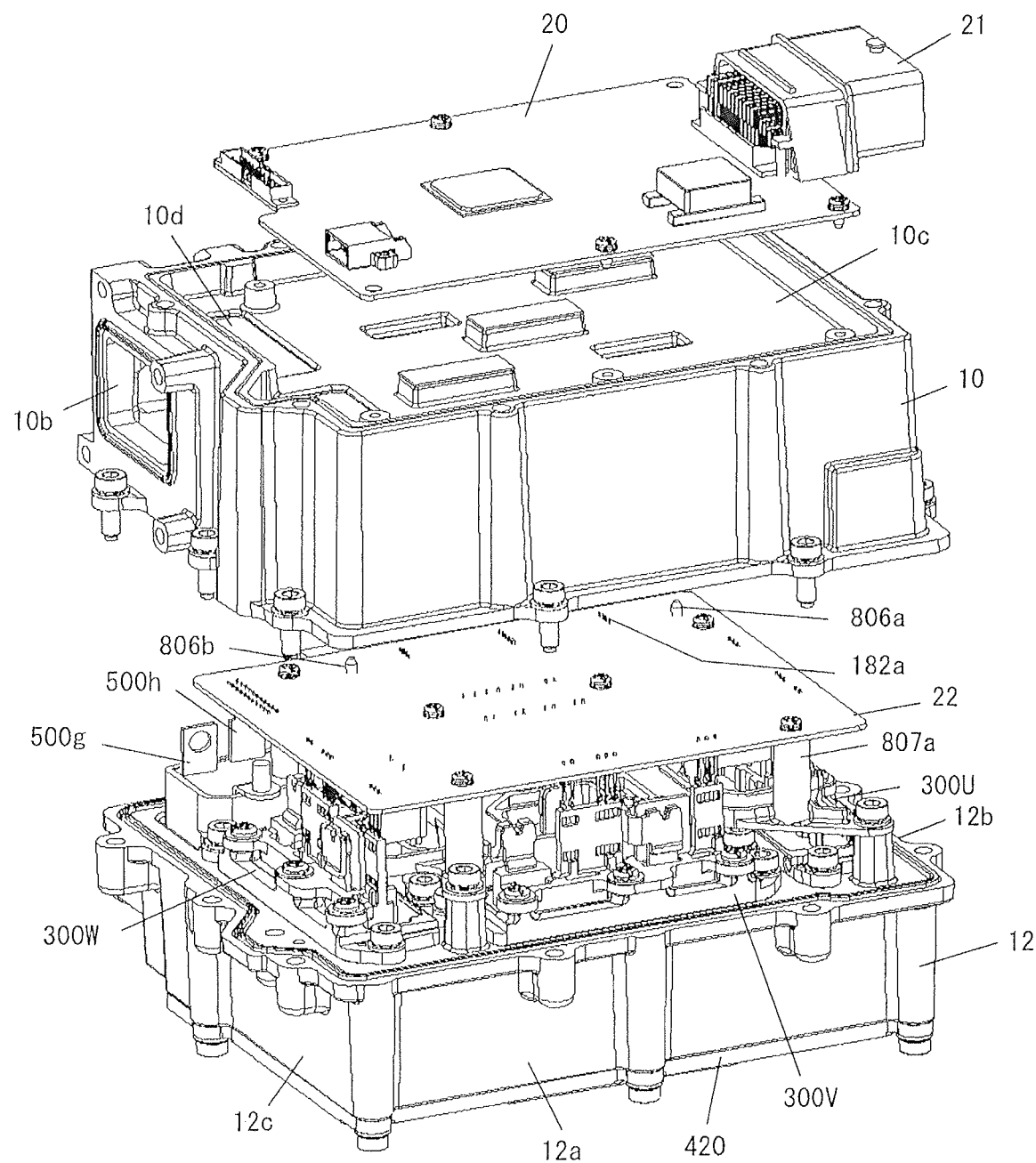
FIG. 6 is an exploded perspective view of the power conversion device 200.

FIG. 6 is a view showing a state in which the housing 10 is removed from the flow path former 12 in FIG. 5. The housing 10 is sectioned by a dividing wall 10c into two housing spaces, i.e., an upper housing space and a lower housing space. A control circuit board 20, to which the connector 21 is fixed, is housed in the upper housing space and a driver circuit board 22 and the bus bar assembly 800, which will be described later, are housed in the lower housing space (refer to FIG. 7). The control circuit board 20 is mounted with the control circuit 172 shown in FIG. 2, and the driver circuit board 22 is mounted with the driver circuit board 174. The control circuit board 20 and the driver circuit board 22 are connected through a flat cable not shown in the figure (refer to FIG. 7 described later), and the flat cable is drawn from the lower housing space to the upper housing space via a slit-like opening 10d formed on the dividing wall 10c.

Figure 7:
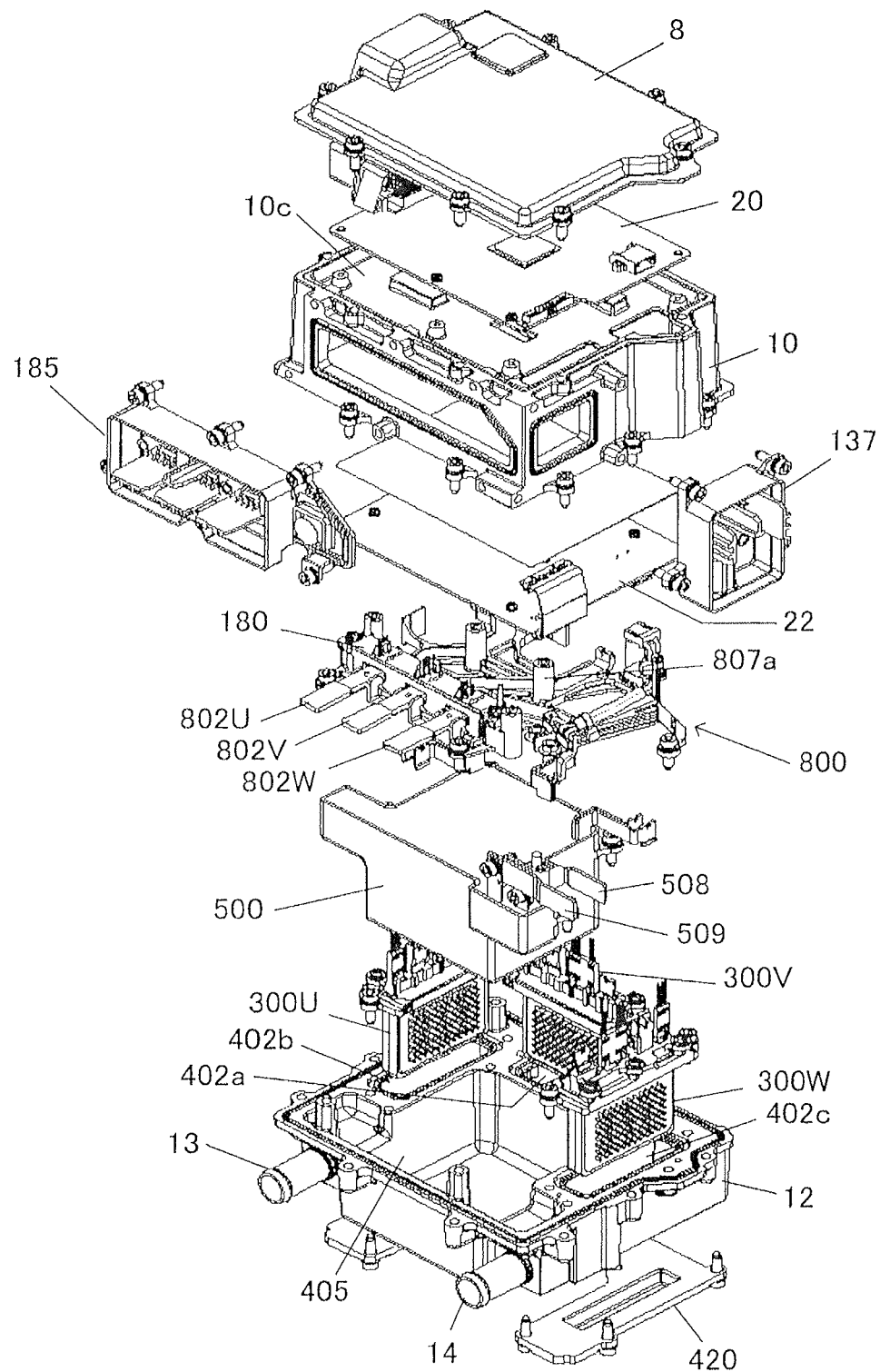
FIG. 7 is an exploded perspective view of the power conversion device 200.

FIG. 7 is an exploded perspective view of the power conversion device 200. Inside the lid 8, i.e., in the upper housing space of the housing 10, the control circuit board 20 on which the control circuit 172 is mounted as described above is arranged. The lid 8 is provided with an opening (not shown in the figure) for the connector 21. Low-voltage DC power to operate the control circuit in the power conversion device 200 is supplied from the connector 21.

The flow path former 12 is provided with a flow path through which cooling water having flowed in from the inlet pipe 13 flows, which will be described in detail later. The flow path is formed in a U shape so that the cooling water flows along three lateral surfaces of the flow path former 12. The cooling water, having flowed in from the inlet pipe 13, flows into the flow path from an end of the U shaped flow path, flows through the flow path, and then flows out from the outlet pipe 14, which is connected to the other end of the flow path.

On the upper surface of the flow path, three openings 402a to 402c are formed, from which the power modules 300U, 300V, and 300W, which are provided with the built-in series circuits 150 (refer to FIG. 1), are inserted into the flow path. The power module 300U is provided with the built-in U phase series circuit 150, the power module 300V is provided with the built-in V phase series circuit 150, and the power module 300W is provided with the built-in W phase series circuit 150. The power modules 300U to 300W have the same structure and the same external shape. The openings 402a to 402c are covered with flange sections of the inserted power modules 300U to 300W.

The flow path former 12 is provided with a housing space 405 for housing electric components as surrounded by the U shaped flow path. In the present embodiment, the capacitor module 500 is housed in the housing space 405. The capacitor module 500, housed in the housing space 405, is cooled by the cooling water flowing through the flow path. Above the capacitor module 500, the bus bar assembly 800, on which the AC bus bars 802U to 802W are mounted, is arranged. The bus bar assembly 800 is fixed on the upper surface of the flow path former 12. A current sensor module 180 is fixed on the bus bar assembly 800.

The driver circuit board 22 is fixed to supporting members 807a, provided on the bus bar assembly 800, so as to be arranged above the bus bar assembly 800. As described above, the control circuit board 20 and the driver circuit board 22 are connected through a flat cable. The flat cable is drawn from the lower housing space to the upper housing space through the slit-like opening 10d, formed on the dividing wall 10c.

In this manner, the power modules 300U to 300W, the driver circuit board 22, and the control circuit board 20 are hierarchically arranged in the height direction and the control circuit board 20 is arranged at a farthest place from the high-rate power modules 300U to 300W, thereby reducing contamination of switching noise and the like to the control circuit board 20. In addition, since the driver circuit board 22 and the control circuit board 20 are arranged in different housing spaces sectioned by the dividing wall 10c, the dividing wall 10c functions as an electromagnetic shield, thereby reducing noise contaminated from the driver circuit board 22 to the control circuit board 20. It is to be noted that the housing 10 is formed of metal material such as aluminium.

In addition, since the control circuit board 20 is fixed on the dividing wall 10c, which is integrally provided with the housing 10, the mechanical resonance frequency of the control circuit board 20 becomes higher against external vibration. For this reason, the power conversion device 200 is less susceptible to vibration from the vehicle side, thereby improving reliability.

Figure 8:
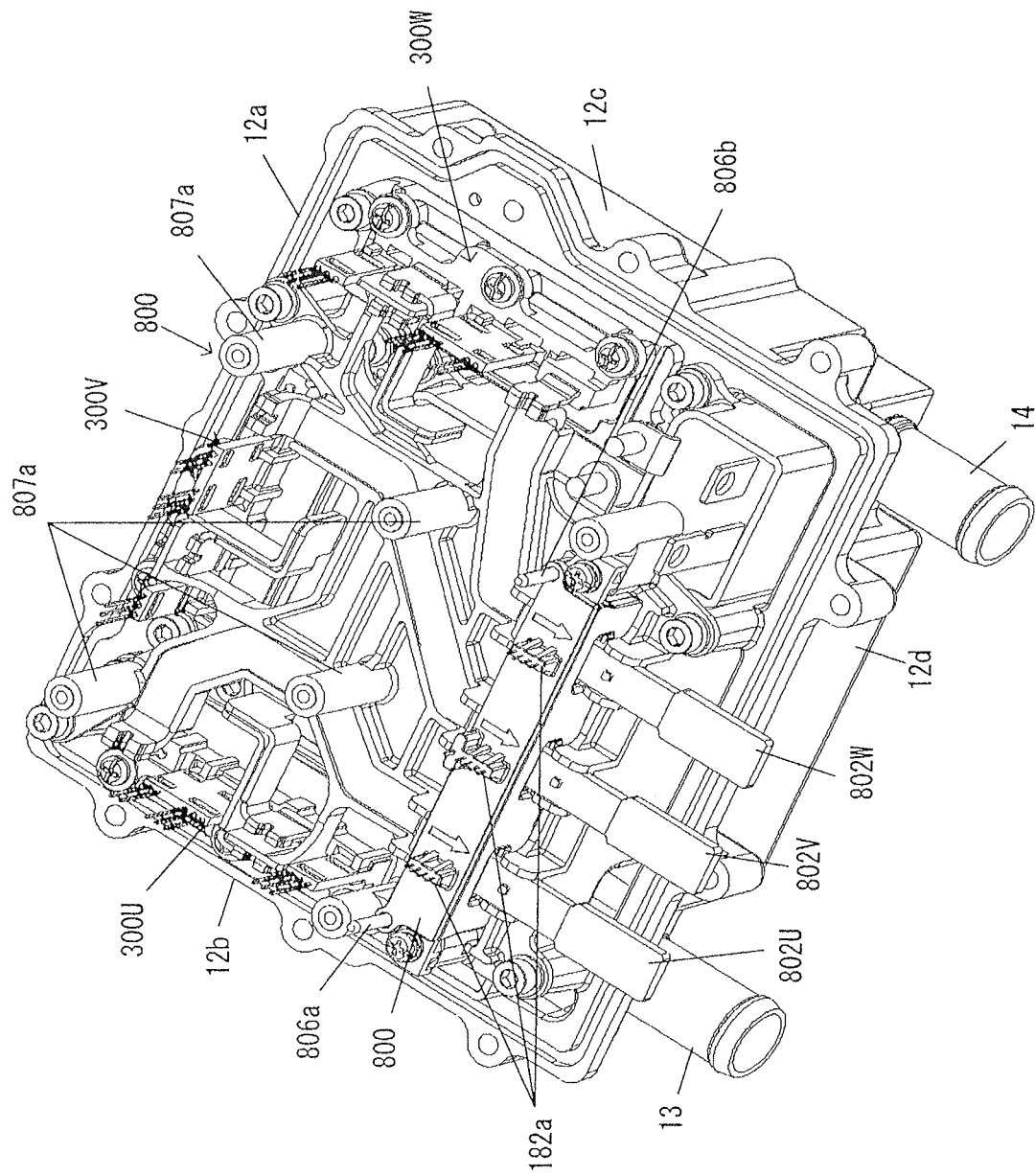
FIG. 8 is an external perspective view of a flow path former 12 to which power modules 300U to 300W, a capacitor module 500, and a bus bar assembly 800 are assembled.
Figure 9:
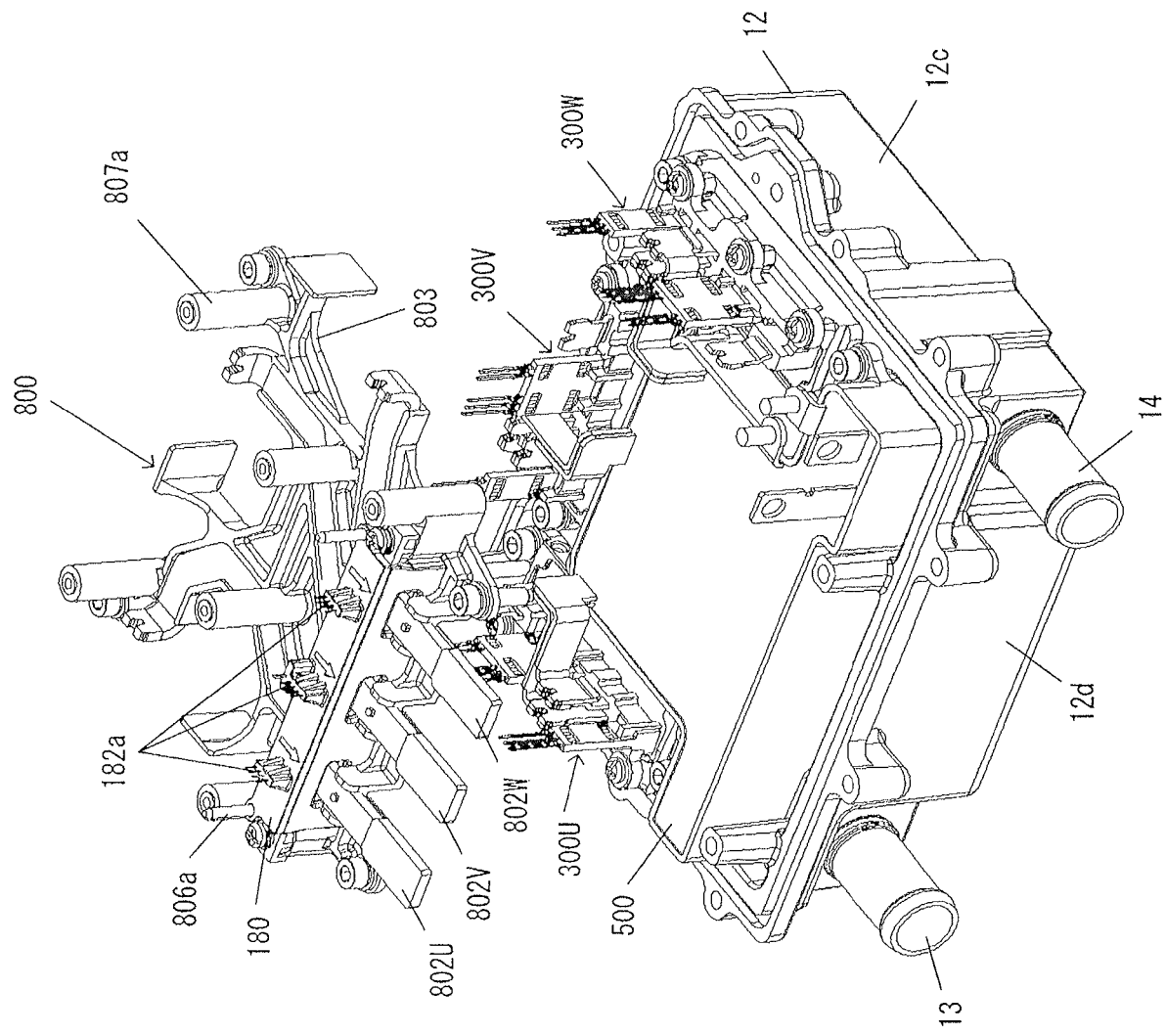
FIG. 9 is a view showing the flow path former 12 without the bus bar assembly 800.

The flow path former 12 and the power modules 300U to 300W, the capacitor module 500, and the bus bar assembly 800, which are fixed on the flow path former 12, will now be explained in detail further. FIG. 8 is an external perspective view of the flow path former 12, to which the power modules 300U to 300W, the capacitor module 500, and the bus bar assembly 800 are assembled. In addition, FIG. 9 shows a state in which the bus bar assembly 800 is removed from the flow path former 12. The bus bar assembly 800 is bolted to the flow path former 12.

Figure 10:
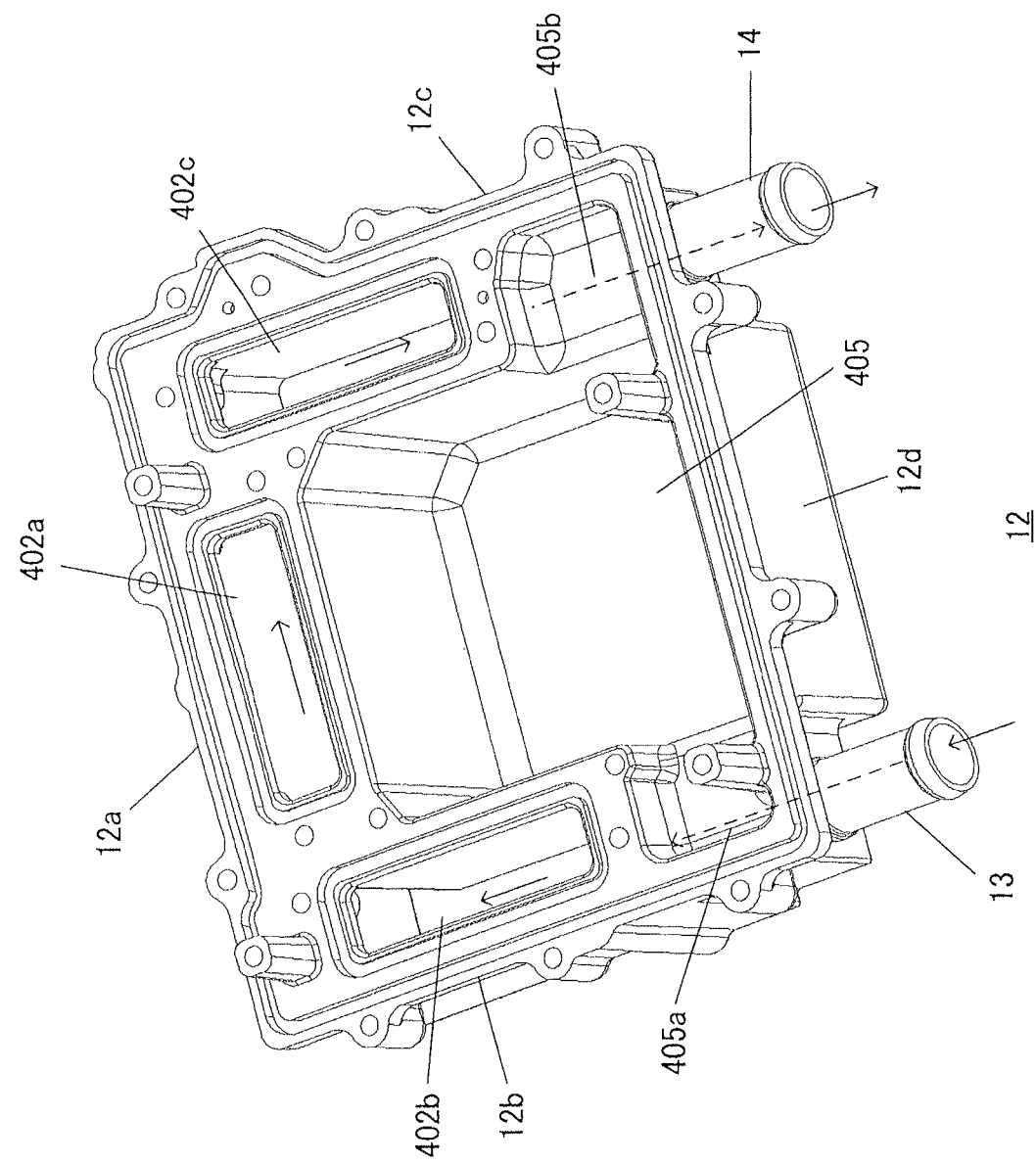
FIG. 10 is a perspective view of the flow path former 12.
Figure 11:
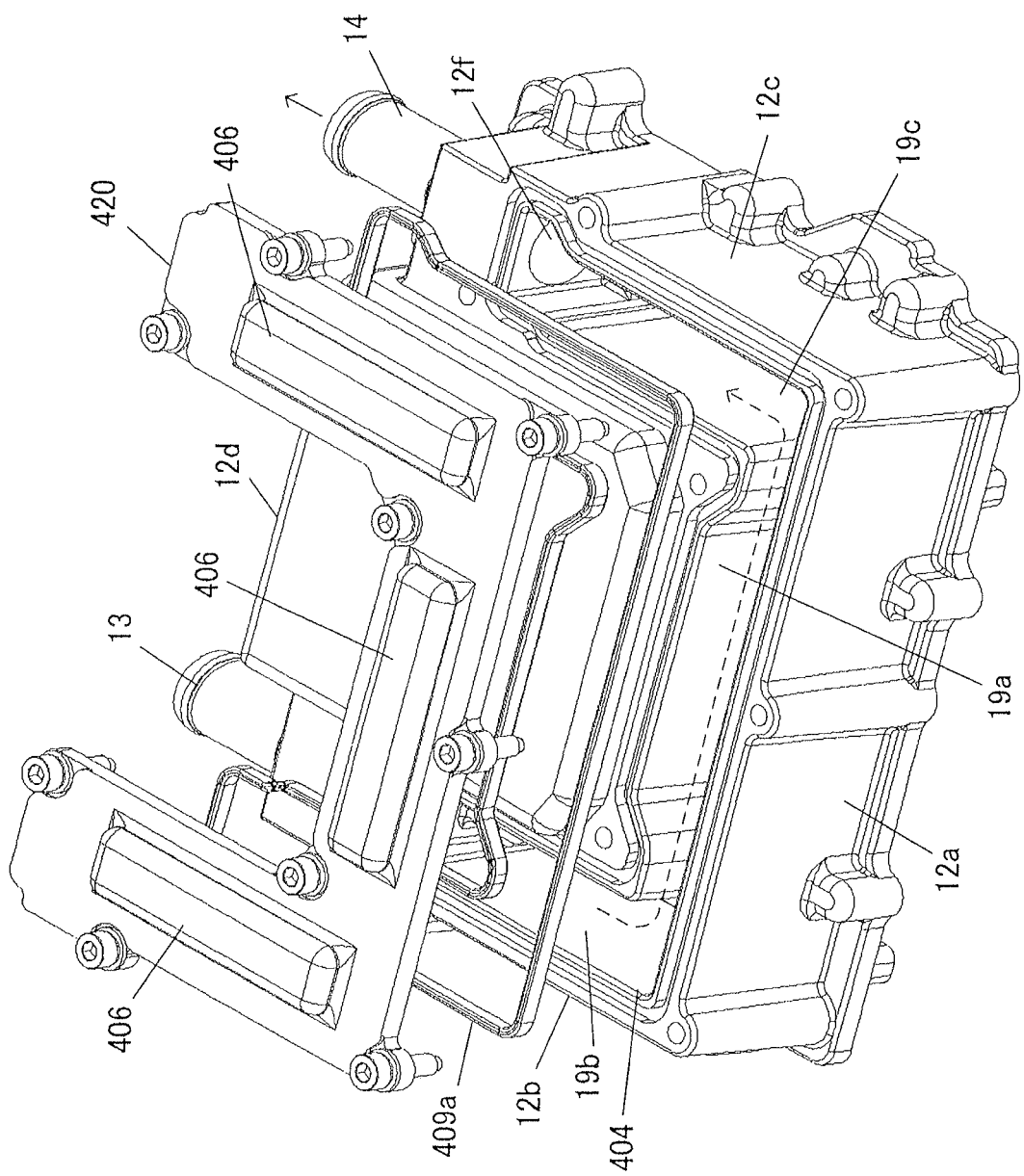
FIG. 11 is an exploded perspective view of the flow path former 12 seen from behind.

At first, the flow path former 12 will be explained with reference to FIGS. 10 and 11. FIG. 10 is a perspective view of the flow path former 12 and FIG. 11 is an exploded perspective view of the flow path former 12 seen from behind. As shown in FIG. 10, the flow path former 12 is provided in a rectangular planar shape which is substantially square and the lateral surface 12d thereof is provided with the inlet pipe 13 and the outlet pipe 14. It is to be noted that the lateral surface 12d is formed in a stepped manner at the portion on which the pipes 13 and 14 are provided. As shown in FIG. 11, the flow path 19 is formed into a U shape along the other three lateral surfaces 12a to 12c. Then, the back side of the flow path former 12 is provided with an unsectioned U shaped opening 404 having substantially the same shape as a cross-sectional shape of the flow path 19. The opening 404 is covered with the U shaped lower cover 420. A sealing member 409a is provided between the lower cover 420 and the flow path former 12, thereby providing an airtight seal.

The flow path 19, provided in a U shape, is divided into three flow path sections 19a, 19b, and 19c depending upon the direction of the flow of cooling water. The first flow path section 19a is provided along the lateral surface 12a in a position opposite to the lateral surface 12d on which the pipes 13 and 14 are provided, the second flow path section 19b is provided along the lateral surface 12b adjacent to one side of the lateral surface 12a, and the third flow path section 19c is provided along the lateral surface 12c adjacent to the other side of the lateral surface 12a, as described later in detail. Cooling water flows in from the inlet pipe 13 to the flow path section 19b, flows through in order of the flow path section 19b, the flow path section 19a, and the flow path section 19c as indicated by the dashed arrow, and then flows out from the outlet pipe 14.

As shown in FIG. 10, on the upper surface side of the flow path former 12, a rectangular opening 402a, parallel to the lateral surface 12a, is formed in a position opposite to the flow path section 19a, a rectangular opening 402b, parallel to the lateral surface 12b, is formed in a position opposite to the flow path section 19b, and a rectangular opening 402c, parallel to the lateral surface 12c, is formed in a position opposite to the flow path section 19c. Through these openings 402a to 402c, the power modules 300U to 300W are inserted into the flow path 19.

As shown in FIG. 11, raised portions 406 protruding downward the flow path 19 are formed on the lower cover 420 in a position opposite to each of the openings 402a to 402c described above. These raised portions 406 are recesses if seen from the flow path 19 side, and lower end portions of the power modules 300U to 300W inserted through the openings 402a to 402c fit into these recesses. Since the flow path former 12 is formed so that the opening 404 is opposite to the openings 402a to 402c, it is easily manufactured by aluminium casting.

As shown in FIG. 10, the flow path former 12 is provided with the rectangular housing space 405 formed so that its three sides are surrounded by the flow path 19. The capacitor module 500 is housed in the housing space 405. Since the housing space 405 surrounded by the flow path 19 is provided in a rectangular shape, the capacitor module 500 is provided in a rectangular shape, thereby improving the productivity of the capacitor module 500.

The structure of the power modules 300U to 300W and power modules 301U to 301W, which are used in the inverter circuit 140, will be explained in detail with reference to FIG. 12A to FIG. 26B. The power modules 300U to 300W and the power modules 301U to 301W each have the same structure and hence the structure of the power module 300U will be explained as a representative thereof. It is to be noted that in FIG. 12A to FIG. 26B, a signal terminal 325U corresponds to the gate electrode 154 and the emitter electrode 155 for signals, disclosed in FIG. 2, and a signal terminal 325L corresponds to the gate electrode 164 and the emitter electrode 165, disclosed in FIG. 2. In addition, a DC positive terminal 315B is identical to the positive terminal 157, disclosed in FIG. 2, and a DC negative terminal 319B is identical to the negative terminal 158, disclosed in FIG. 2. In addition, an AC terminal 320B is the same as the AC terminal 159, disclosed in FIG. 2.

FIG. 12A is a perspective view of the power module 300U of the present embodiment. FIG. 12B is a sectional view of the power module 300U of the present embodiment being cut on a cross section D and seen from a direction E.

FIGS. 13A, B, and C are views showing the power module 300U with a screw 309 and a second sealing resin 351 removed from the configuration in the state shown in FIGS. 12A and 12B for better understanding. FIG. 13A is a perspective view and FIG. 13B is a sectional view of the power module 300U of the present embodiment being cut on the cross section D and seen from the direction E as in FIG. 12B. In addition, FIG. 13C shows a sectional view before pressure is applied to fins 305 so that curved portions 304A are deformed.

Figure 14B:
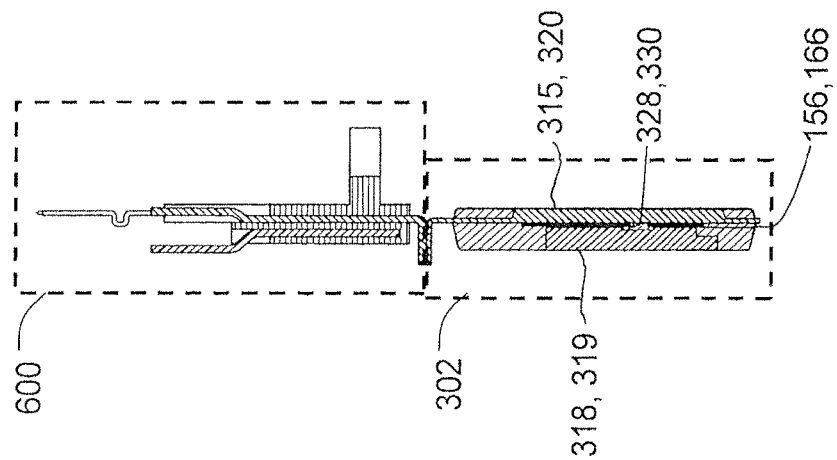
Figure 14A:
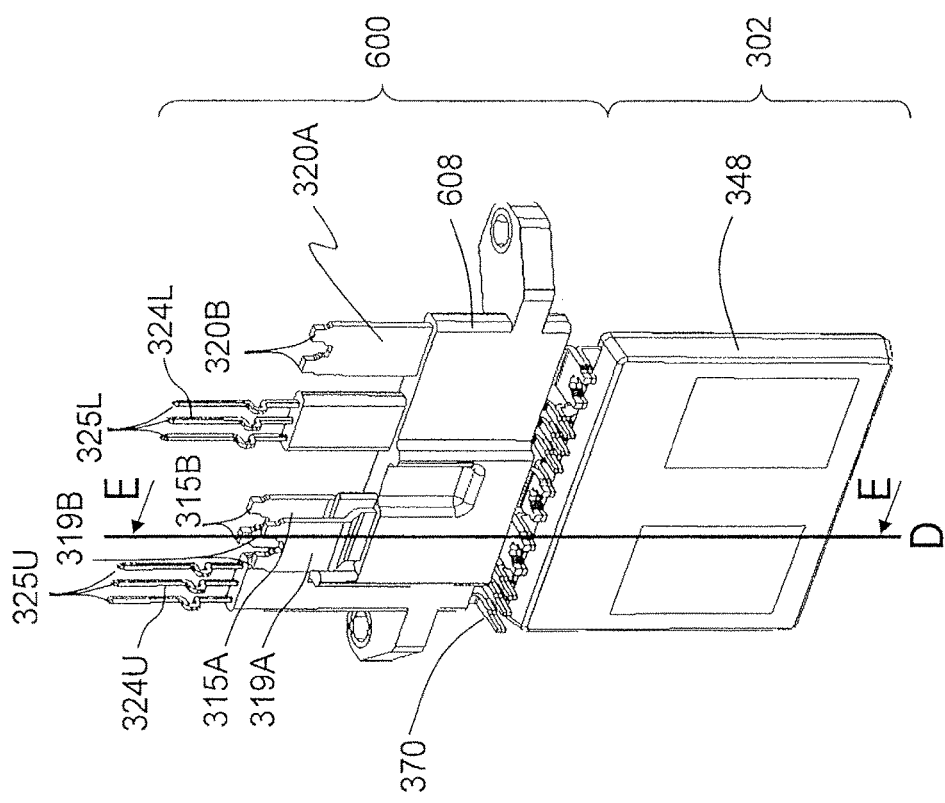

FIGS. 14A and 14B are views showing the power module 300U with a module case 304 further removed from the configuration in the state shown in FIGS. 13A and 13B. FIG. 14A is a perspective view and FIG. 14B is a sectional view of the power module 300U of the present embodiment being cut on the cross section D and seen from the direction E as in FIG. 12B and FIG. 13B.

Figure 15:
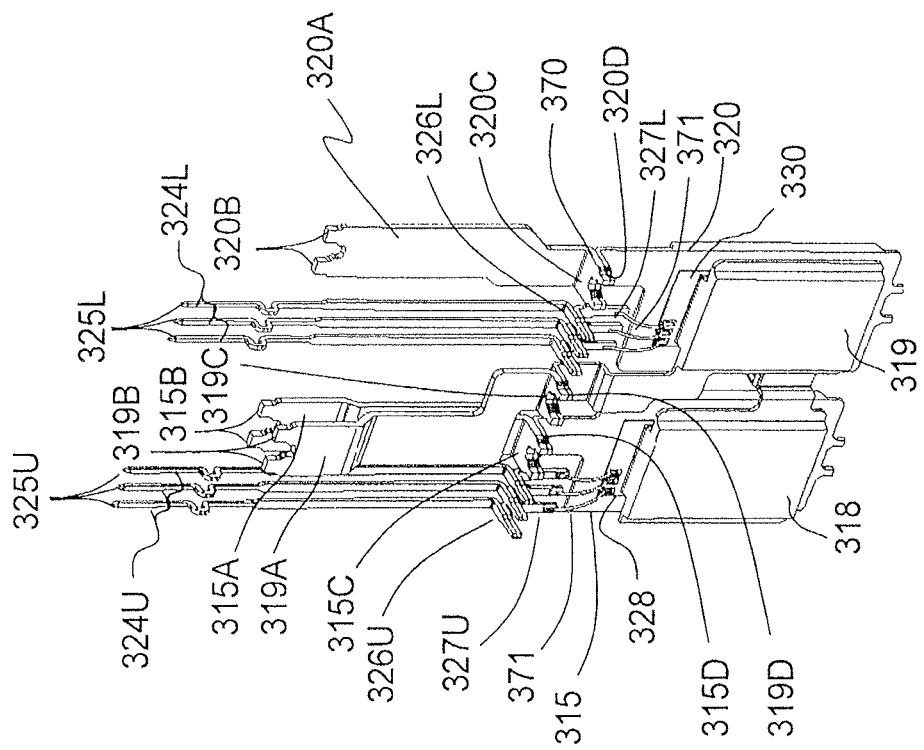
FIG. 15 is a perspective view of the power module with a first sealing resin and a wiring insulation section not illustrated.

FIG. 15 is a perspective view of the power module 300U with a first sealing resin 348 and a wiring insulation section 608 further removed from the configuration in the state shown in FIGS. 14A and 14B.

Figure 16B:
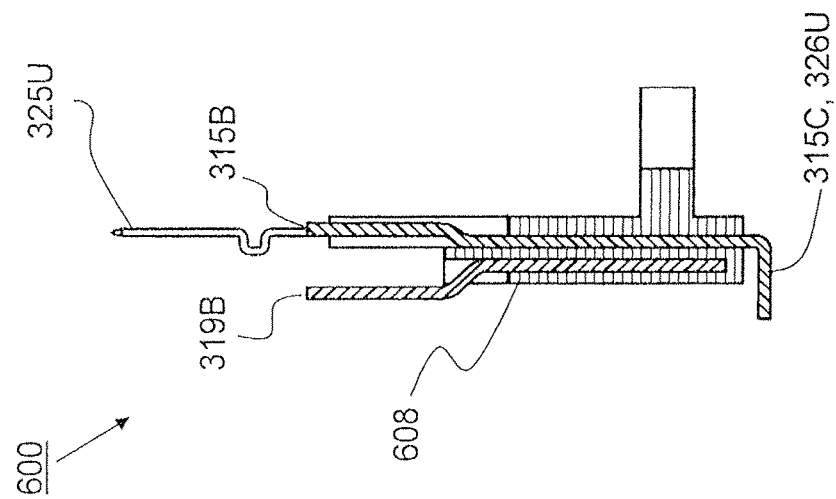
Figure 16A:
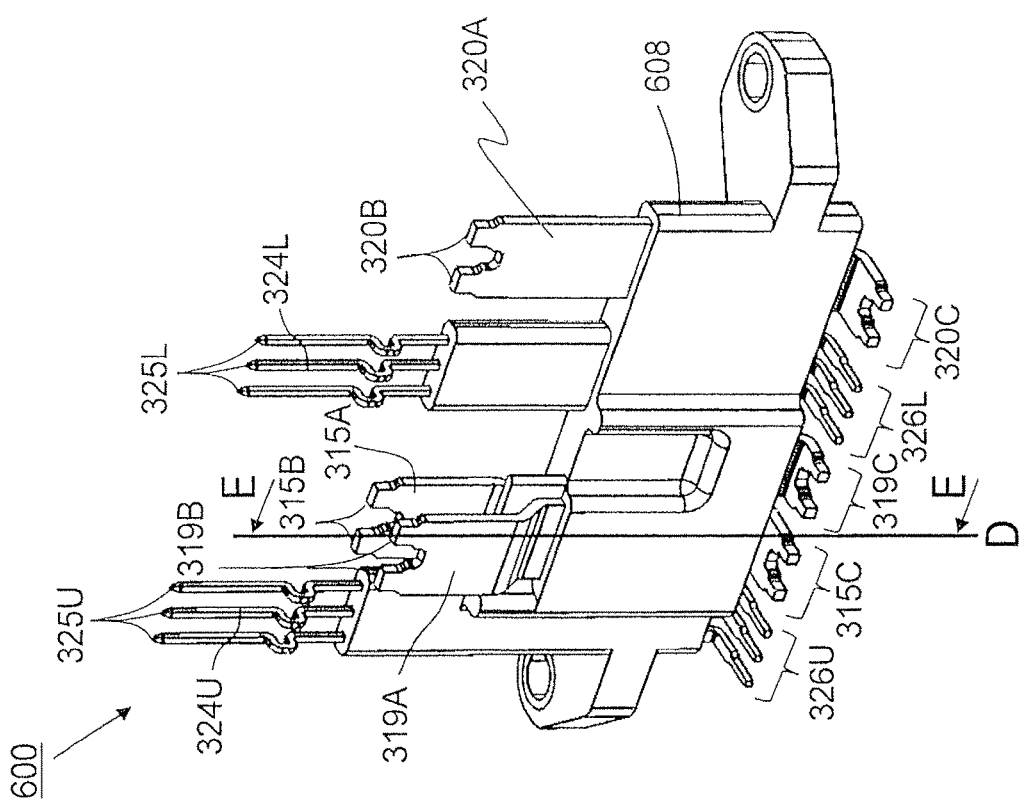

FIGS. 16A and 16B are views showing an ancillary molded body 600 of the power module 300U. FIG. 16A is a perspective view and FIG. 16B is a sectional view of the ancillary molded body 600 being cut on the cross section D and seen from the direction E as in FIG. 12B, FIG. 13B, and FIG. 14B.

The power semiconductor elements (the IGBT 328, the IGBT 330, the diode 156, and the diode 166) constituting the series circuit 150 of the upper and lower arms are, as shown in FIGS. 14A, 14B, and 15, sandwiched from the both sides and fixed by a conductor plate 315 and a conductor plate 318 or a conductor plate 320 and a conductor plate 319. The conductor plate 315 and the like are sealed by the first sealing resin 348 in a state where their heat dissipation surfaces are exposed, and an insulation sheet 333 is thermo-compression bonded to the heat dissipation surfaces. The first sealing resin 348 is provided in a polyhedron shape (here, substantially rectangular solid shape) as shown in FIGS. 14A and 14B.

A module primary seal body 302 sealed by the first sealing resin 348 is inserted into the module case 304 and thermo-compression bonded onto the inner surface of the module case 304, which is a can-type cooler, across the insulation sheet 333. Here, the can-type cooler is a cylinder shaped cooler having an insertion slot 306 on one side and a bottom on the other side. An air gap remaining inside the module case 304 is filled with the second sealing resin 351.

The module case 304 is formed of an electrically conductive member such as aluminium alloy material (Al, AlSi, Al SiC, Al—C, and the like) and integrally formed seamlessly. The module case 304 is configured not to include an opening other than the insertion slot 306, and the insertion slot 306 is surrounded by a flange 304B around the outer circumference thereof. In addition, as shown in FIG. 12A, a first heat dissipation surface 307A and a second heat dissipation surface 307B, which have a larger surface than another surface, are arranged in a state where they are opposite to each other, and each of the power semiconductor elements (the IGBT 328, the IGBT 330, the diode 156, and the diode 166) is arranged opposite to these heat dissipation surfaces. The three surfaces connected to the first heat dissipation surface 307A and the second heat dissipation surface 307B, which are opposite to each other, constitute a surface sealed in a width smaller than the first heat dissipation surface 307A and the second heat dissipation surface 307B, and the insertion slot 306 is formed on the surface of the remaining one side. The module case 304 may not be provided in an accurately rectangular shape but may be round in corners as shown in FIG. 12A.

Since the use of a metal case with such shape enables sealing to a cooling medium to be ensured at the flange 304B even if the module case 304 is inserted into the flow path 19 through which a cooling medium such as water or oil is flowing, the cooling medium is prevented by a simple structure from entering inside the module case 304. In addition, the fins 305 are formed uniformly on each of the first heat dissipation surface 307A and the second heat dissipation surface 307B, opposite to each other. In addition, the extremely thin curved portions 304A are formed on the outer circumference of the first heat dissipation surface 307A and the second heat dissipation surface 307B. The curved portions 304A are made extremely thin to an extent where they are easily deformed by applying pressure to the fins 305, thereby improving the productivity after the module primary seal body 302 is inserted.

The conductor plate 315 and the like are thermo-compression bonded onto the inner wall of the module case 304 through the insulation sheet 333 as described above so as to allow the air gap between the conductor plate 315 and the like and the inner wall of the module case 304 to be reduced, thereby transmitting generated heat at the power semiconductor elements to the fins 305 efficiently. In addition, the insulation sheet 333 is made thick and flexible to some extent so that the generated thermal stress is absorbed in the insulation sheet 333, and thus the power semiconductor device is excellent for use in a power conversion device for a vehicle with severe temperature changes.

A metal DC positive wiring 315A and a metal DC negative wiring 319A, which are to be electrically connected with the capacitor module 500, are provided outside the module case 304 and end sections thereof are provided with the DC positive terminal 315B (157) and the DC negative terminal 319B (158), respectively. In addition, a metal AC wiring 320A for supplying AC power to the motor generator MG1 is provided and its end is provided with the AC terminal 320B (159). In the present embodiment, as shown in FIG. 15, the DC positive wiring 315A is connected with the conductor plate 315, the DC negative wiring 319A is connected with the conductor plate 319, and the AC wiring 320A is connected with the conductor plate 320.

In addition, metal signal wirings 324U and 324L, which are to be electrically connected with the driver circuit 174, are provided outside the module case 304, their end sections are provided with the signal terminal 325U (154, 155) and the signal terminal 325L (164, 165), respectively. In the present embodiment, as shown in FIG. 15, the signal wiring 324U is connected with the IGBT 328 and the signal wiring 324L is connected with the IGBT 328.

The DC positive wiring 315A, the DC negative wiring 319A, the AC wiring 320A, the signal wiring 324U, and the signal wiring 324L are integrally formed as the ancillary molded body 600 in a state where they are insulated from one another by the wiring insulation section 608 formed of resin material. The wiring insulation section 608 also acts as a supporting member for supporting each wiring, and thus thermosetting resin or thermoplastic resin, having insulation properties, is appropriate for the resin material used for the wiring insulation section 608. This ensures insulation among the DC positive wiring 315A, the DC negative wiring 319A, the AC wiring 320A, the signal wiring 324U and the signal wiring 324L, thereby enabling high density wiring. The ancillary molded body 600 is metallically bonded with the module primary seal body 302 at a connection section 370 before fixed to the module case 304 with the screw 309 passing through a screw hole provided on the wiring insulation section 608. The metal bonding of the module primary seal body 302 with the ancillary molded body 600 at the connection section 370 may be TIG-welded, for instance.

The DC positive wiring 315A and the DC negative wiring 319A are layered in a state where they are opposite to each other across the wiring insulation section 608, thereby constituting a shape extending substantially in parallel. Such arrangement and shape causes the instantaneous currents to flow against and in the opposite direction to each other during switching operations of the power semiconductor elements. This has an effect to cause the magnetic fields generated by the current to cancel each other out, thereby allowing reduction of inductance. It is to be noted that the AC wiring 320A and the signal terminals 325U and 325L also extend in the same direction as the DC positive wiring 315A and the DC negative wiring 319A.

The connection section 370, at which the module primary seal body 302 and the ancillary molded body 600 are metallically bonded, is sealed in the module case 304 with the second sealing resin 351. This stably ensures a necessary insulation distance between the connection section 370 and the module case 304, thereby achieving reduction in size of the power module 300U compared to one that is not sealed.

As shown in FIG. 15 and FIGS. 16A and 16B, on the ancillary module 600 side of the connection section 370, an ancillary module-side DC positive connection terminal 315C, an ancillary module-side DC negative connection terminal 319C, an ancillary module-side AC connection terminal 320C, an ancillary module-side signal connection terminal 326U, and an ancillary module-side signal connection terminal 326L are aligned. On the module primary seal body 302 side of the connection section 370, on the other hand, an element-side DC positive connection terminal 315D, an element-side DC negative connection terminal 319D, an element-side AC connection terminal 320D, an element-side signal connection terminal 327U, and an element-side signal connection terminal 327L are aligned along one surface of the first sealing resin 348 provided in a polyhedron shape. In this manner, each of the terminals is configured to be aligned at the connection section 370, thereby facilitating manufacturing of the module primary seal body 302 by transfer molding.

Here, a description will be given on the position relationship of each of the terminals with portions which extend outward from the first sealing resin 348 of the module primary seal body 302 regarded as one terminal for each type. In the explanation below, a terminal constituted with the DC positive wiring 315A (inclusive of the DC positive terminal 315B and the ancillary module-side DC positive connection terminal 315C) and the element-side DC positive connection terminal 315D will be referred to as a positive electrode-side terminal, a terminal constituted with the DC negative wiring 319A (inclusive of the DC negative terminal 319B and the ancillary module-side DC negative connection terminal 319C) and the element-side DC negative connection terminal 315D will be referred to as a negative electrode-side terminal, a terminal constituted with the AC wiring 320A (inclusive of the AC terminal 320B and the ancillary module-side AC connection terminal 320C) and the element-side AC connection terminal 320D will be referred to as an output terminal, a terminal constituted with the signal wiring 324U (inclusive of the signal terminal 325U and the ancillary module-side signal connection terminal 326U) and the element-side signal connection terminal 327U will be referred to as a signal terminal for the upper arm, and a terminal constituted with the signal wiring 324L (inclusive of the signal terminal 325L and the ancillary module-side signal connection terminal 326L) and the element-side signal connection terminal 327L will be referred to as a signal terminal for the lower arm.

Each of the above terminals protrudes from the first sealing resin 348 and the second sealing resin 351 through the connection section 370, and each of the protruding portions from the first sealing resin 348 (the element-side DC positive connection terminal 315D, the element-side DC negative connection terminal 319D, the element-side AC connection terminal 320D, the element-side signal connection terminal 327U, and the element-side signal connection terminal 327L) is aligned along one surface of the first sealing resin 348 provided in the polyhedron shape described above. In addition, the positive electrode-side terminal and the negative electrode-side terminal protrude from the second sealing resin 351 in a layered state and extend out of the module case 304. Such configuration will prevent over stress on the connection section of the power semiconductor elements with the terminal and a gap in mold from occurring at the time of clamping when the power semiconductor elements are sealed with the first sealing resin 348 so as to manufacture the module primary seal body 302. In addition, magnetic fluxes in directions canceling each other out are generated by the currents of opposite directions flowing through the layered positive electrode-side terminal and negative electrode-side terminal, thereby achieving reduction of inductance.

On the ancillary module 600 side, the ancillary module-side DC positive connection terminal 315C and the ancillary module-side DC negative connection terminal 319C are formed at the end sections of the DC positive wiring 315A and the DC negative wiring 319A on the opposite side of the DC positive terminal 315B and the DC negative terminal 319B, respectively. In addition, the ancillary module-side AC connection terminal 320C is formed at the end section of the AC wiring 320A on the opposite side of the AC terminal 320B. The ancillary module-side signal connection terminals 326U and 326L are formed at the end sections of the signal wirings 324U and 324L on the opposite side of the signal terminals 325U and 325L, respectively.

On the module primary seal body 302 side, on the other hand, the element-side DC positive connection terminal 315D, the element-side DC negative connection terminal 319D, and the element-side AC connection terminal 320D are formed on the conductor plates 315, 319, and 320, respectively. In addition, the element-side signal connection terminals 327U and 327L are connected through a bonding wire 371 with the IGBTs 328 and 330, respectively.

Next, the assembly process of the module primary seal body 302 will be explained with reference to FIG. 17 to FIG. 21.

Figure 17:
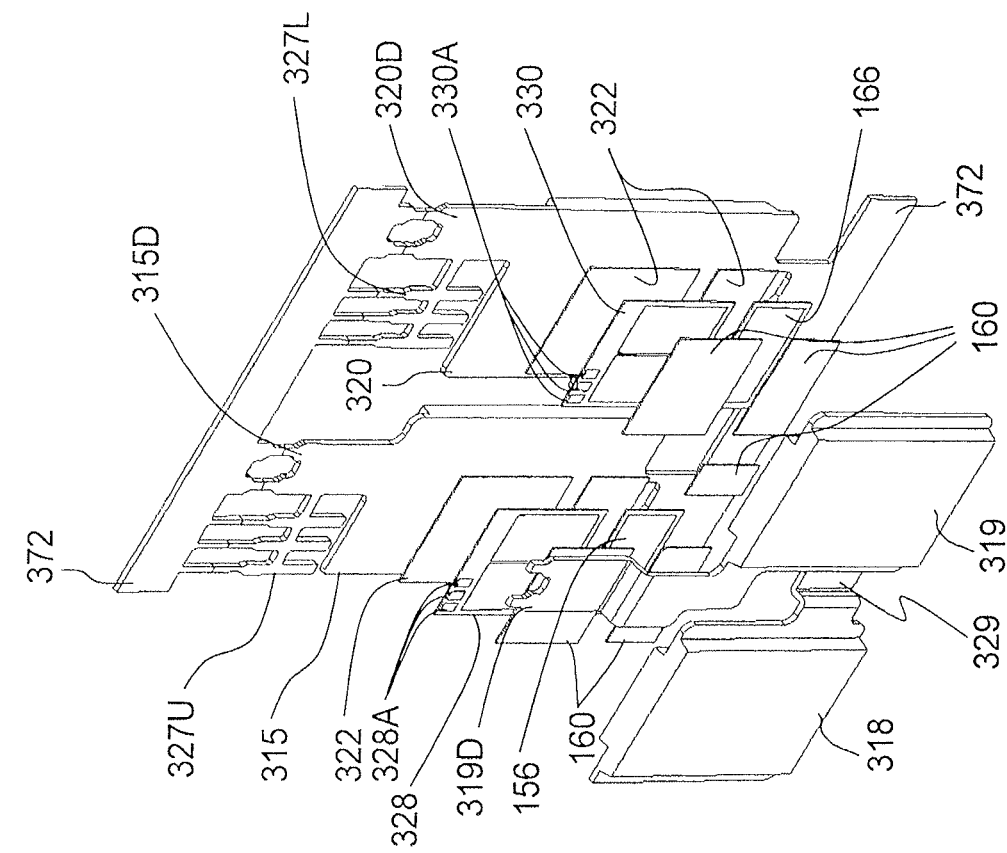
FIG. 17 is a view for explaining an assembly process of a module primary seal body.

As shown in FIG. 17, the conductor plate 315 on the DC positive electrode side, the conductor plate 320 on the AC output side, and the element-side signal connection terminals 327U and 327L are integrally processed so that they are arranged on substantially the same plane in a state where they are tied to a common tie bar 372. The collector electrode of the IGBT 328 of the upper arm side and the cathode electrode of the diode 156 of the upper arm side are fixed to the conductor plate 315. The collector electrode of the IGBT 330 of the lower arm side and the cathode electrode of the diode 166 of the lower arm side are fixed to the conductor plate 320. The conductor plate 318 and the conductor plate 319 are arranged on substantially the same plane over the IGBTs 328 and 330 and the diodes 155 and 166. The emitter electrode of the IGBT 328 of the upper arm side and the anode electrode of the diode 156 of the upper arm side are fixed to the conductor plate 318. The emitter electrode of the IGBT 330 of the lower arm side and the anode electrode of the diode 166 of the lower arm side are fixed to the conductor plate 319. Each of the power semiconductor elements is fixed through a metal bonding material 160 to an element fixing portion 322 provided on each of the conductor plates. The metal bonding material 160 is, for example, a soldering material, a silver sheet, a low-temperature sintering jointing material including fine metallic particles, or the like.

Each of the power semiconductor elements has a plate-like flat configuration, each of the electrodes of which is formed on the front and back surfaces. As shown in FIG. 17, each of the electrodes of the power semiconductor elements is sandwiched by the conductor plate 315 and the conductor plate 318 or by the conductor plate 320 and the conductor plate 319. In other words, the conductor plate 315 and the conductor plate 318 are arranged in a layered manner opposite to each other in substantially parallel through the IGBT 328 and the diode 156. Similarly, the conductor plate 320 and the conductor plate 319 are arranged in a layered manner opposite to each other in substantially parallel through the IGBT 330 and the diode 166. In addition, the conductor plate 320 and the conductor plate 318 are connected through an intermediate electrode 329. This connection causes the upper arm circuit and the lower arm circuit to be electrically connected, thereby forming an upper and lower arm series circuit.

Figure 18:
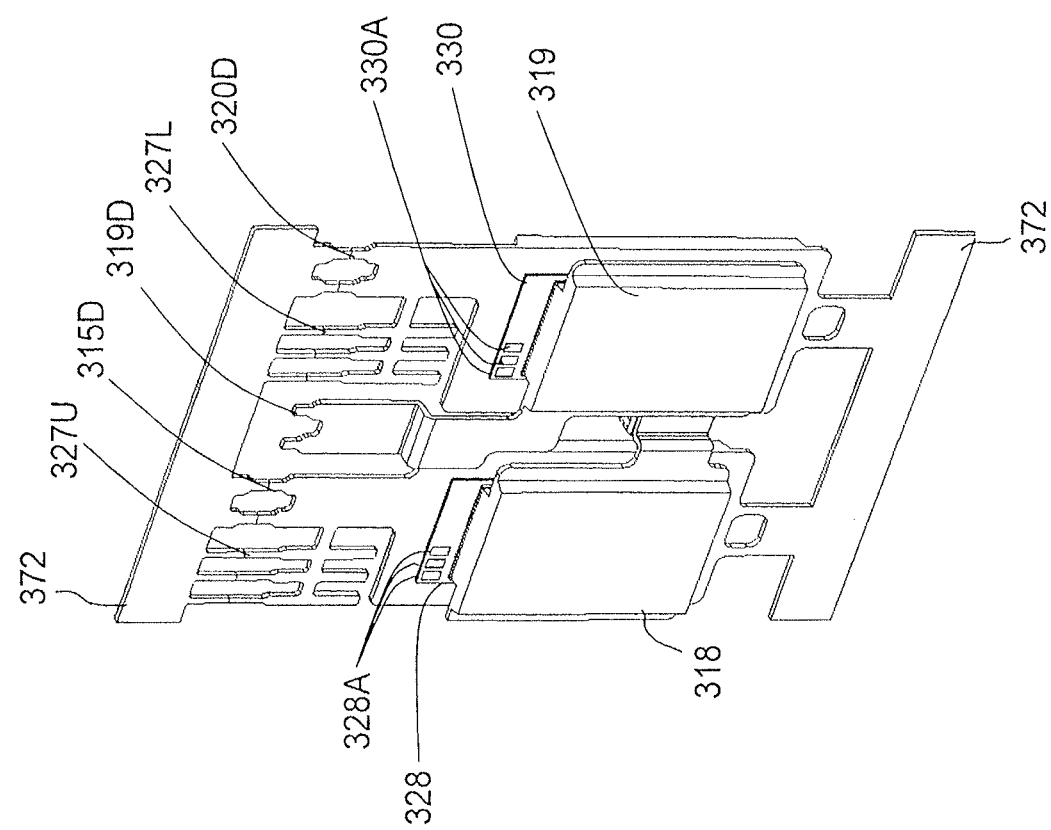
FIG. 18 is a view for explaining the assembly process of the module primary seal body.

As described above, the IGBT 328 and the diode 156 are sandwiched between the conductor plate 315 and the conductor plate 318, the IGBT 330 and the diode 166 are sandwiched between the conductor plate 320 and the conductor plate 319, and the conductor plate 320 and the conductor plate 318 are connected through the intermediate electrode 329 as illustrated in FIG. 18. After that, a control electrode 328A of the IGBT 328 and the element-side signal connection terminal 327U are connected through the bonding wire 371 and a control electrode 330A of the IGBT 330 and the element-side signal connection terminal 327L are connected through the bonding wire 371 as illustrated in FIG. 19.

Figure 19:
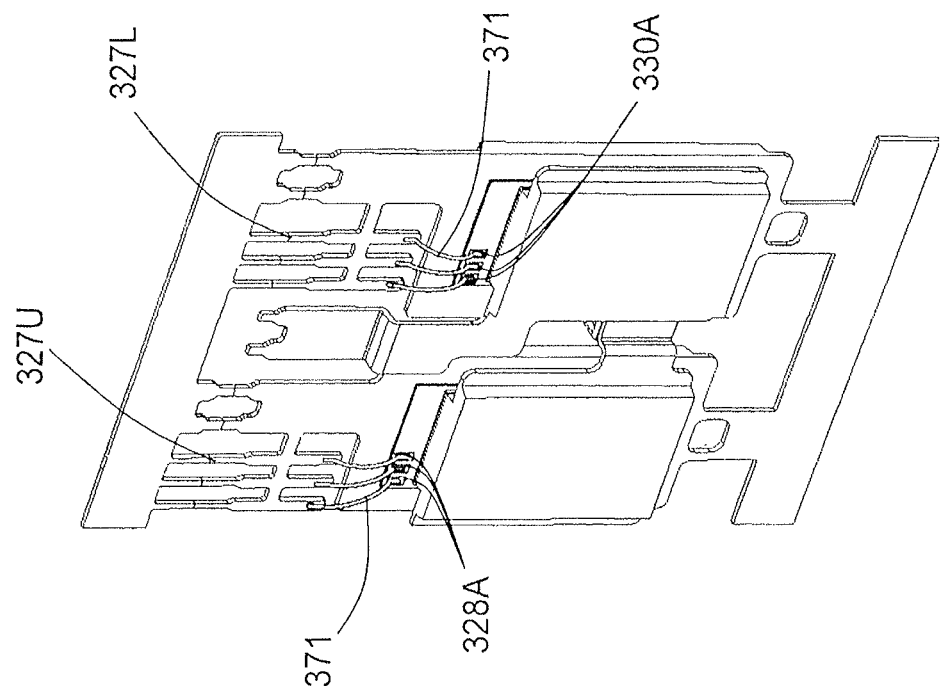
FIG. 19 is a view for explaining the assembly process of the module primary seal body.
Figure 20:
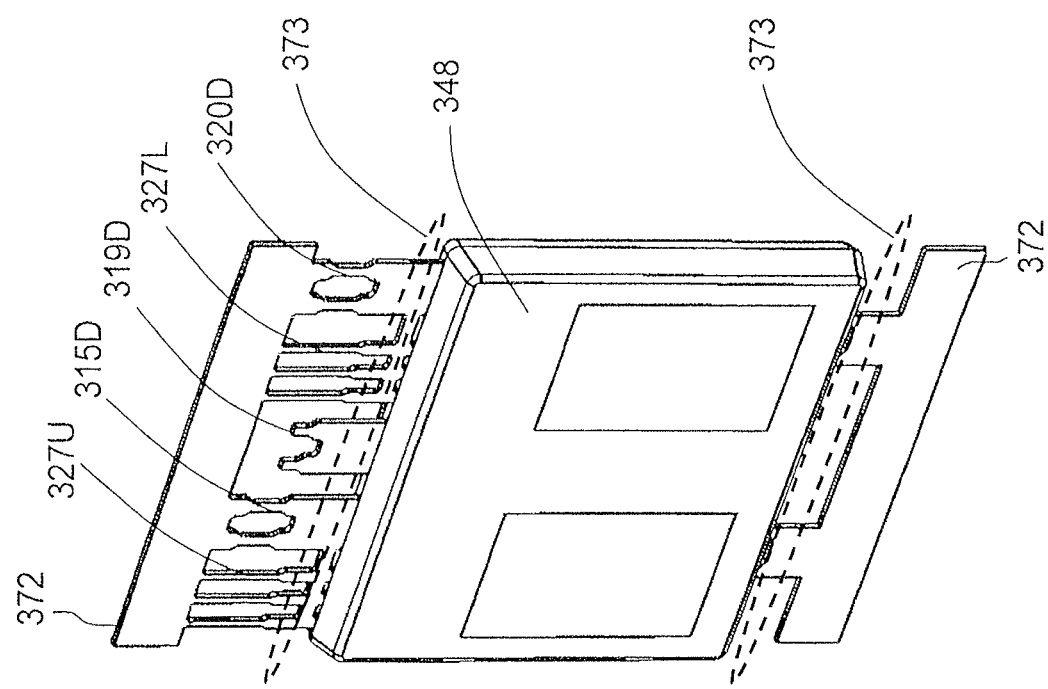
FIG. 20 is a view for explaining the assembly process of the module primary seal body.

Once the assembly has proceeded up to the state shown in FIG. 19, the portion including the power semiconductor elements and the bonding wire 371 is sealed with the first sealing resin 348 as illustrated in FIG. 20. At this time, the portion including the power semiconductor elements and the bonding wire 371 is formed by mold-pressing from above and below on the mold pressing surface 373 and filling the first sealing resin 348 in the mold by transfer mold.

Figure 21:
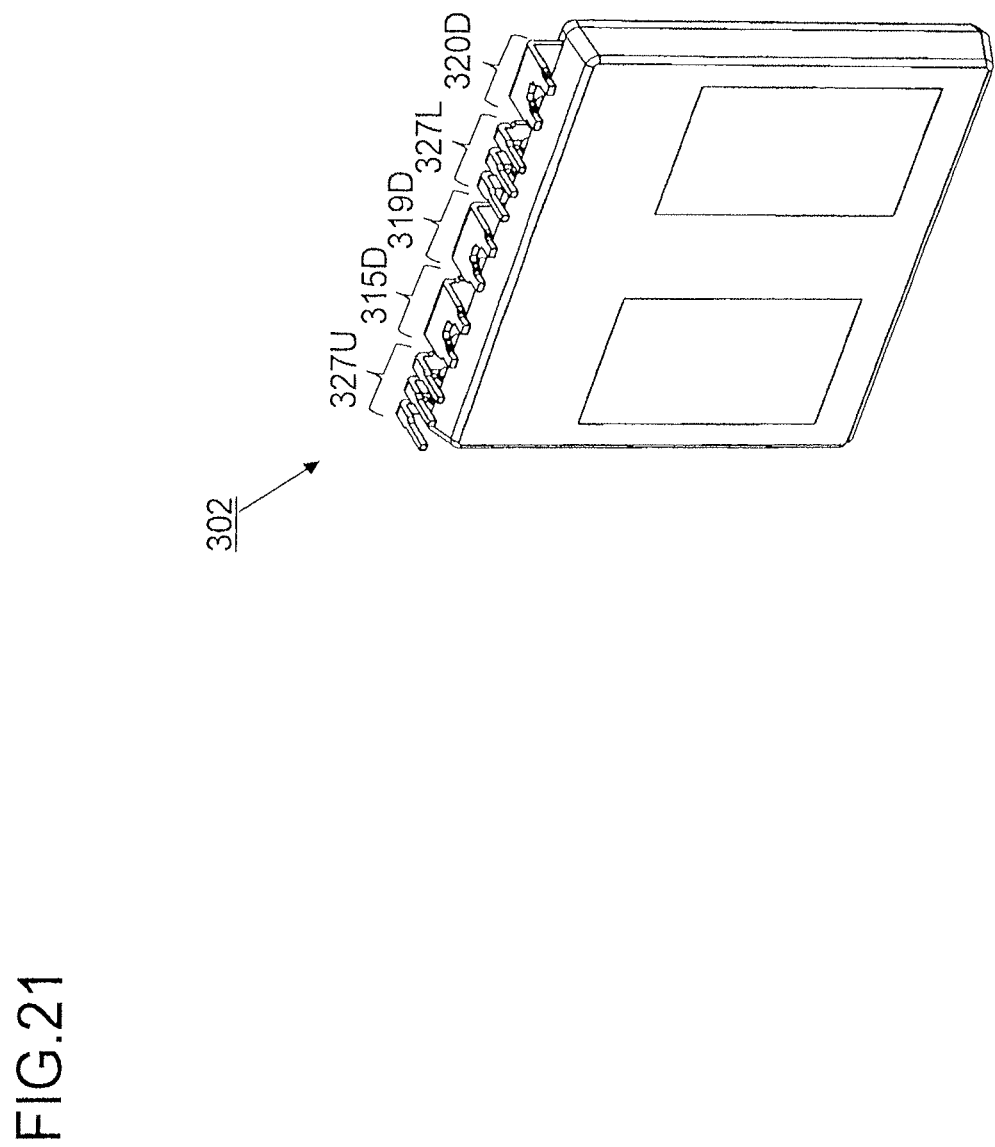
FIG. 21 is a view for explaining the assembly process of the module primary seal body.

Upon sealing the portion including the power semiconductor elements and the bonding wire 371 with the first sealing resin 348, the tie bar 372 is removed so as to separate the element-side DC positive connection terminal 315D, the element-side AC connection terminal 320D, and the element-side signal connection terminals 327U and 327L individually. Then, each end of the element-side DC positive connection terminal 315D, the element-side DC negative connection terminal 319D, the element-side AC connection terminal 320D, and the element-side signal connection terminals 327U and 327L, which are aligned on one side of the module primary seal body 302, is bent in the same direction as illustrated in FIG. 21. This will facilitate the work of metallically bonding the module primary seal body 302 with the ancillary molded body 600 at the connection section 370 and improve the productivity, thereby improving the reliability of the metal bond.

Figure 22A:
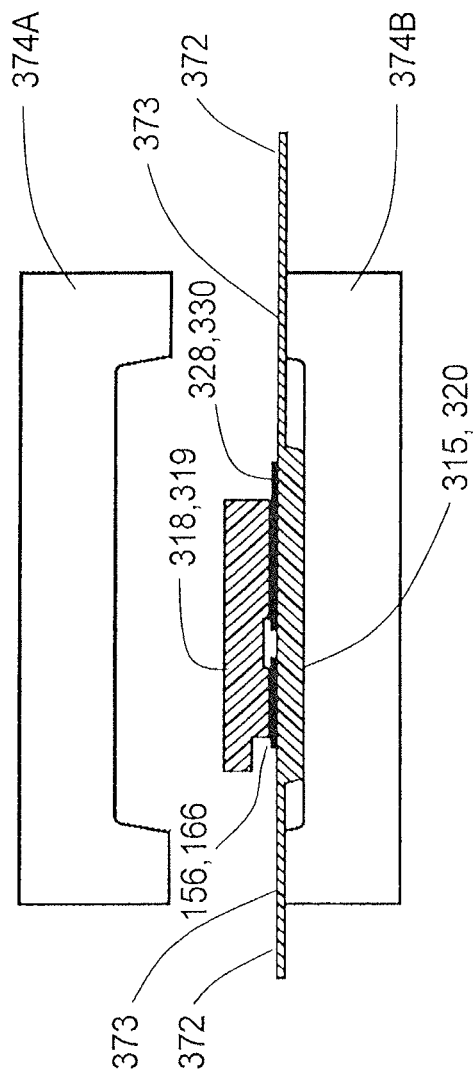
Figure 22B:
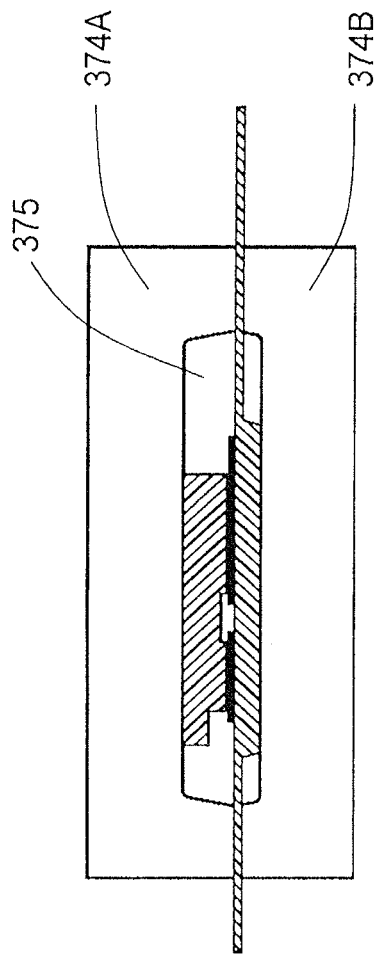

FIGS. 22A and 22B are views for explaining the transfer molding process of the first sealing resin 348. FIG. 22A shows a vertical sectional view before clamping and FIG. 22B shows a vertical sectional view after clamping.

As shown in FIG. 22A, the module primary seal body 302 before sealed shown in FIG. 19 is placed between an upper mold 374A and a lower mold 374B. The upper mold 374A and the lower mold 374B sandwich and clamp the module primary seal body 302 from above and below on the mold pressing surface 373 so as to form a mold cavity 375 in the mold as shown in FIG. 22B. The mold cavity 375 is filled with the first sealing resin 348 and formed so that the power semiconductor elements (the IGBTs 328 and 330 and the diodes 155 and 166) are sealed with the first sealing resin 348 in the module primary seal body 302.

It is to be noted that as shown in FIG. 20, on the mold pressing surface 373, the element-side DC positive connection terminal 315D, the element-side DC negative connection terminal 319D, the element-side AC connection terminal 320D, the element-side signal connection terminal 327U, and the element-side signal connection terminal 327L are aligned. Such terminal arrangement enables clamping using the upper mold 374A and the lower mold 374B without generating unnecessary stress at the connection section of each of the terminals with the power semiconductor elements and without a gap. Accordingly, the power semiconductor elements will be sealed without damaging the power semiconductor elements or leaking the first sealing resin 348 from the gap.

Figure 23:
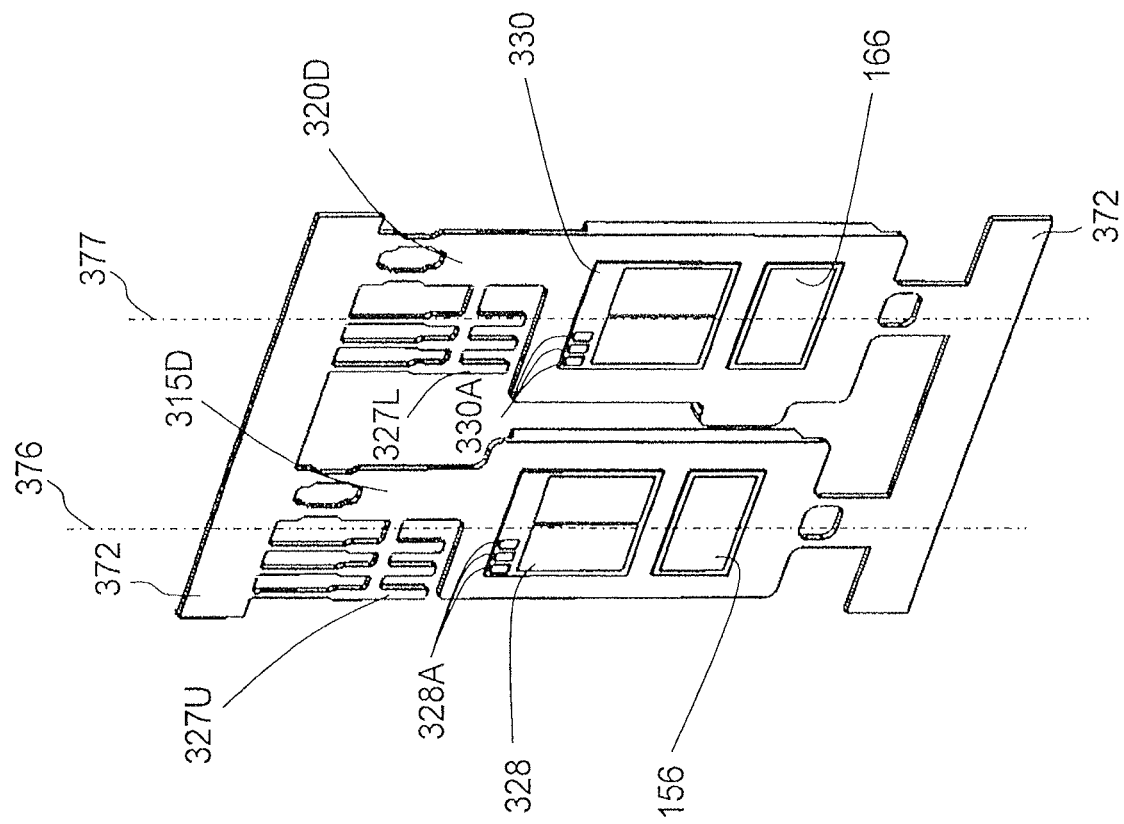
FIG. 23 is a view showing an arrangement relationship between control electrodes of the power semiconductor element and each of the terminals.

Next, the arrangement relationship between the control electrodes of the power semiconductor elements and each of the terminals in the module primary seal body 302 will be explained with reference to FIG. 23. FIG. 23 shows a state where the conductor plates 318 and 319 and the intermediate electrode 329 are removed from the configuration in FIG. 18 for better understanding. In FIG. 23, on one side of the IGBTs 328 and 330 (upper side of the figure), the control electrodes 328A and 330A are each arranged in a position shifted to the left in the figure with respect to central lines 376 and 377, respectively. The central lines 376 and 377 are perpendicular to the arrangement direction of the element-side DC positive connection terminal 315D, the element-side DC negative connection terminal 319D, the element-side AC connection terminal 320D, the element-side signal connection terminal 327U, and the element-side signal connection terminal 327L.

Dividing the IGBT 328 by the central line 376, the element-side signal connection terminal 327U is arranged on the half side in which the control electrode 328A is arranged and the element-side DC positive connection terminal 315D is arranged on the other half side. Similarly, dividing the IGBT 330 by the central line 377, the element-side signal connection terminal 327L is arranged on the half side in which the control electrode 330A is arranged and the element-side AC connection terminal 320D is arranged on the other half side. In addition, as shown in FIG. 18, the element-side DC negative connection terminal 319D is arranged between the element-side DC positive connection terminal 315D and the element-side signal connection terminal 327L. Such arrangement minimizes the length of the bonding wire 371, which connects the control electrodes 328A and 330A with the element-side signal connection terminals 327U and 327L, respectively, thereby improving the reliability in connection. In addition, collective arrangement of each of the terminals will achieve reduction in size of the module primary seal body 302 and thus the power module 300U.

It is to be noted that as shown in FIG. 23, the element-side DC positive connection terminal 315D, the element-side AC connection terminal 320D, the element-side signal connection terminal 327U, and the element-side signal connection terminal 327L are integrally processed in a state where they are tied to the common tie bar 372. This will significantly reduce variations in flatness and thickness among these terminals. On the other hand, since the element-side DC negative connection terminal 319D is combined with that having been processed separately from each of the above terminals, variations in flatness and thickness become greater than each of the other terminals, and thus unnecessary stress may occur at the connection section of the terminal and the power semiconductor elements when clamping.

Figure 24:
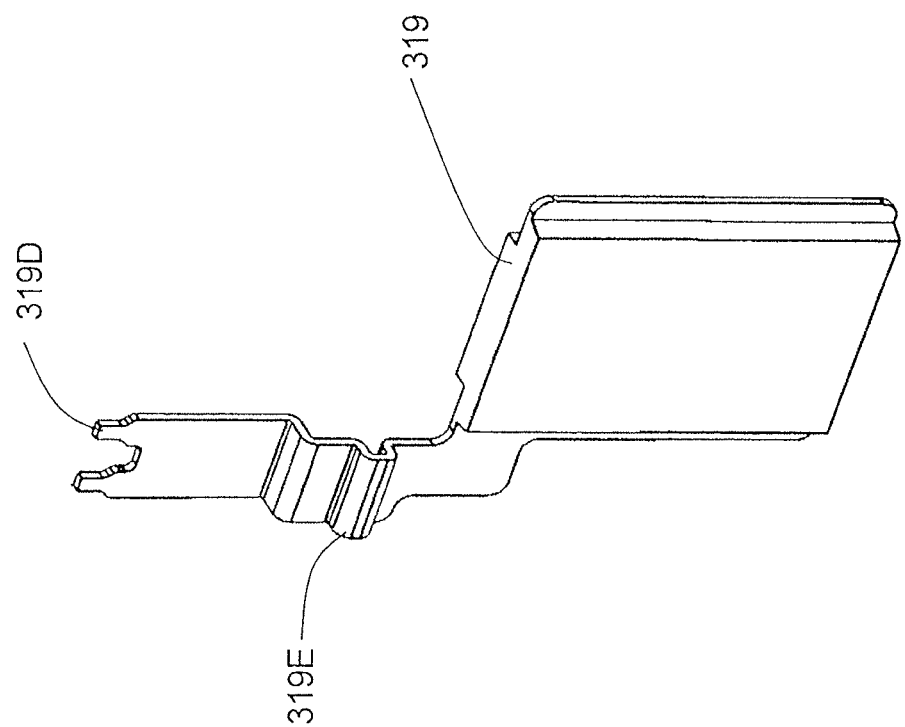
FIG. 24 is a view showing a variation which is provided with a stress relief section on a conductor plate of a DC negative wiring side.

FIG. 24 is a view showing a variation for avoiding the disadvantage described above. In this variation, a stress relief section 319E for absorbing and relieving the stress when clamping is provided on the conductor plate 319 on which the element-side DC negative connection terminal 319D is provided. The stress relief section 319E is preferred to be positioned between the area on which the power semiconductor elements are mounted (soldered area) and the mold pressing surface 373. It is to be noted that it may be conceived that the stress relief section 319E is prepared by simply making the conductor plate 319 partly thinner than other portions. In that case, however, the current density increases at the thin portion, which may reduce electrical performance. Hence, as shown in FIG. 24, it is preferred that a part of the conductor plate 319 is bent to provide the stress relief section 319E. This prevents the current density from increasing at the stress relief section 319E and the current flows in opposite directions at the turning portion, provided by bending, thereby also contributing to reduction of inductance.

Figure 25:
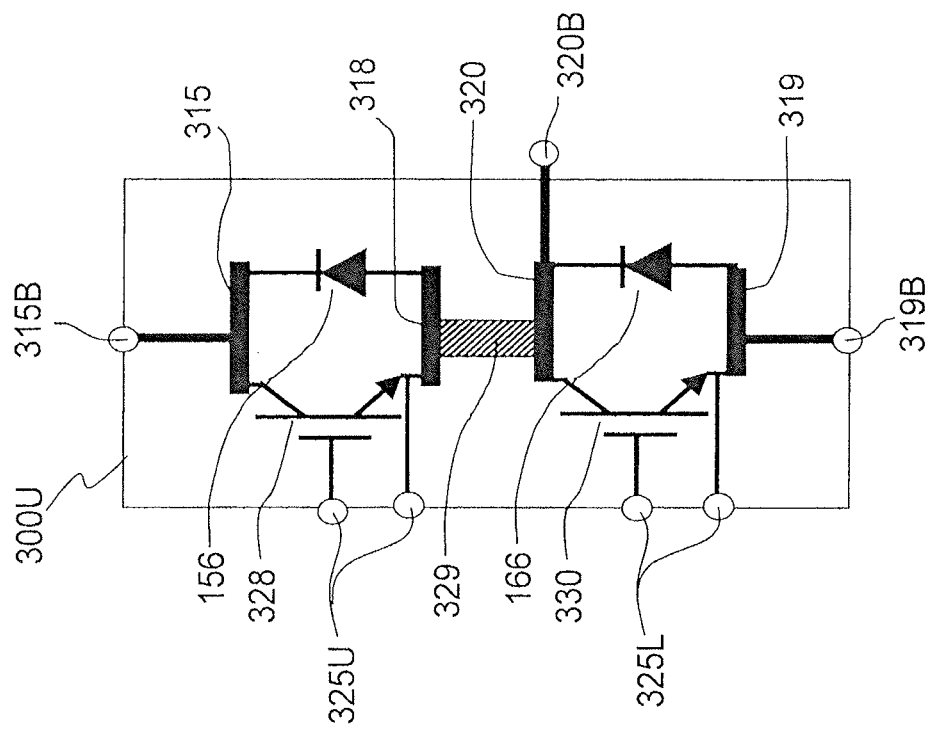
FIG. 25 is a diagram showing the internal circuit structure of the power module according to an embodiment of the present invention.
Figure 26:
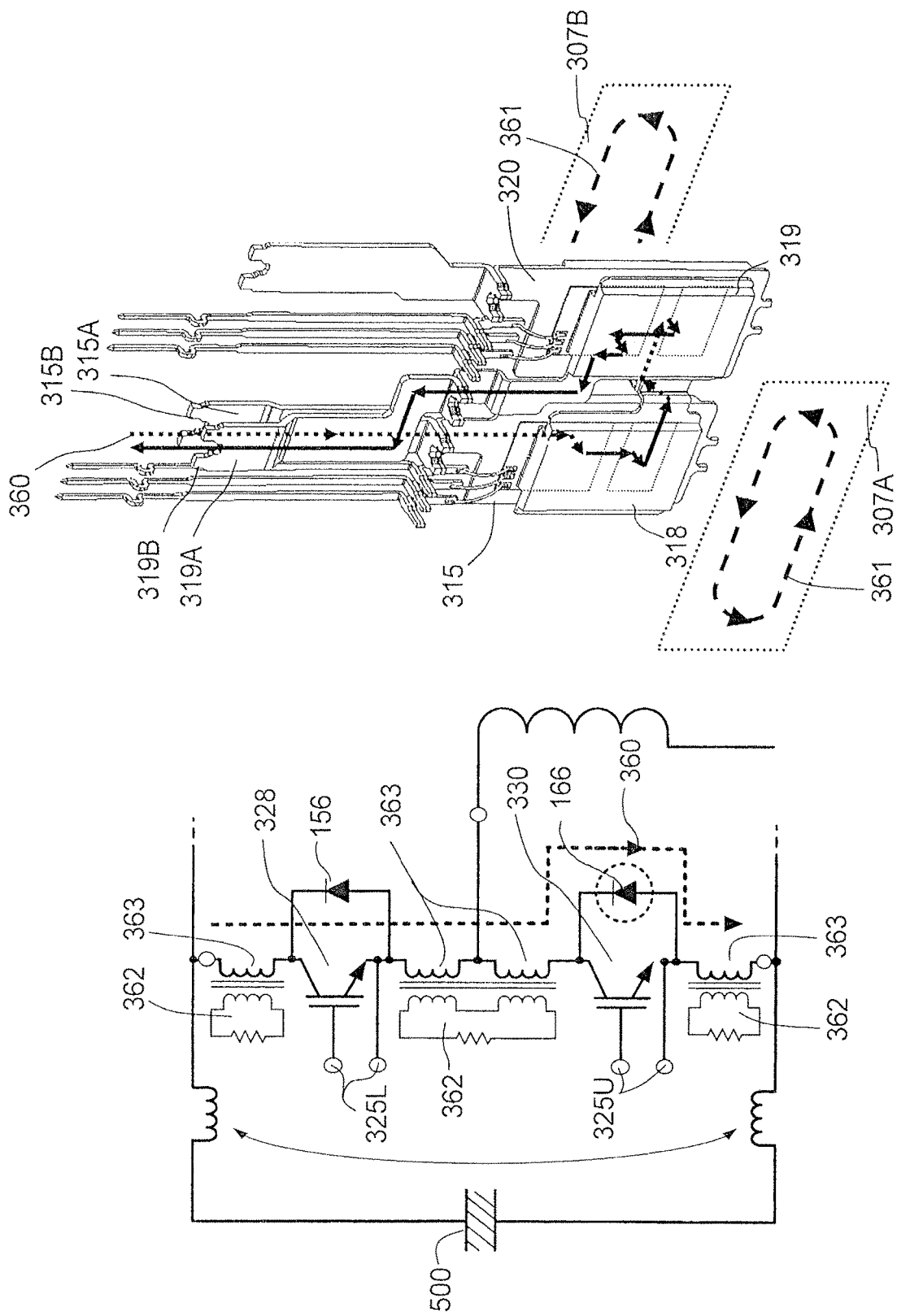
FIGS. 26A and 26B are figures for explaining reduction of inductance in the power module according to the embodiment of the present invention.

FIG. 25 is a circuit diagram showing the circuit configuration of the power module 300U. The collector electrode of the IGBT 328 of the upper arm side and the cathode electrode of the diode 156 of the upper arm side are connected through the conductor plate 315. Similarly, the collector electrode of the IGBT 330 of the lower arm side and the cathode electrode of the diode 166 of the lower arm side are connected through the conductor plate 320. In addition, the emitter electrode of the IGBT 328 of the upper arm side and the anode electrode of the diode 156 of the upper arm side are connected through the conductor plate 318. Similarly, the emitter electrode of the IGBT 330 of the lower arm side and the anode electrode of the diode 166 of the lower arm side are connected through the conductor plate 319. The conductor plates 318 and 320 are connected through the intermediate electrode 329. Such circuit configuration forms the upper and lower arm series circuit.

Next, an effect produced by the reduction of inductance will be explained with reference to FIGS. 26A and 26B. FIG. 26A is a diagram showing an equivalent circuit when a recovery current flows through and FIG. 26B is a view showing the recovery current path.

In FIG. 26A, the diode 166 of the lower arm side is assumed to be made conductive in a forward bias state. In this state, when the IGBT 328 of the upper arm side enters an ON state, the diode 166 of the lower arm side is reverse-biased and recovery current due to carrier mobility passes through the upper and lower arms. At this time, a recovery current 360 flows through each of the conductor plates 315, 318, 319, and 320 as shown in FIG. 26B. The recovery current 360 passes through the DC positive terminal 315B (157), which is arranged opposite to the DC negative terminal 319B (158), as indicated by the dotted line, then flows through a loop-shaped path formed by each of the conductor plates 315, 318, 319, and 320, and flows through the DC negative terminal 319B (158), which is arranged opposite to the DC positive terminal 315B (157), again as indicated by the solid line. The flow of current through the loop-shaped path causes an eddy current 361 to flow through the first heat dissipation surface 307A and the second heat dissipation surface 307B of the module case 304. The magnetic field canceling effect produced by an equivalent circuit 362 in the current path of the eddy current 361 reduces a wiring inductance 363 in the loop-shaped path.

It is to be noted that the inductance reduction effect increases as the current path of the recovery current 360 is closer to a loop shape. In the present embodiment, as indicated by dotted line, the loop-shaped current path goes through a path close to the DC positive terminal 315B (157) side of the conductor plate 315 and passes through the IGBT 328 and the diode 156. Then, as indicated by the solid line, the loop-shaped current path goes through a path farther than the DC positive terminal 315B (157) side of the conductor plate 318, and then, as indicated by the dotted line, goes through a path farther than the DC positive terminal 315B (157) side of the conductor plate 320 and passes through the IGBT 330 and the diode 166. In addition, as indicated by the solid line, the loop-shaped current path goes through a path close to the DC negative wiring 319A side of the conductor plate 319. The loop-shaped current path thus goes through paths of a closer side or a farther side with respect to the DC positive terminal 315B (157) and the DC negative terminal 319B (158) so as to form a current path closer to a loop shape.

Figure 38:
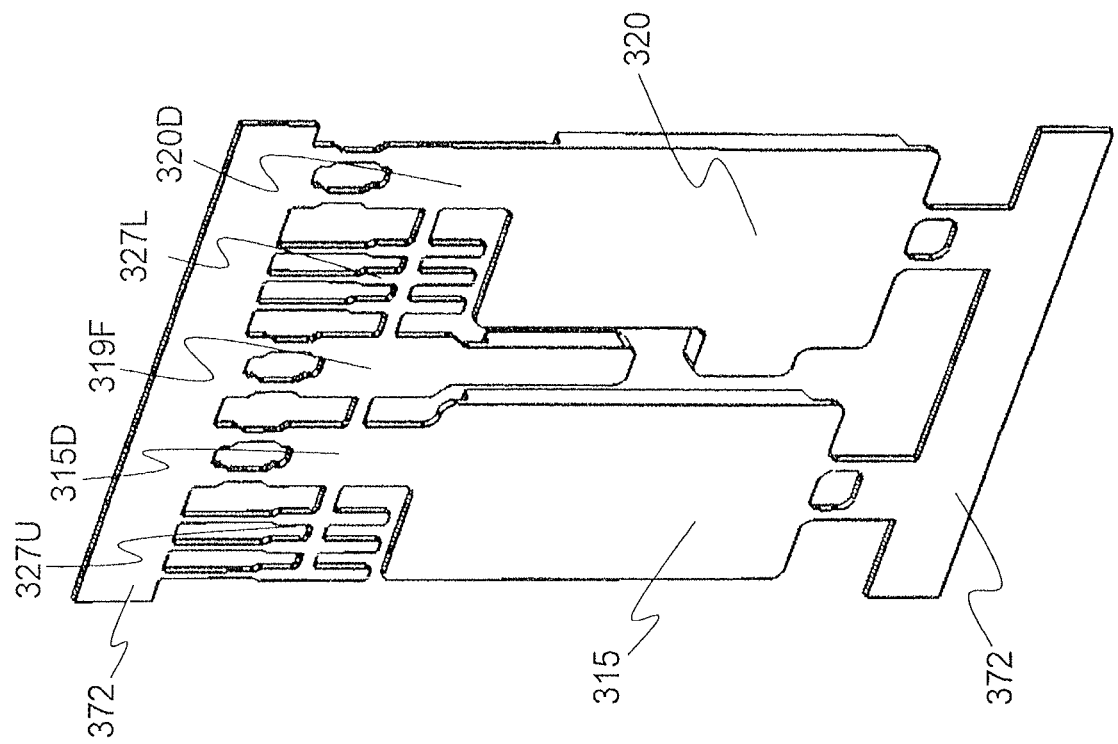
FIG. 38 is a view showing a variation with a divided DC negative wiring.

FIG. 38 is a view showing a variation with a divided DC negative wiring. It is to be noted that structures denoted by the same reference numeral as that described earlier have the same function. Since the element-side DC negative connection terminal 319D shown in FIG. 18 is combined with that having been processed separately from each of the above terminals, variations in flatness and thickness become greater than each of the other terminals, and thus unnecessary stress may occur at the connection section of the terminal and the power semiconductor elements when clamping.

Then, as shown in FIG. 38, the element-side DC negative connection terminal 319D shown in FIG. 18 is divided so that a negative electrode-side connection terminal 319F is arranged on substantially the same plane as the element-side AC connection terminal 320D and the element-side DC positive connection terminal 315D.

Figure 39:
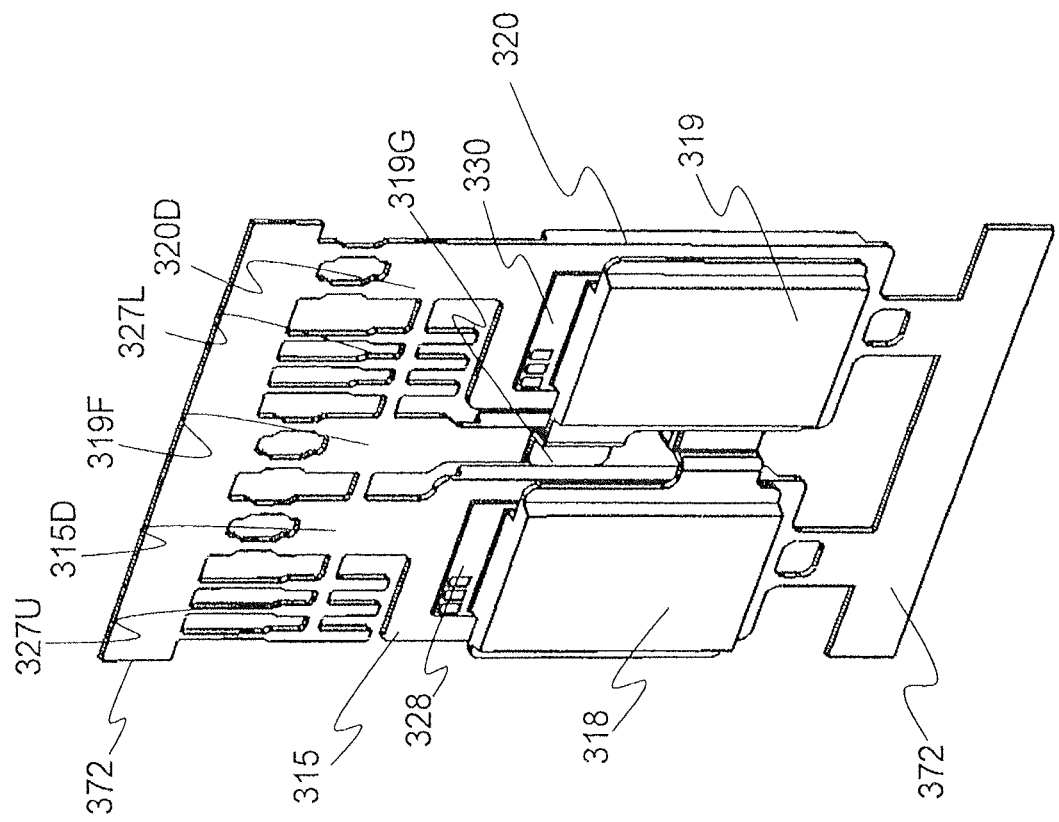
FIG. 39 is a diagram for explaining an assembly process of the module primary seal body according to a variation.

In addition, as shown in FIG. 39, an element-side DC negative connection terminal 319G extends from an edge of the conductor 319 to a position opposite to a part of the negative electrode-side connection terminal 319F. Then, the end of the element-side DC negative connection terminal 319G is bent towards the negative electrode-side connection terminal 319F side.

Figure 40:
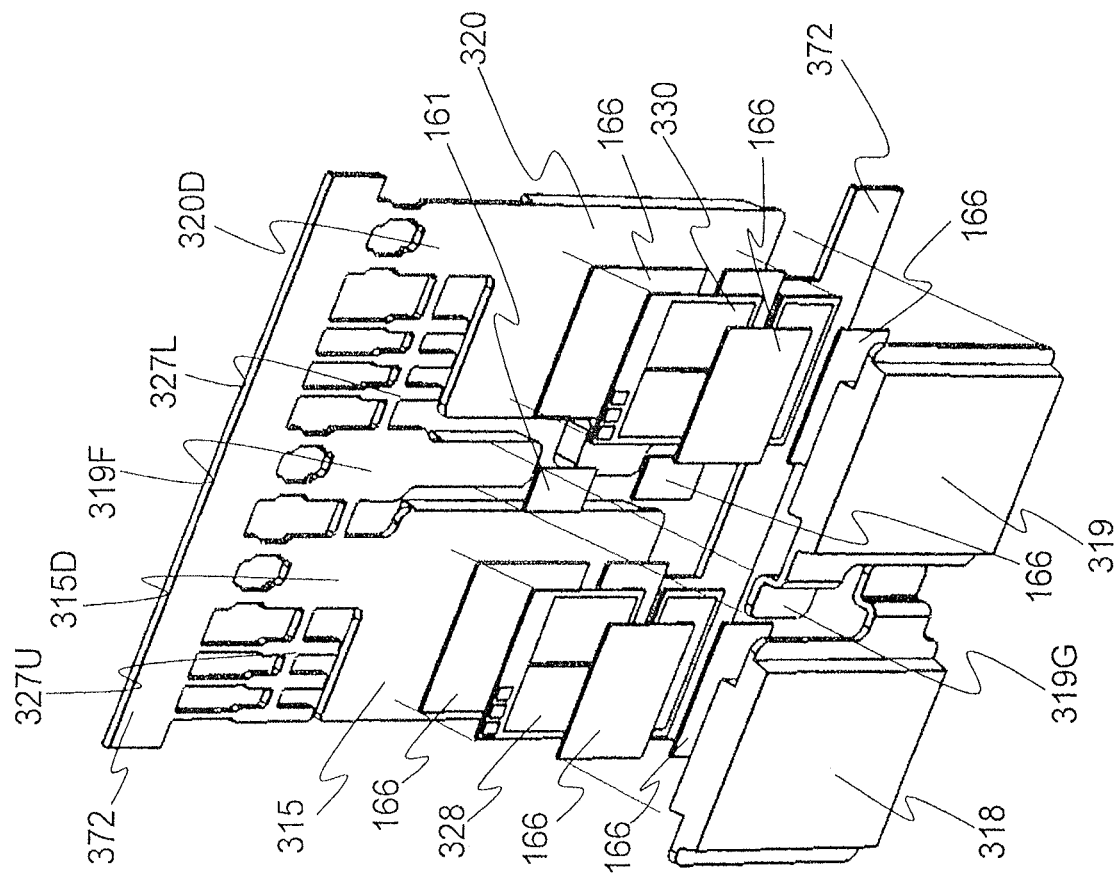
FIG. 40 is a diagram for explaining an assembly process of the module primary seal body according to a variation.
Figure 41:
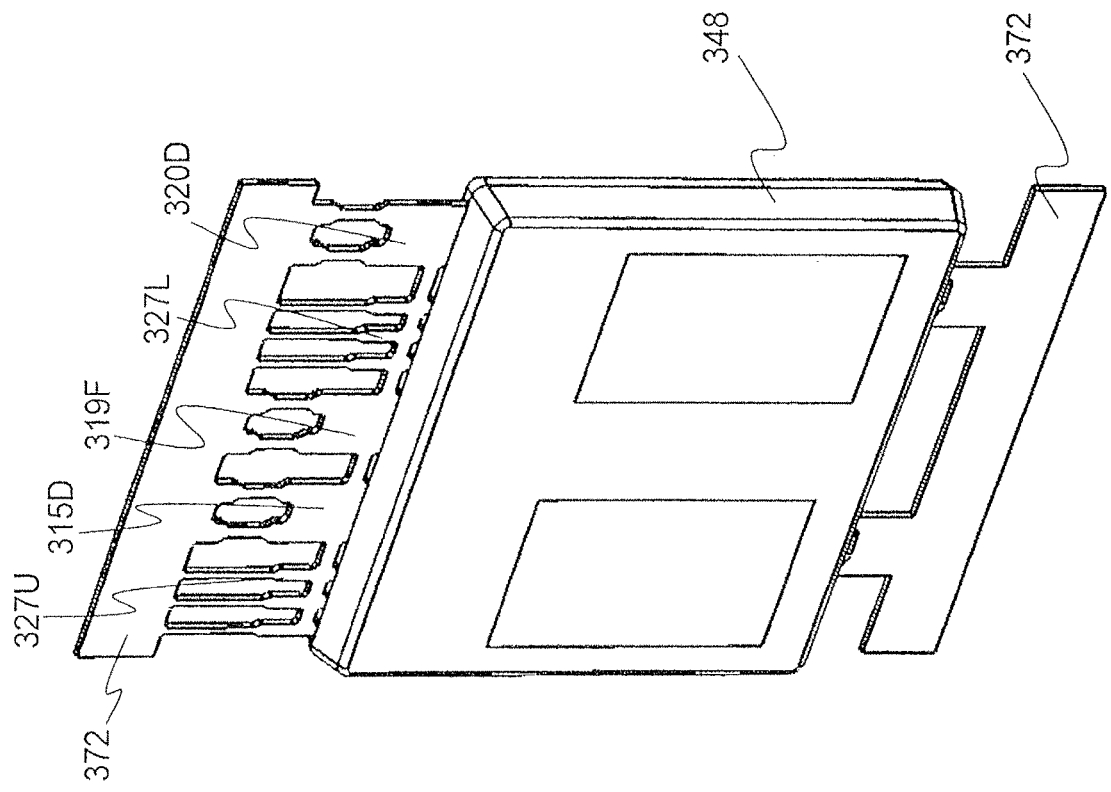
FIG. 41 is a diagram for explaining an assembly process of the module primary seal body according to a variation.

Then, as shown in FIG. 40, the end of the element-side DC negative connection terminal 319G is connected with the negative electrode-side connection terminal 319F through a metal bonding material 161. After the variety of semiconductor elements and terminals are bonded with the metal bonding material, the module body shown in FIG. 40 is sealed with the first sealing resin 348 according to the production method shown in FIGS. 22A and 22B, and thus a module primary seal body is completed as shown in FIG. 41. As shown in FIG. 41, the negative electrode-side connection terminal 319F is formed integrally with the tie bar 372 together with the element-side DC positive connection terminal 315D, the element-side AC connection terminal 320D, and the element-side signal connection terminal 327U. It is then possible to cut the tie bar 372 collectively with the connection section with the negative electrode-side connection terminal 319F.

This will significantly reduce variations in flatness and thickness among these terminals.

Figure 27:
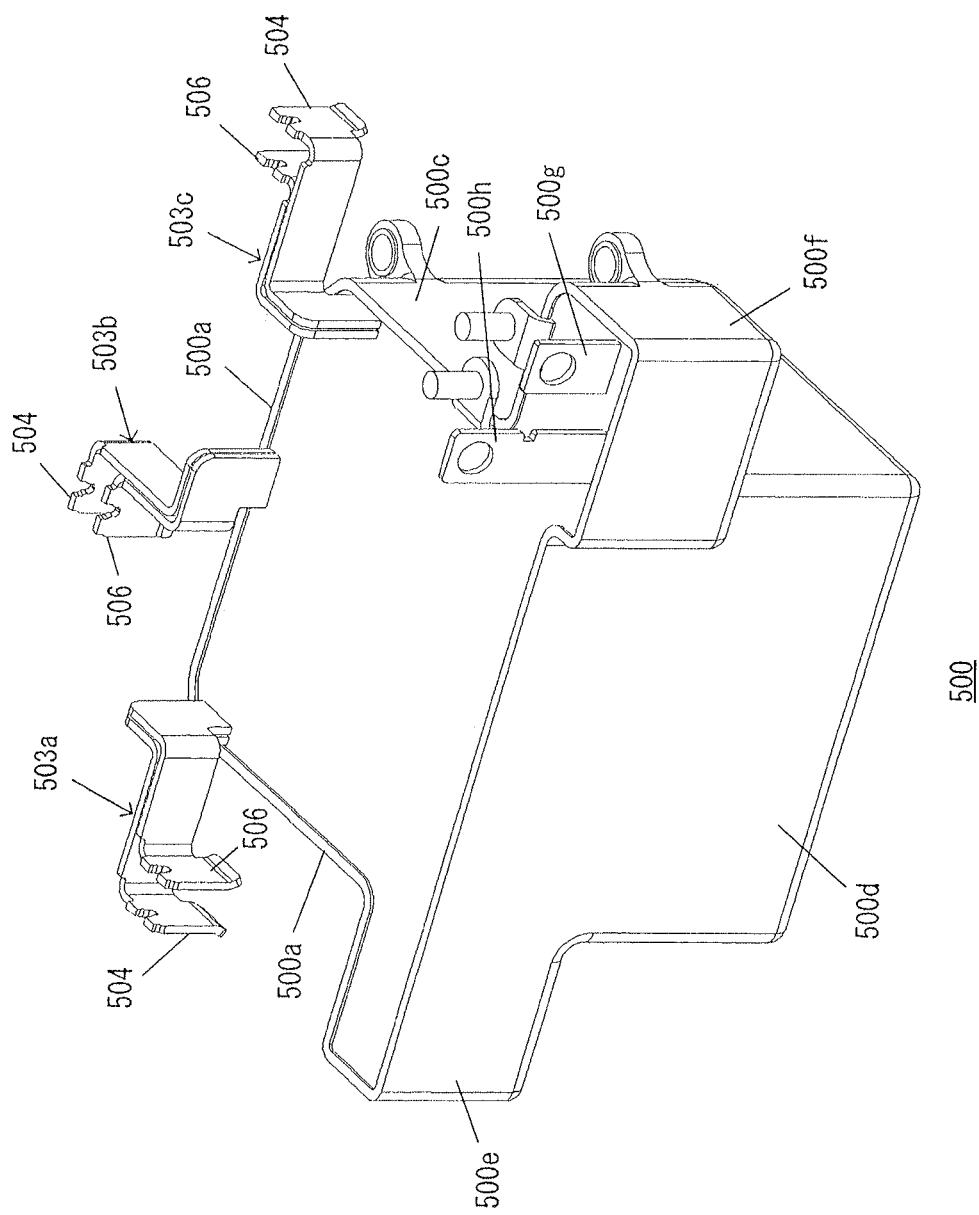
FIG. 27 is an external perspective view of the capacitor module 500.

FIG. 27 is an external perspective view of the capacitor module 500. A plurality of capacitor cells are provided in the capacitor module 500. On the upper surface of the capacitor module 500, capacitor terminals 503a to 503c are provided in a protruding manner adjacent to the opposite surface to the flow path 19 of the capacitor module 500. The capacitor terminals 503a to 503c are formed corresponding to the positive terminal 157 and the negative terminal 158 of each of the power modules 300. The capacitor terminals 503a to 503c are provided in the same shape and an insulation sheet is provided between the negative electrode-side capacitor terminal 504 and the positive electrode-side capacitor terminal 506, which constitute the capacitor terminals 503a to 503c, thereby ensuring insulation between the terminals.

Protruding portions 500e and 500f are formed above a lateral surface 500d side of the capacitor module 500. A discharge resistor is mounted in the protruding portion 500e and a Y capacitor for protecting against common-mode noise is mounted in the protruding portion 500f. In addition, the power supply terminal 508 and 509 shown in FIG. 5 are mounted to terminals 500g and 500h protruding from the upper surface of the protruding portion 500f. As shown in FIG. 10, recesses 405a and 405b are formed between the openings 402b and 402c and the lateral surface 12d, so that, when the capacitor module 500 is housed in the housing space 405 of the flow path former 12, the protruding portion 500e is housed in the recess 405a and the protruding portion 500f is housed in the recess 405b.

The discharge resistor mounted in the protruding portion 500e is a resistor for discharging electric charge accumulated at the capacitor cells in the capacitor module 500 when the inverter is stopped. The recess 405a in which the protruding portion 500e is housed is provided directly above the flow path of cooling water flowing in from the inlet pipe 13, thereby inhibiting rise in temperature at the discharge resistor when discharging.

Figure 28:
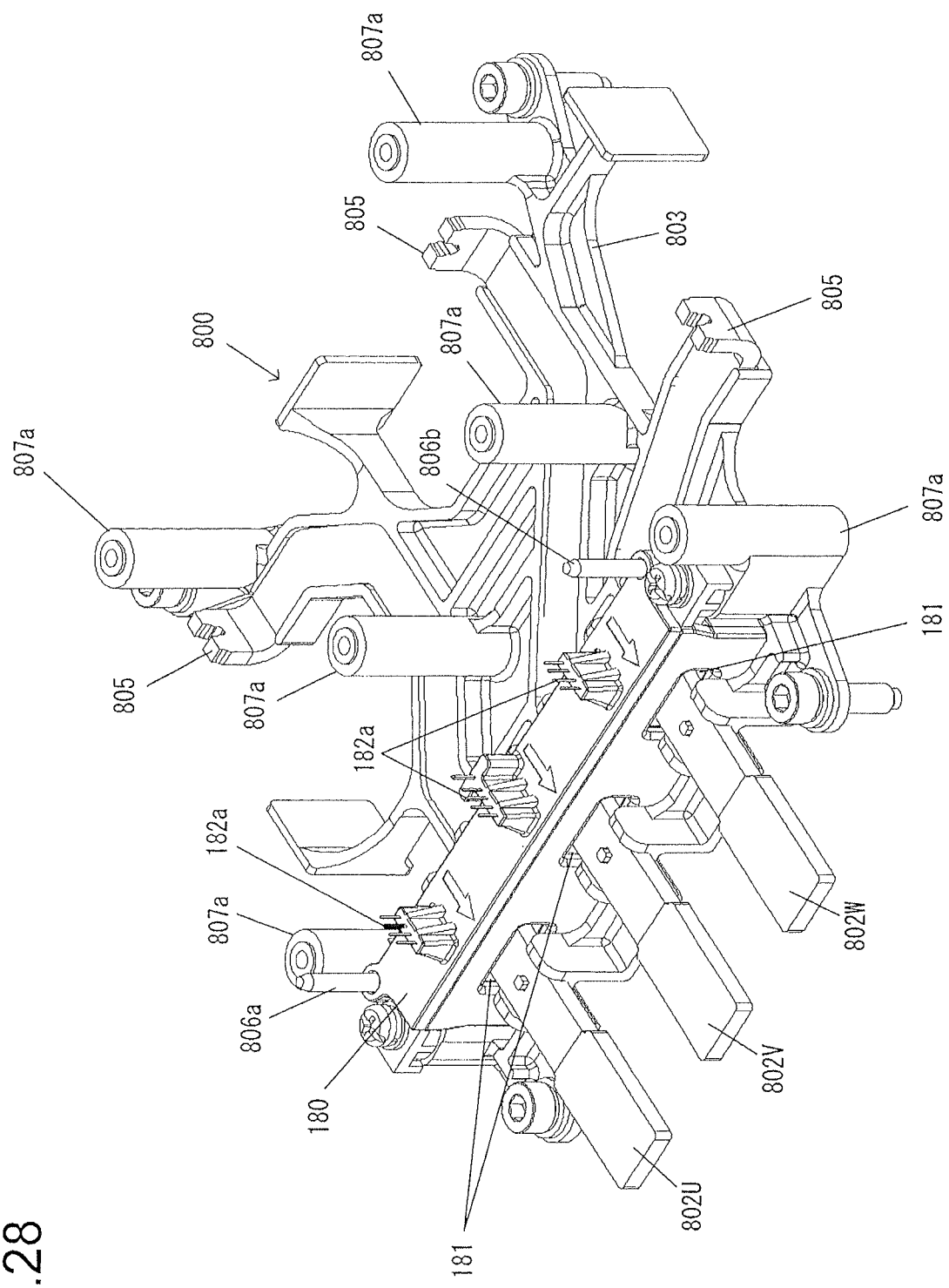
FIG. 28 is a perspective view of the bus bar assembly 800.

FIG. 28 is a perspective view of the bus bar assembly 800. The bus bar assembly 800 includes the AC bus bars 802U, 802V, and 802W of the U, V, and W phases, a holding member 803 for holding and fixing the AC bus bars 802U to 802W, and the current sensor module 180 for detecting AC current flowing through the AC bus bars 802U to 802W. The AC bus bars 802U to 802W are each formed of a wide conductor. On the holding member 803, formed of insulation material such as resin, the plurality of supporting members 807a for holding the driver circuit board 22 are formed in a protruding manner upward from the holding member 803.

The current sensor module 180 is arranged on the bus bar assembly 800 so that the current sensor module 180 is in parallel to the lateral surface 12d at a position adjacent to the lateral surface 12d of the flow path former 12 when the bus bar assembly 800 is fixed on the flow path former 12 as shown in FIG. 8 described earlier. As shown in FIG. 28, through holes 181 through which the AC bus bars 802U to 802W pass are formed on a lateral surface of the current sensor module 180. Sensor elements are provided in portions where the through holes 181 of the current sensor module 180 are formed, and signal lines 182a of each of the sensor elements protrude from the upper surface of the current sensor module 180. Each of the sensor elements are aligned in the extending direction of the current sensor module 180, i.e., the extending direction of the lateral surface 12d of the flow path former 12. The AC bus bars 802U to 802W passes through the corresponding through hole 181 and their end portion protrude in parallel.

Protrusions 806a and 806b for positioning are formed on the holding member 803 in an upward protruding manner. The current sensor module 180 is screwed to the holding member 803, where the current sensor module 180 is positioned by engaging the protrusions 806a and 806b with positioning holes formed in the frame body of the current sensor module 180. In addition, when fixing the driver circuit board 22 to the supporting members 807a, the protrusions 806a and 806b for positioning are engaged into the positioning holes formed on the driver circuit board 22 side, so that the signal line 182a of the current sensor module 180 is positioned into the through hole of the driver circuit board 22. The signal line 182a is soldered to the wiring pattern of the driver circuit board 22.

In the present embodiment, the holding member 803, the supporting members 807a and the protrusions 806a and 806b are integrally provided with resin. Since the holding member 803 thus has a positioning function of the current sensor module 180 and the driver circuit board 22, assembling and soldering works between the signal line 182a and the driver circuit board 22 are made easy. In addition, a mechanism to hold the current sensor module 180 and the driver circuit board 22 is provided on the holding member 803, thereby reducing the number of components in the power conversion device as a whole.

The AC bus bars 802U to 802W are fixed to the holding member 803 so that their wide surfaces are leveled out and connection sections 805 to be connected to the AC terminals 159 of the power modules 300U to 300W are erected vertically. The connection sections 805 each have a protruding and recessed end, on which heat concentrates upon welding.

Since the current sensor module 180 is arranged in parallel to the lateral surface 12d of the flow path former 12 as described above, each of the AC bus bars 802U to 802W protruding from the through hole 181 of the current sensor module 180 is to be arranged on the lateral surface 12d of the flow path former 12. Since each of the power modules 300U to 300W is arranged on the flow path section 19a, 19b, and 19c formed along the lateral surfaces 12a, 12b, and 12c of the flow path former 12, the connection sections 805 of the AC bus bars 802U to 802W are arranged at positions corresponding to the lateral surface 12a to 12c of the bus bar assembly 800. As a result, as shown in FIG. 8, the U phase AC bus bar 802U extends from the power module 300U arranged in the vicinity of the lateral surface 12b to the lateral surface 12d, the V phase AC bus bar 802V extends from the power module 300V arranged in the vicinity of the lateral surface 12a to the lateral surface 12d, and the W phase AC bus bar 802W extends from the power module 300W arranged in the vicinity of the lateral surface 12c to the lateral surface 12d.

Figure 29:
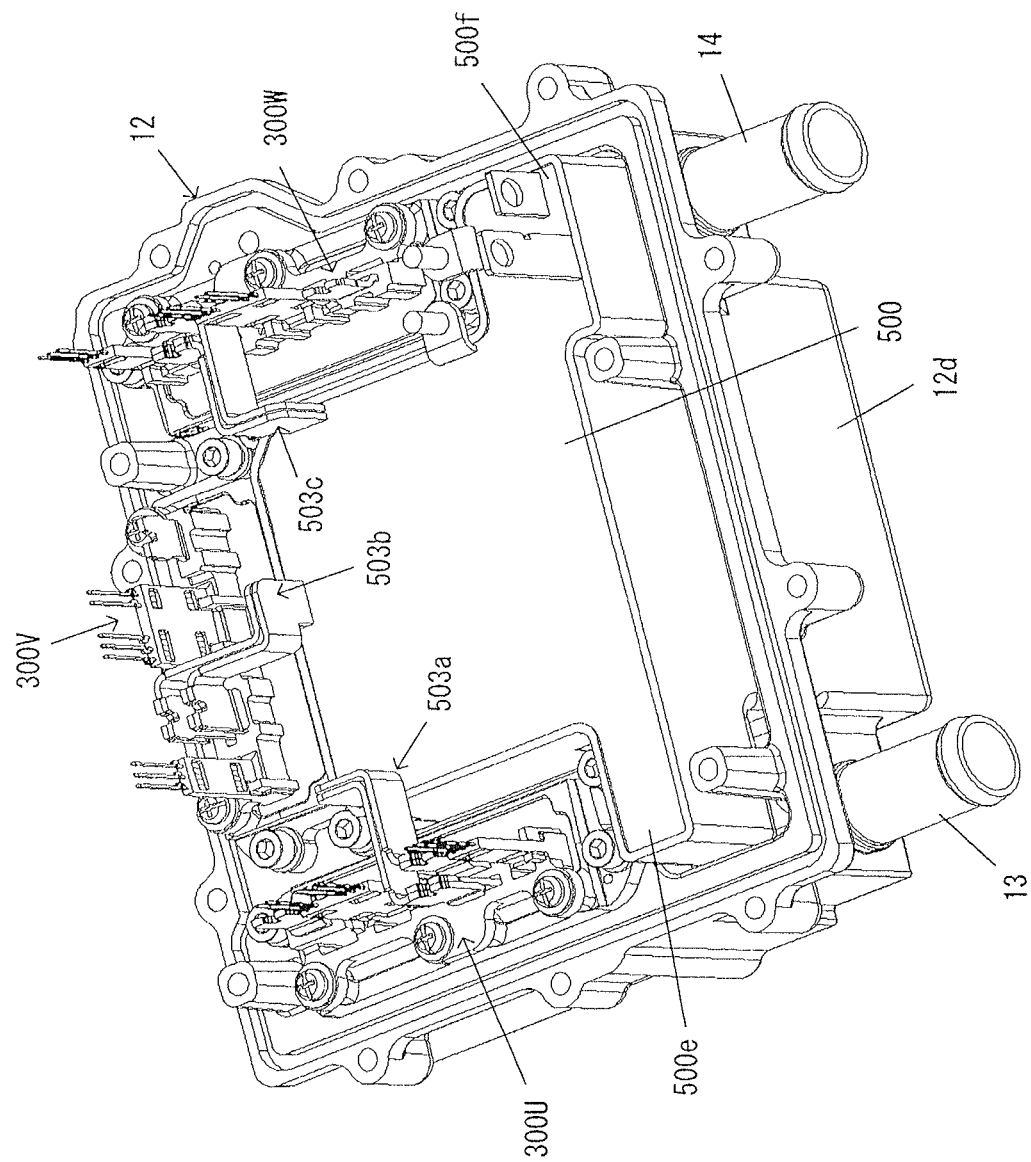
FIG. 29 is a view showing the flow path former 12 on which the power modules 300U to 300W and the capacitor module 500 are mounted.

FIG. 29 is a view showing the flow path former 12 in which the power modules 300U to 300W are fixed in the openings 402a to 402c and the capacitor module 500 is housed the housing space 405. In the example shown in FIG. 29, the power module 300U of the U phase is fixed in the opening 402b, the power module 300V of the V phase is fixed in the opening 402a, and the power module 300W of the W phase is fixed in the opening 402c. After that, the capacitor module 500 is housed in the housing space 405 and the terminal on the capacitor side and the terminal of each of the power modules are connected by welding or the like. Each of the terminals protrudes from the upper end surface of the flow path former 12, and welding work is carried out by bringing the welding machine from above.

It is to be noted that the positive and negative terminals 157 and 158 of each of the power modules 300U to 300W provided in a U shape are connected with the capacitor terminals 503a to 503c provided in a protruding manner on the upper surface of the capacitor module 500. Since the three power modules 300U to 300W are provided to surround the capacitor module 500, the positional relationship of each of the power modules 300U to 300W with respect to the capacitor module 500 becomes equivalent, each of the power modules 300U to 300W will thus be connected to the capacitor module 500 in a well-balanced manner using the capacitor terminals 503a to 503c having the same shape. Due to this, the circuit constant of the capacitor module 500 and the power modules 300U to 300W becomes easily balanced in each of the three phases, thereby achieving a configuration in which current is easily input and output.

Figure 30:
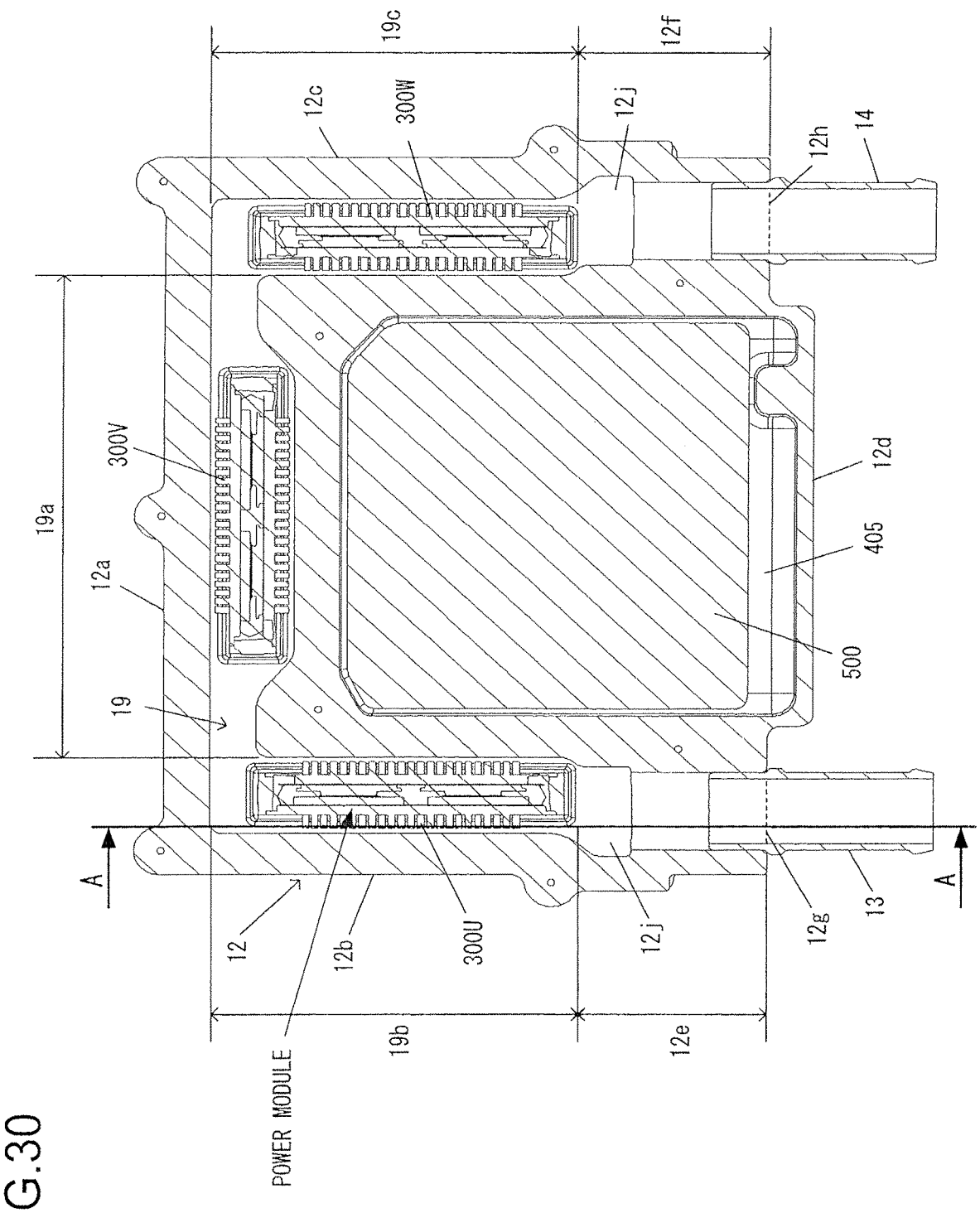
FIG. 30 is a horizontal sectional view of the flow path former 12.

FIG. 30 is a horizontal sectional view of the flow path former 12 in which the power modules 300U to 300W and the capacitor module 500 are arranged as shown in FIG. 29. As described above, the U shaped flow path 19 is formed in the flow path former 12, and the U phase power module 300U is arranged at the flow path section 19b formed along the lateral surface 12b on the left side of the figure. Similarly, the V phase power module 300V is arranged at the flow path section 19a formed along the lateral surface 12a on the opposite side of the lateral surface 12d on which the pipes 13 and 14 are provided, and the W phase power module 300W is arranged at the flow path section 19c formed along the lateral surface 12 on the right side.

Openings 12g and 12h are formed on the lateral surface 12d of the flow path former 12. The opening 12g communicates with the flow path section 19b through a communication path 12e. The opening 12h communicates with the flow path section 19c through a communication path 12f. The pipes 13 and 14 arranged in the openings 12g and 12h are mounted to the communication paths 12e and 12f in a press fitting manner.

Figure 37:
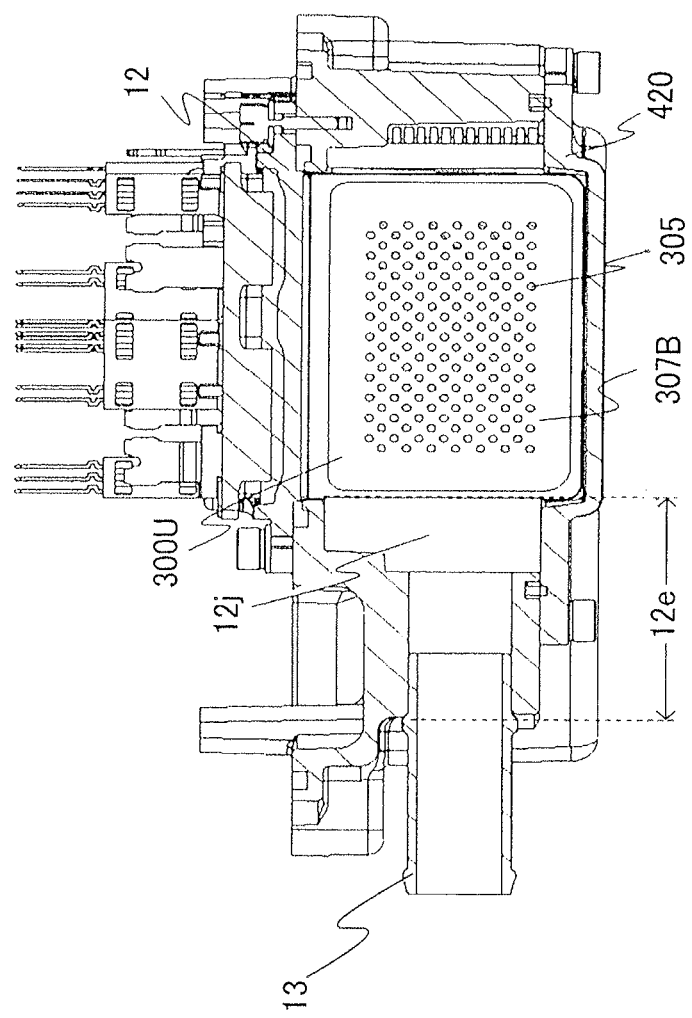
FIG. 37 is a sectional view of the flow path former 12 according to the present embodiment.

FIG. 37 shows a sectional view of the flow path former 12 seen from the arrow direction of the A-A cross section of FIG. 30. It is to be noted that FIG. 37 shows a state in which the A-A cross section is horizontally inverted. The communication path 12e significantly changes in the shape of the flow path cross section along the flow direction of cooling water. In addition, the flow of cooling water of the present embodiment is bifurcated by the lateral surface of the power module 300U, so that one of the bifurcated flows heads for the first heat dissipation surface 307A side of the module case 304 and the other heads for the second heat dissipation surface 307B side of the module case 304. It is to be noted that the first heat dissipation surface 307A, not illustrated in FIG. 37, is a heat dissipation surface on the other side of the second heat dissipation surface 307B shown in FIG. 37. Therefore, hit of the flow of cooling water of the present embodiment against the lateral surface of the power module 300U tends to increase pressure loss for causing the cooling water to flow. In order to inhibit such increase in the pressure loss, it is necessary to regulate the flow of cooling water in the vicinity of the lateral surface portion of the power module 300U. Thus, an entrance section 12j is formed in the direction from the inlet pipe 13 side towards the power module 300U with its width in the height direction increasing in a stepwise manner. It is to be noted that the entrance section 12j may not be provided in the stepwise manner as in FIG. 37 but may be provided in a smooth slope-like shape.

In the present embodiment, the U shaped flow path 19 is formed along the three lateral surfaces 12a to 12c of the flow path former 12 having a substantially square planar shape and the power modules 300U to 300W are arranged at the flow path sections 19a to 19c so that the power modules 300U to 300W, each of which has a flat shape, are in parallel with the lateral surfaces 12a to 12c. Then, the capacitor module 500, which is an electric component, is housed in the center space (the housing space 405) surrounded by the flow path 19. Such module arrangement allows the flow path former 12, in which the power modules 300U to 300W and the capacitor module 500 are housed, to be reduced in size.

It is to be noted that, when the three power modules 300U to 300W are arranged into a U shape, as shown in FIG. 30, at least a part of the power module 300V to be arranged between the pair of power modules 300U and 300W arranged in parallel is arranged to fit into a space sandwiched by the power modules 300U and 300W, thereby further reducing the size.

Figure 31:
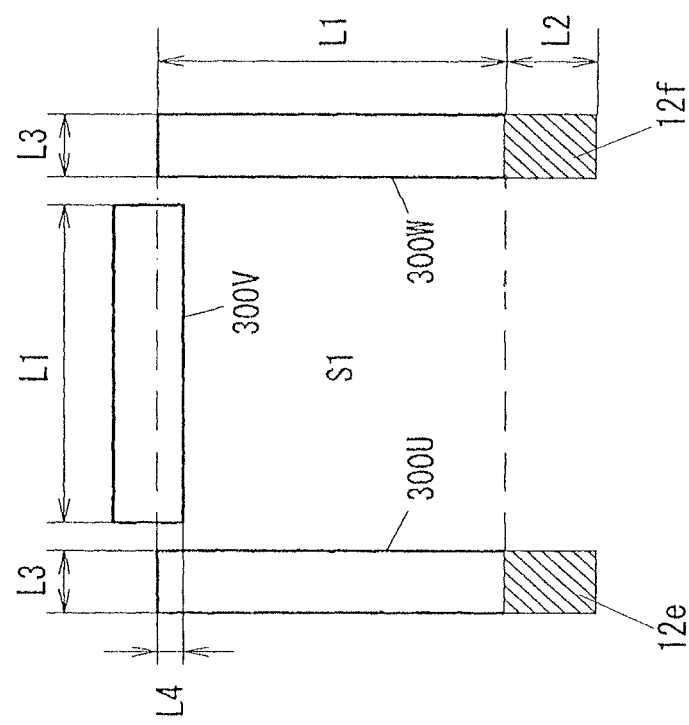
FIG. 31 is a schematic view for explaining the arrangement of the power modules 300U to 300W.

FIG. 31 is a schematic view for explaining the arrangement of the three power modules 300U to 300W. It is to be noted that the power modules 300U to 300W have the same configuration and the same shape. The width of the lateral surfaces 12b and 12c of the flow path former needs to be at least around the sum of a length L1 along the flow path of the power modules 300U to 300W and a length L2 of the communication path. On the other hand, the lateral surface 12a requires at least around the length L1. It is naturally conceivable that in practice, as shown in FIG. 30, the dimension needs to be slightly adjusted in view of the flow of cooling water e.g., the connection section of the flow path section.

For this reason, in order to minimize the footprint of the power conversion device 20, the shape seen with a planar view (planar shape) is provided in a substantially square so as to reduce the power conversion device 200 in size. Since the communication path is necessary with respect to the direction along the lateral surfaces 12b and 12c as described above, from a point of view of reduction in size it is preferred to arrange the power module 300V so that a part of the power module 300V is included in a space S1 between the pair of the power modules 300U and 300W as shown in FIG. 31.

The lateral dimension (the width dimension of the lateral surface 12a) of the arrangement space in FIG. 31 is at least around L1+2·L3 where the thickness of the power module is denoted by L3. Then, L3 and L4 are set so that the longitudinal dimension L1+L2+(L3−L4) is comparable to L1+2·L3, thereby reducing the area in the planar view and making it substantially square. At this time, the flow path section 19a is formed so as to pass through the space between the power modules 300U and 300W as shown in FIG. 30. It is to be noted that in the example shown in FIG. 30, due to limitation in the dimensions of the capacitor module 500, the interval between the power modules 300U and 300W is slightly larger than the length L1 of the power module 300V.

The space above the pipes 13 and 14 and the hole 12e and the hole 12f through which the pipes 13 and 14 are to be press-fitted will be an empty space. Then, the recesses 405a and 405b are formed in this space as shown in FIG. 10 and the protruding portion 500e, which is a discharge resistor mounting portion of the capacitor module 500, and the protruding portion 500f, which is a Y capacitor mounting portion, are arranged as shown in FIG. 29 so that the empty space is effectively utilized, thereby contributing to reduction in size of the power conversion device 200. The pipes 13 and 14 are collectively positioned on the single lateral surface 12d so that the flow of cooling water is straighten from the inlet pipe 13 to the flow path section 19b and from the flow path section 19c to the outlet pipe 14, thereby reducing pressure loss significantly. In addition, an increase in installation space of the device due to the protrusion of the pipes will be prevented, thereby improving the in-vehicle mountability. In addition, the pipes 13 and 14 are press-fitted to the holes 12e and 12f only on one surface of the housing, thereby improving the workability and productivity.

In addition, the flow path 19 is provided to surround the three sides of the capacitor module 500, thereby cooling the capacitor module 500 effectively. Incidentally, since the power conversion device 200 of the present embodiment is to be mounted on a vehicle, it is often arranged in an engine bay in general. Since inside the engine bay becomes relatively high in temperature due to heat from the engine, the travel motor, and the like, heat penetration from the surrounding to the power conversion device 200 becomes an issue. However, as shown in FIG. 30, the capacitor module 500 is surrounded on its three sides by the flow path 19 through which the cooling water flows, thereby effectively blocking the heat penetration from the surrounding of the device.

After the power modules 300U to 300W and the capacitor module 500 are arranged in the flow path former 12 as shown in FIG. 29, the bus bar assembly 800 is fixed above the capacitor module 500 as shown in FIG. 8 and welding work of the terminals is carried out. In the present embodiment, the bus bars 802U to 802W connected to the terminals of the power modules 300U to 300W arranged in a U shape are wired above the capacitor module 500 away from each of the connection sections and drawn from the lateral surface 12d side of the flow path former 12. As a result, without spanning over the power module and with ensuring sufficient insulation properties, the bus bars 802U to 802W will be collectively arranged in one position, i.e., the space of the opening 10a of the housing 10 to which the AC interface 185 is mounted (refer to FIG. 5).

Such bus bar configuration will keep the power modules 300U to 300W away from the AC connector section where heat is generated and temperature is likely to rise, thereby inhibiting the heat from being transmitted to the power modules 300U to 300W through the bus bars 802U to 802W. In addition, the bus bars 802U to 802W are arranged other than above the flow path 19, thereby reducing the possibility of electrical leakage caused by water leak even if the water leaks from the flow path 19.

In addition, the bus bar assembly 800 is configured to be fixed to the flow path former 12 through which cooling water flows, thereby not only inhibiting the rise in temperature of the bus bar assembly 800 but also inhibiting the rise in temperature of the current sensor 180 held in the bus bar assembly 800. The sensor element provided in the current sensor 180 has a heat-sensitive feature and thus the above configuration will improve the reliability of the current sensor 180.

After the terminals are welded by fixing the bus bar assembly 800 to the flow path former 12 as shown in FIG. 8, the driver circuit board 22 is fixed to the supporting members 807a, formed on the holding member 803 of the bus bar assembly 800, as shown in FIG. 6. The vehicle-mounted power conversion device 200 is susceptible to an effect of vibrations from the vehicle. Hence, the plurality of supporting members 807a formed in the holding member 803 are configured to support the driver circuit board 22 not only in the periphery thereof but also in the vicinity of the center, thereby reducing the effect of vibrations applied to the driver circuit board 22.

For instance, the supporting members 807a supports the driver circuit board 22 in the center so that the resonance frequency of the driver circuit board 22 will be made higher than the frequency of vibrations transmitted from the vehicle side, thereby reducing the effect of vibrations to the driver circuit board 22. It is to be noted that the driver circuit board 22 is screwed to the supporting members 807a.

After the driver circuit board 22 is fixed above the bus bar assembly 800, the housing 10 is bolted to the flow path former 12 as shown in FIG. 6 and the control circuit board 20 is fixed on the dividing wall 10c which sections between the upper housing space and the lower housing space of the housing 10. The driver circuit board 22 in the lower housing space and the control circuit board 20 in the upper housing space are connected through the flat cable as shown in FIG. 7. As described above, the dividing wall 10*c* is provided with the slit-like opening 10*d* for drawing the flat cable from the lower housing space to the upper housing space.

Since the power modules 300U to 300W are arranged in a U shape along the three lateral surfaces 12*b*, 12*a*, and 12*c* of the flow path former 12, control terminals from each of the power modules 300U to 300W to be connected to the driver circuit board 22 are also aligned in a U shape along the sides of the driver circuit board 22 corresponding to the lateral surfaces 12*b*, 12*a*, and 12*c* as shown in FIG. 6. A control signal for driving and controlling the power modules 300U to 300W is of high voltage. On the other hand, a sensor signal of the current sensor 180 and a signal by the flat cable are of low voltage. It is thus preferred that the wiring of the high-voltage system and the wiring of the low-voltage system are arranged away from each other in order to reduce the effect of noise of the high-voltage system against the low-voltage system.

In the present embodiment, since the power modules 300U to 300W are arranged in a U shape along the lateral surfaces 12*b*, 12*a*, and 12*c*, the space in the vicinity of the side corresponding to the lateral surface 12*d* on the driver circuit board 22 will be utilized as a space away from the control terminal. In the present embodiment, since the bus bars 802U to 802W, which are the targets of detection by the current sensor 180, are collectively arranged on the lateral surface 12*d* side, the current sensor 180 is arranged in parallel in the vicinity of the lateral surface 12*d*. Due to this, the signal terminal 182*a* is arranged in a space in the vicinity of the side corresponding to the lateral surface 12*d* on the driver circuit board 22 described above, and will be sufficiently kept away from the control terminal of the high-voltage system. It is to be noted that in the driver circuit board 22, the flat cable is arranged on the side of the driver circuit board 22 corresponding to the lateral surface 12*c* and connected on the board in the vicinity of the lateral surface 12*d* away from the control terminal so as to reduce the effect from the control terminal. This allows the pattern for low-voltage signals and the pattern for high-voltage signals to be separated easily on the driver circuit board 22.

In addition, the control circuit board 20 of the low-voltage system is arranged in the upper housing space separated by the dividing wall 10*c* and the flat cable is drawn from the lower housing space through the slit-like opening 10*d*, thereby reducing the effect of noise on the control circuit board 20. Thus, noise is sufficiently protected in the power conversion device 200 of the present embodiment.

In addition, the power conversion device 200 of the present embodiment has a configuration in which the capacitor module 500 and the power modules 300U to 300W are arranged on the flow path former 12 so that the work of fixing the necessary components such as the bus bar assembly 800 and the board can be carried out in order from the bottom, thereby improving the productivity and reliability.

Figure 32:
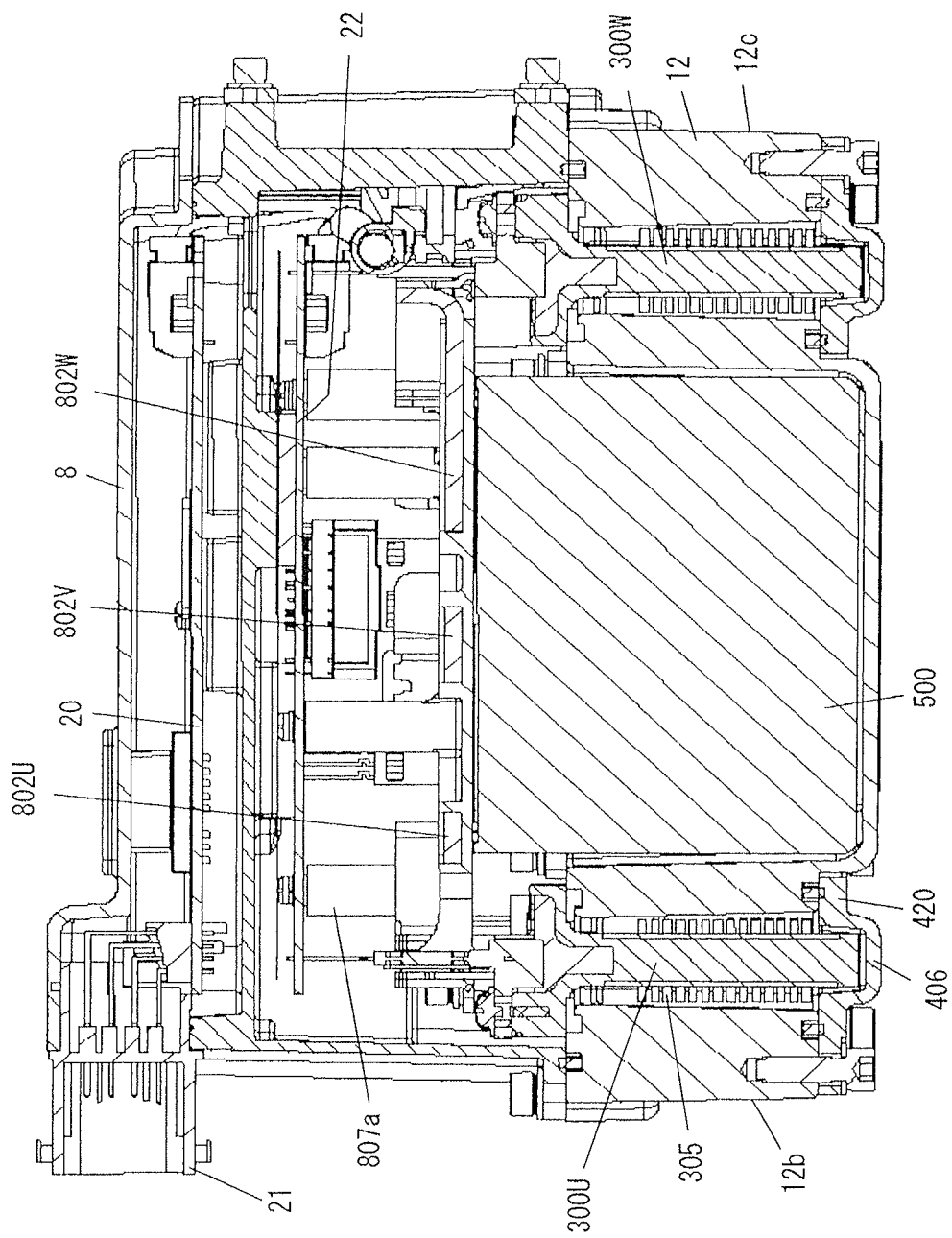
FIG. 32 is a view showing a cross section of the power conversion device 200.

FIG. 32 is a view showing a cross section of the power conversion device 200, the sectional view in which the power conversion device 200 is seen from the direction of the pipes 13 and 14. The openings 402*a* to 402*c*, formed on the flow path former 12, are covered with the flange 304*b*, provided in the module case 304 of the power modules 300U to 300W. It is to be noted that although not shown in the figure, a sealing material is provided between the flange 304*b* and the flow path former 12 so as to ensure air tightness. In the power modules 300U to 300W, a heat dissipation surface space in which the fins 305 for heat dissipation are provided is arranged in the flow path 19 and the lower end portion in which the fins 305 are not provided is housed inside an inner recess of the raised portion 406 formed on the lower cover 420. This will prevent cooling water from flowing into a space in which the fins 305 are not formed. In the power conversion device 200 of the present embodiment, since the capacitor module 500 which is relatively heavy in weight is arranged in the lower center of the power conversion device 200 as shown in FIG. 32, the power conversion device 200 has a good balance of the center of gravity, thereby keeping the power conversion device 200 from moving even if vibrations are applied.

Figure 33:
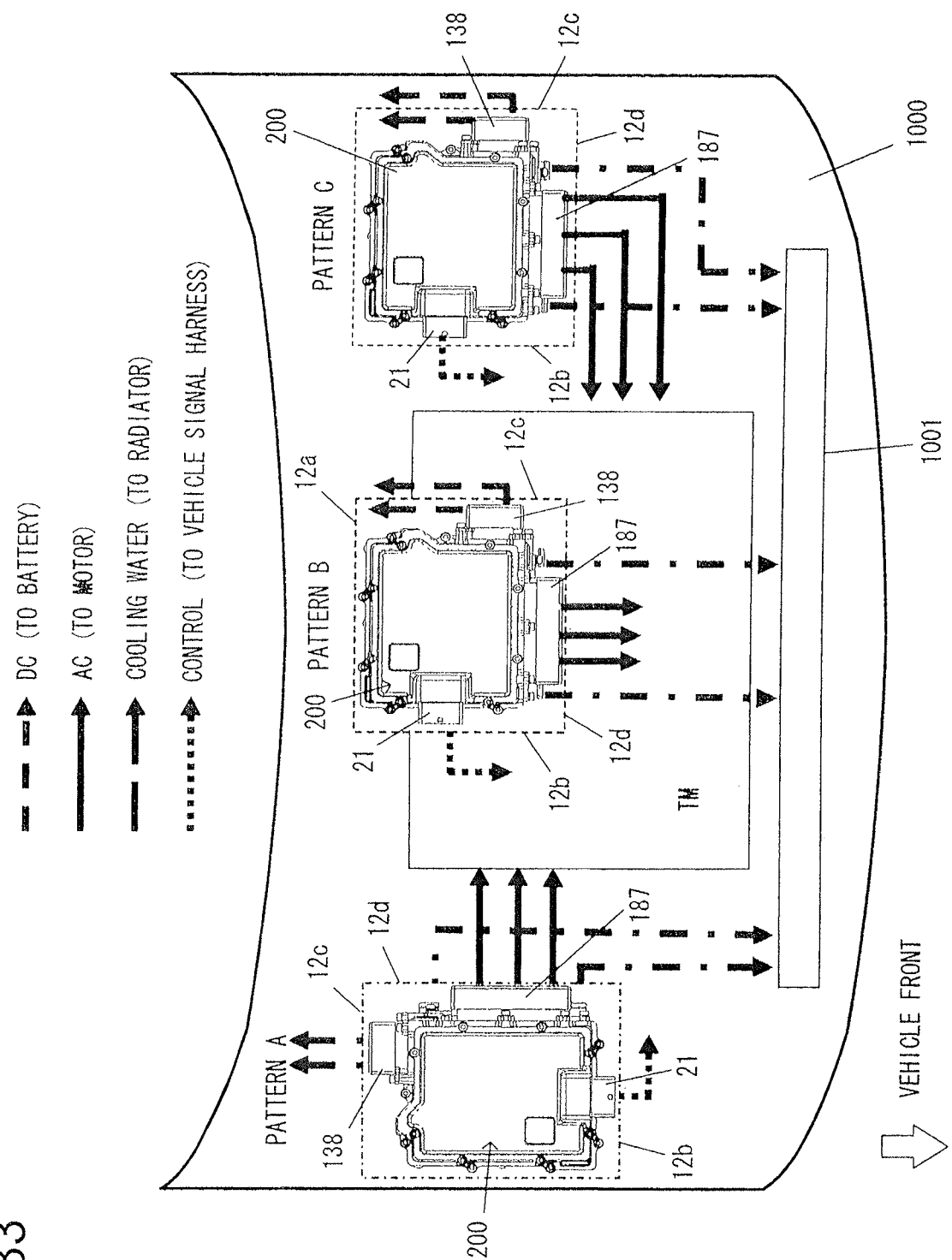
FIG. 33 is a view explaining a layout of the power conversion device 200 which is mounted on a vehicle.

FIG. 33 is a view explaining an arrangement of the power conversion device 200 of the present embodiment when mounted to a vehicle. FIG. 33 shows the arrangement in an engine bay 1000 in terms of three layout patterns A to C in the same figure. The lower side of the figure corresponds to the vehicle front, and a radiator 1001 is arranged on the front side of the engine bay 1000. The transmission TM with the built-in motor generator MG1 is arranged on the rear side of the radiator 1001. In addition, the connector 21 for signals is connected to a vehicle signal harness provided in the engine bay 1000. It is to be noted that while the battery 136 is not illustrated in FIG. 33, the battery 136 is heavy in weight and therefore it is arranged in the vicinity of the center of the vehicle, i.e., rearward of the vehicle from the engine bay 1000 in general.

Connection between the power conversion device 200 and the vehicle side is related to the arrangement of the pipes 13 and 14 relating to the cooling water, the AC connector 187 for supplying AC power to the motor generator MG1, and the connector 21 for communication to be connected to the higher-order control circuit provided on the vehicle side. In the present embodiment, the AC connector 187 and the pipes 13 and 14 are arranged on the lateral surface 12*d* side of the flow path former 12, the connector 21 for signals is arranged on the lateral surface 12*b*, and the DC connector 138 is arranged on the lateral surface 12*c*. In addition, the AC wiring 187*a* drawn from the AC connector 187 is drawn to the lower side of the power conversion device 200 through between the pipes 13 and 14. Similarly, the DC wiring 138*a* of the DC connector 138 is also drawn to the lower side of the power conversion device 200.

In each of the layout patterns A to C of FIG. 33, the power conversion device 200 is arranged above the transmission TM. In addition, the cooling water of the radiator 1001 is supplied to the flow path 19 of the flow path former 12. For this reason, in view of the workability of the cooling pipes and the AC wiring 187*a*, it is preferred to arrange the power conversion device 200 so that the lateral surface 12*d* on which the pipes 13 and 14 and the AC connector 187 are provided is arranged towards the direction of the radiator 1001 or the transmission TM. In addition, since the battery 136, which is a DC power supply, is provided rearward from the engine bay 1000, it is preferred that the lateral surface 12*c*, on which the DC connector 138 is mounted, is arranged towards the rear in view of wiring of the DC wiring 138*a*.

There are the three possible layout patterns A to C shown in FIG. 33 to arrange the power conversion device 200 inside the engine bay 1000. In view of the connection relationship among the radiator 1001, the battery 136, and the transmission TM described above, it is preferred in the layout pattern A that the lateral surface 12*d* is arranged towards the direction of the transmission TM and in the layout patterns B and C that the lateral surface 12*d* is arranged towards the direction of the radiator 1001.

In the layout pattern A, the DC connector 138, the AC connector 187, and the connector 21 for signals face in a preferred direction in terms of the wiring layout. In addition, since the pipes 13 and 14 face in the direction of the transmission TM, the cooling pipes are required to be bent in the direction of the radiator 1001. However, since the AC wiring 187a is drawn downward from the AC connector 187, interference between the cooling pipes and the AC wiring 187a will be avoided and reduction in workability will be prevented.

In the layout pattern B, the pipes 13 and 14, the AC connector 187, and the connector 21 for signals face in a preferred direction. In addition, although the DC connector 138 faces towards the side of the vehicle, reduction in workability is avoided because the DC wiring 138a drawn downward from the DC connector 138 may simply be wired rearwards.

In the layout pattern C, giving priority to the layout of the cooling pipes, the lateral surface 12d is arranged towards the direction of the radiator 1001. In this case, although the AC wiring 187a is to be wired in the direction of the transmission TM, the AC wiring 187a and cooling pipe will not interfere because the AC wiring 187a is drawn downward through between the pipes 13 and 14. Therefore, no trouble will occur in the piping work and the wiring work.

Thus, in the power conversion device 200 of the present embodiment, the pipes 13 and 14, the DC connector 138, the AC connector 187, and the connector 21 for signals are arranged in the engine bay 1000 in a preferred manner. As a result, a variety of situations as in the layout patterns A to C are managed, thereby providing the power conversion device 200 with excellent in-vehicle mountability.

It is to be noted that in the embodiment described above, the power modules 300U to 300W have a structure in which the unit in which the power semiconductor elements are sandwiched by the conductor plates is housed in the module case 304, on both the front and back surfaces of which the heat dissipation surfaces on which the fins 305 are formed are provided. Thus, the power modules 300U to 300W are provided in the flow path 19 in the center of the flow path. However, the arrangement method of the power module is not limited to that described above and a variety of arrangements are possible.

Figure 34:
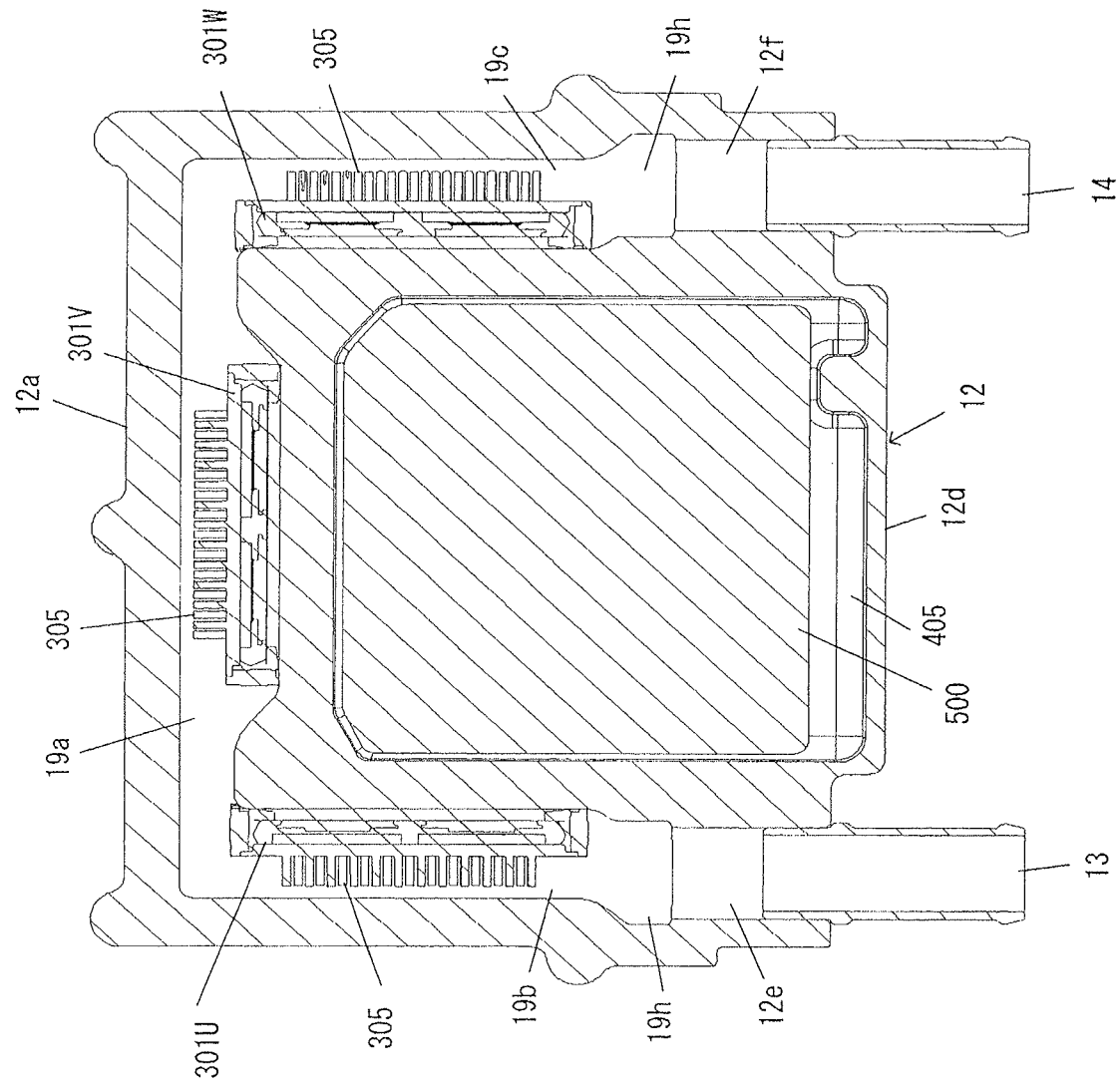
FIG. 34 is a view showing a variation of the arrangement of the power modules in the present invention.
Figure 35:
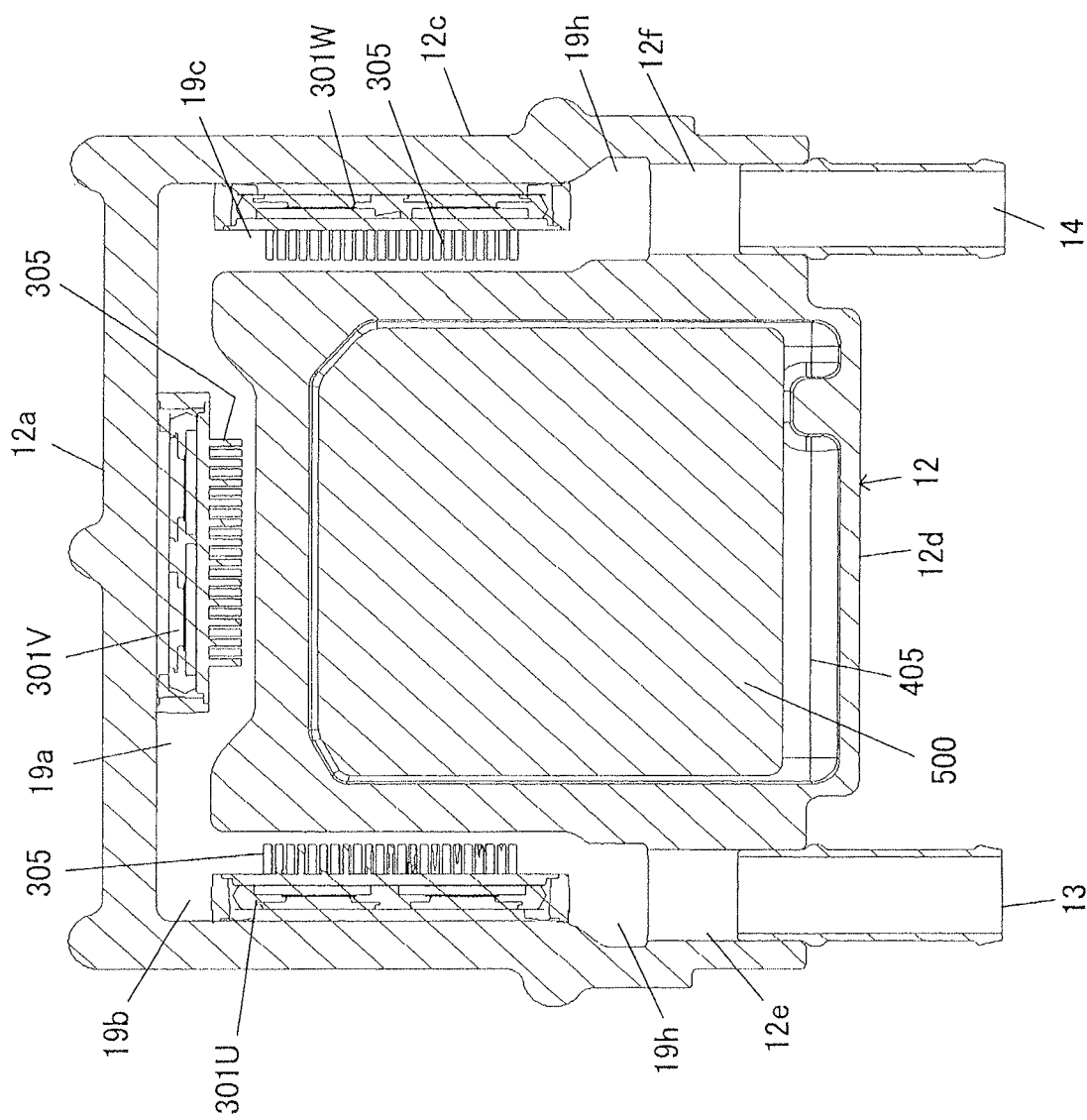
FIG. 35 is a view showing a variation of the arrangement of the power modules in the present invention.

The examples shown in FIG. 34 and FIG. 35 show an arrangement method of the power module in which only one surface of the module case constitutes a heat dissipation surface. The power modules 301U to 301W, which correspond to the power modules 300U to 300W described above, are provided with the fins 305 for heat dissipation only on one surface of the flat power module.

In the case of FIG. 34, the power modules 301U to 301W are arranged to be closely attached to the inner peripheral surfaces of the flow path sections 19a to 19c, i.e., the wall surfaces surrounding the capacitor module 500. Cooling water flows along the heat dissipation surfaces on which the fins 305 are formed. In the example shown in FIG. 35, on the contrary to the case of FIG. 34, the power modules 301U to 301W are arranged to be closely attached to the outer peripheral surfaces of the flow path sections 19a to 19c.

Figure 36:
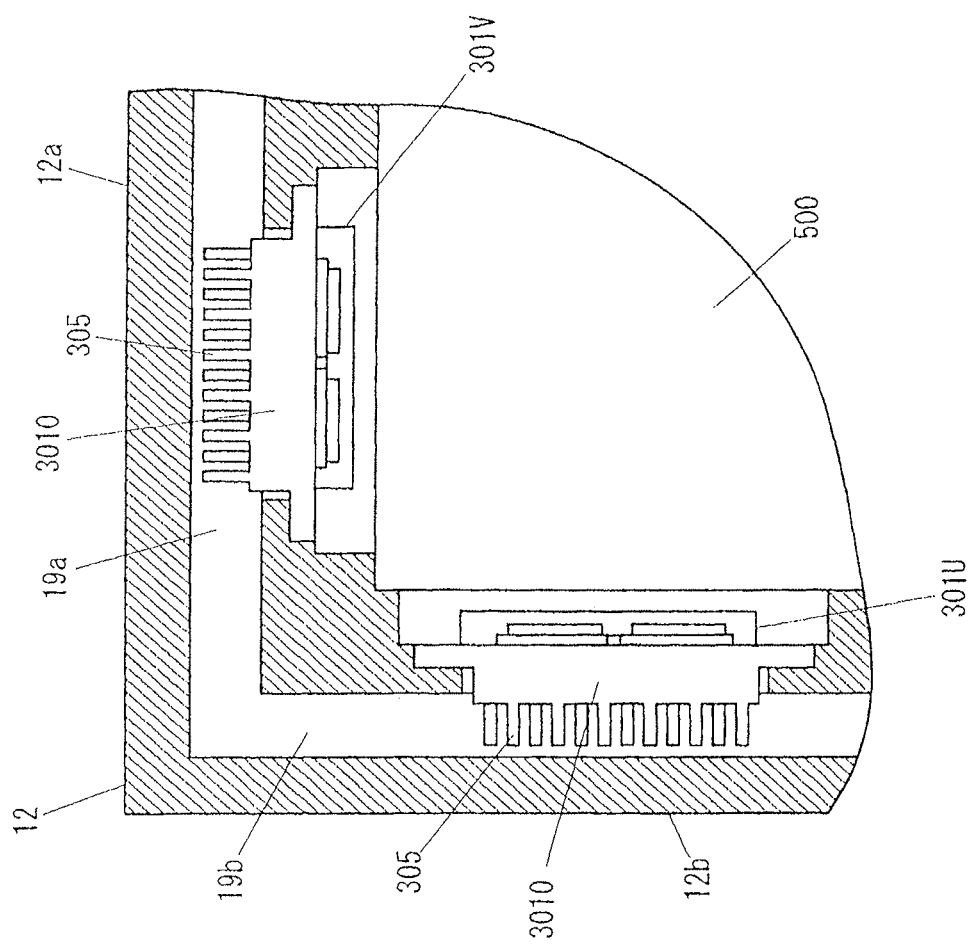
FIG. 36 is a view showing a variation of the arrangement of the power modules in the present invention.

It is to be noted that while in FIGS. 34 and 35, the whole power modules 301U to 301W are arranged in the flow path 19, they may be arranged so that only the heat dissipation surfaces are exposed in the flow path 19 as in FIG. 36. While in the example shown in FIG. 36, the power semiconductor elements are provided on a heat sink 3010, on the back side of which the fins 305 are formed, they will be arranged in the same manner in a configuration covered with the casing as shown in FIGS. 34 and 35.

The following operations and advantageous effects can be achieved according to the present embodiment explained above.

(1) The power module 300U includes the IGBTs 328 and 330 and the diodes 156 and 166, being power semiconductor elements constituting the upper and lower arms of the inverter circuit 140, the first sealing resin 348, having a polyhedron shape and seals the IGBTs 328 and 330 and the diodes 156 and 166, the positive electrode-side terminal (the DC positive wiring 315A and the element-side DC positive connection terminal 315D) and the negative electrode-side terminal (the DC negative wiring 319A and the element-side DC negative connection terminal 319D), being connected with any of these power semiconductor elements and each protrude from the first sealing resin 348, the second sealing resin 351, sealing at least a part of those terminals, and the module case 304, in which the IGBTs 328 and 330 and the diodes 156 and 166 having been sealed with the first sealing resin 348 are housed. The power module 300U is configured so that the positive electrode-side terminal and the negative electrode-side terminal are aligned at their portions protruding from the first sealing resin 348, along one surface of the first sealing resin 348, protrude in a layered state from the second sealing resin 351, and extend out of the module case 304. This will prevent over stress on the connection sections of the power semiconductor elements with the positive electrode-side terminal and the negative electrode-side terminal and a gap in the mold from occurring at the time of clamping performed when the power semiconductor elements are sealed with the first sealing resin 348.

(2) The power module 300U includes the series circuit 150 of the IGBTs 328 and 330 and the diodes 156 and 166 for the upper arm and the lower arm of the inverter circuit 140, the first sealing resin 348, sealing the series circuit 150, the element-side DC positive connection terminal 315D and the element-side DC negative connection terminal 319D, protruding from the first sealing resin 348 and supplying DC power to the series circuit 150, the DC positive wiring 315A (the DC positive terminal 315B and the ancillary module-side DC positive connection terminal 315C) and the DC negative wiring 319A (the DC negative terminal 319B and the ancillary module-side DC negative connection terminal 319C) with a layer structure connected to the element-side DC positive connection terminal 315D and the element-side DC negative connection terminal 319D, the second sealing resin 351, sealing those connection sections 370, and the module case 304 in which the series circuit 150 sealed with the first sealing resin 348 and the element-side DC positive connection terminal 315D and the element-side DC negative connection terminal 319D are housed. The power module 300U is provided with a configuration with the DC positive wiring 315A and the DC negative wiring 319A extending out of the module case 304, and magnetic fluxes are to be generated in directions canceling each other out by currents flowing through the DC positive wiring 315A and the DC negative wiring 319A of each layer. This will achieve reduction of inductance.

(3) The module case 304 is formed of an electrically conductive member, and the eddy current 361 is to be induced in the module case 304 by the recovery current 360 flowing through the series circuit 150 connected to the element-side DC positive connection terminal 315D and the element-side DC negative connection terminal 319D. This will reduce the wiring inductance 363 in the loop-shaped path when the recovery current 360 is flowing.

(4) The module case 304 is provided with the first heat dissipation surface 307A and the second heat dissipation surface 307B which include the fins 305 for heat dissipation outside thereof. Inside the module case 304, the IGBTs 328 and 330 and the diodes 156 and 166, constituting the series circuit 150 sealed with the first sealing resin 348, are arranged opposite to the first heat dissipation surface 307A and the second heat dissipation surface 307B. This allows heat to be dissipated effectively from the IGBTs 328 and 330 and the diodes 156 and 166.

(5) The power module 300U further includes the element-side signal connection terminals 327U and 327L, transmitting drive signals of the IGBTs 328 and 330 output from the driver circuit 174, and the signal wirings 324U and 324L, being connected with the element-side signal connection terminals 327U and 327L by metallic bonding. In the power module 300U, the second sealing resin 351 further seals the connection sections 370 between the element-side signal connection terminals 327U and 327L and the signal wirings 324U and 324L. Since in this manner, the connection sections 370 of each of the wirings and the terminals are to be collectively sealed, the manufacturing process is simplified, thereby improving the productivity.

(6) The element-side signal connection terminals 327U and 327L, the element-side DC positive connection terminal 315D, and the element-side DC negative connection terminal 319D each protrude in the same direction from the first sealing resin 348, each of their ends is bent in the same direction. Each of the ends, having been thus bent, is to be metallically bonded with the signal wirings 324U and 324L or the DC positive wiring 315A and the DC negative wiring 319A. This will facilitate the work of metal bonding and improve the productivity, thereby improving the reliability of the metal bond.

(7) The element-side signal connection terminals 327U and 327L and the element-side DC positive connection terminal 315D and the element-side DC negative connection terminal 319D are to be aligned at their portions protruding from the first sealing resin 348. This will facilitate the first sealing resin 348 in sealing.

(8) The power module 300U further includes the element-side AC connection terminal 320D, protruding from the first sealing resin 348, for outputting AC power having been converted from DC power by the series circuit 150 and the AC wiring 320A (the AC terminal 320B and the ancillary module-side AC connection terminal 320C) to be connected with the element-side AC connection terminal 320D by metallic bonding. In the power module 300U, the second sealing resin 351 further seals the connection section 370 between the element-side AC connection terminal 320D and the AC wiring 320A. This will further simplify the manufacturing process, thereby improving the productivity.

(9) The module case 304 includes one opening face on which the insertion slot 306 is formed. Then, the module case 304 is configured in which the connection section 370 is arranged inward of the module case 304 from the opening face and the DC positive wiring 315A and the DC negative wiring 319A extends out of the module case 304 from the opening face. This will protect the connection section 370 by the module case 304.

(10) The power module 300U further includes the wiring insulation section 608, which supports the DC positive wiring 315A and the DC negative wiring 319A, and the wiring insulation section 608 is to be fixed to the module case 304. This will protect the connection section 370 from stress occurring when incorporating the power module 300U into the inverter circuit 140 so as to connect the DC positive wiring 315A and the DC negative wiring 319A with another device.

(11) The second sealing resin 351 is to be filled in a space between the inside of the module case 304 and the first sealing resin 348. This will reliably fix the module primary seal body 302 in the module case 304.

(12) The power module 300U includes the IGBTs 328 and 330 constituting the upper and lower arms, respectively, of the inverter circuit 140 and including the control electrodes 328A and 330A, respectively, the element-side signal connection terminals 327U and 327L being connected with the control electrodes 328A and 330A, respectively, included in the IGBTs 328 and 330, the element-side DC positive connection terminal 315D and the element-side DC negative connection terminal 319D, being connected with the positive electrode side and the negative electrode side, respectively, of the series circuit 150 constituted with the IGBTs 328 and 330 and supplying DC power to the series circuit 150, and the element-side AC connection terminal 320D for outputting AC power having been converted from DC power by the series circuit 150. In the power module 300U, each of the element-side signal connection terminal 327U, the element-side signal connection terminal 327L, the element-side DC positive connection terminal 315D, the element-side DC negative connection terminal 319D, and the element-side AC connection terminal 320D is aligned. In addition, the control electrodes 328A and 330A, included in the IGBTs 328 and 330, are each arranged in a position shifted to either one side relative to the central lines 376 and 377, respectively, which are perpendicular to the alignment direction of each of the terminals. In addition, the element-side signal connection terminals 327U and 327L are each arranged on one side where the control electrodes 328A and 330A are arranged in the IGBTs 328 and 330, respectively, the element-side DC positive connection terminal 315D is arranged on the other side where the control electrode 328A is not arranged in the IGBT 328, the element-side AC connection terminal 320D is arranged on the other side where the control electrode 330A is not arranged in the IGBT 330, and the element-side DC negative connection terminal 319D is arranged between the element-side AC connection terminal 320D and the element-side signal connection terminal 327L. This will minimize the length of the bonding wire 371 which connects the control electrodes 328A and 330A with the element-side signal connection terminals 327U and 327L, respectively, thereby improving the reliability in connection. In addition, the terminals are collectively arranged so as to achieve reduction in size of the module primary seal body 302, and thus the power module 300U.

The above explanation is merely an example and the present invention is not to be limited to the above embodiments.

What is claimed is:
1. A semiconductor module comprising:
a first power semiconductor element having a first surface and a second surface;
a second power semiconductor element having a first surface and a second surface;
a first conductor plate disposed on the first surface of the first power semiconductor element;
a second conductor plate disposed on the second surface of the first power semiconductor element;
a third conductor plate disposed on the first surface of the second power semiconductor element;
a fourth conductor plate disposed on the second surface of the second power semiconductor element; and an intermediate electrode which is integrally formed with the second conductor plate, extends toward the third conductor plate, and is connected to the third conductor plate, wherein a first main surface of the first conductor plate and a second main surface of the third conductor plate are arranged on a same plane, the first main surface of the first conductor plate facing the first power semiconductor element and the second main surface of the third conductor plater facing the second power semiconductor element.

2. The power semiconductor device according to claim 1, wherein the intermediate electrode has a bending portion which is bent toward the third conductor plate from the second conductor plate.

3. The power semiconductor device according to claim 2, wherein a thickness of the intermediate electrode is formed smaller than a thickness of the second conductor plate in portion to which the first power semiconductor element is connected.

4. The power semiconductor device according to claim 1, wherein the first conductor plate, the second conductor plate, the third conductor plate, and the fourth conductor plate are fixed with a sealing resin, the second conductor plate is exposed from a surface of the sealing resin, and the intermediate electrode is not exposed from the sealing resin.

5. The power semiconductor device according to claim 1, wherein on the same plane the first conductor plate does not overlap the third conductor plate.

* * * * *